(12) United States Patent
Katoh et al.

(10) Patent No.: US 6,333,516 B1
(45) Date of Patent: Dec. 25, 2001

(54) QUANTUM EFFECT DEVICE

(75) Inventors: Riichi Katoh, Yokohama; Tetsufumi Tanamoto, Kawasaki; Francis Minoru Saba, Tokyo, all of (JP); Yujiro Naruse, Impington Cambridge (GB); Shigeki Takahashi, Kawasaki; Masao Mashita, Yokohama, both of (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 1234 days.

(21) Appl. No.: 08/764,275

(22) Filed: Dec. 12, 1996

Related U.S. Application Data

(63) Continuation of application No. 08/306,314, filed on Sep. 15, 1994, now abandoned.

(30) Foreign Application Priority Data

Sep. 16, 1993 (JP) .................................... 5-229909
Mar. 15, 1994 (JP) .................................... 6-070152

(51) Int. Cl.[7] ...................................... H01L 29/06
(52) U.S. Cl. ................... 257/22; 257/15; 257/17
(58) Field of Search .................. 257/14, 15, 17

(56) References Cited

PUBLICATIONS

B. Meurer, et al., "Single–Electron Charging of Quantum–Dot Atoms," Phys. Rev. Lett. vol. 68, No. 9, Mar. 1992, pp. 1371–1374.*

Craig S. Lent, P. Douglas Tougaw, Wolfgang Porod and Gary H. Bernstein, "Quantum cellular automata", Nanotechnology, vol. 4, pp. 49–57, 1993.

* cited by examiner

*Primary Examiner*—Olik Chaudhuri
*Assistant Examiner*—Nathan W. Ha
(74) *Attorney, Agent, or Firm*—Oblon, Spivak, McClelland, Maier & Neustadt, P.C.

(57) ABSTRACT

An inverter comprising four quantum dot cells. When the quantum dot cells are arranged in 9 o'clock direction, 12 o'clock direction and 3 o'clock direction, the quantum dot cell is arranged in 6 o'clock direction.

16 Claims, 26 Drawing Sheets

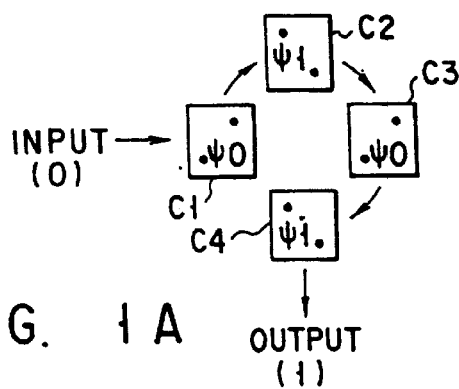 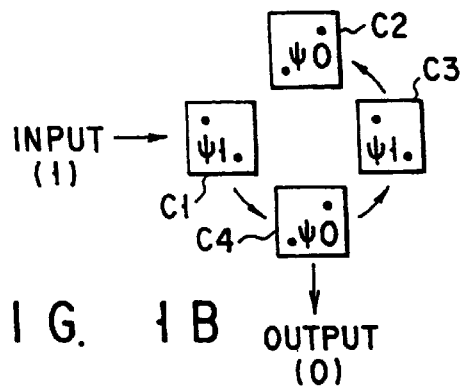
F I G. 1A    F I G. 1B
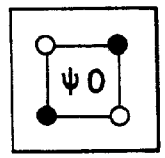 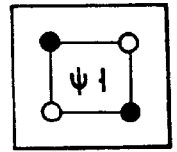
F I G. 2A    F I G. 2B
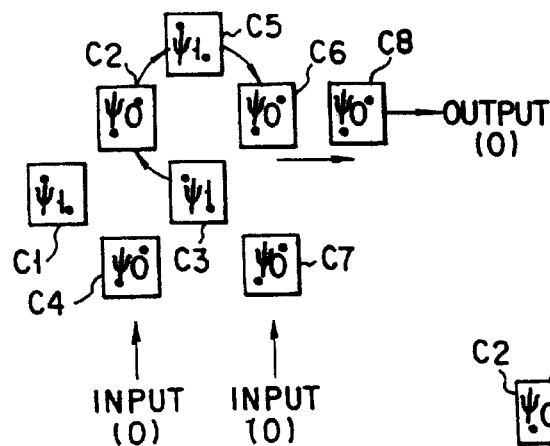
F I G. 3A
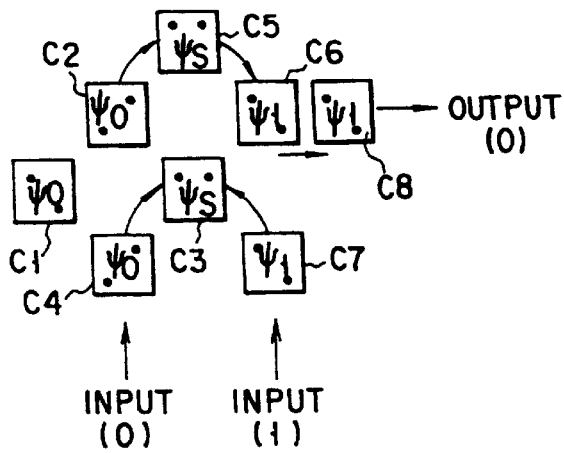
F I G. 3B

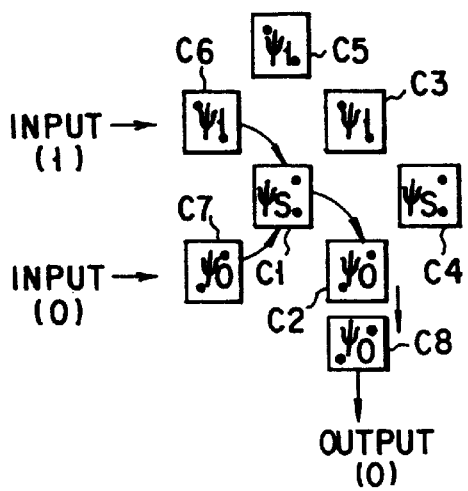 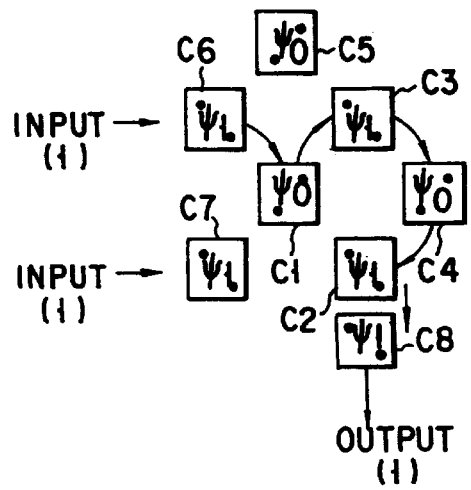
FIG. 4C    FIG. 4D
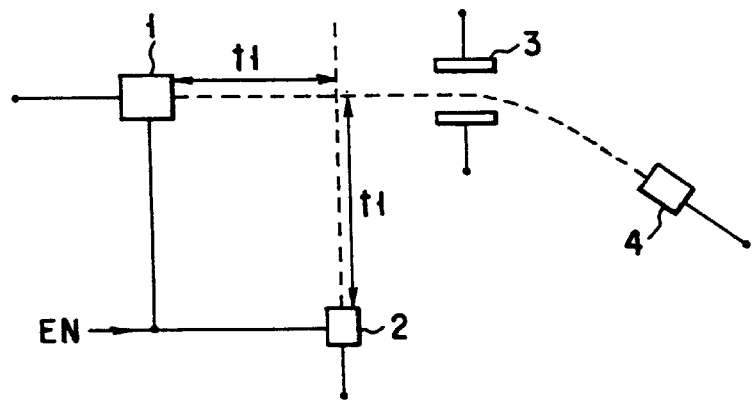
FIG. 5

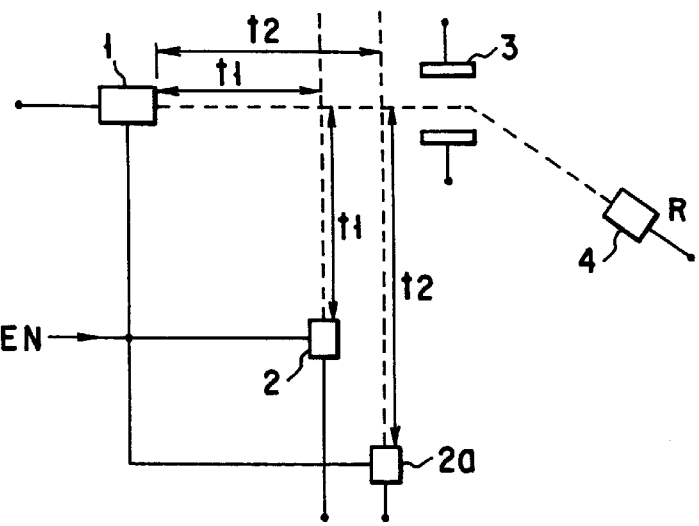
F I G. 6
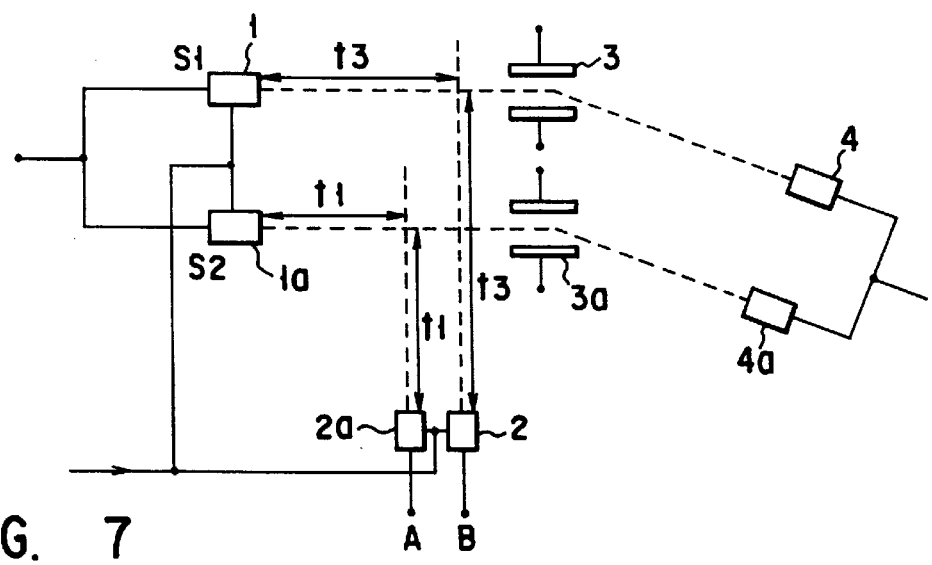
F I G. 7
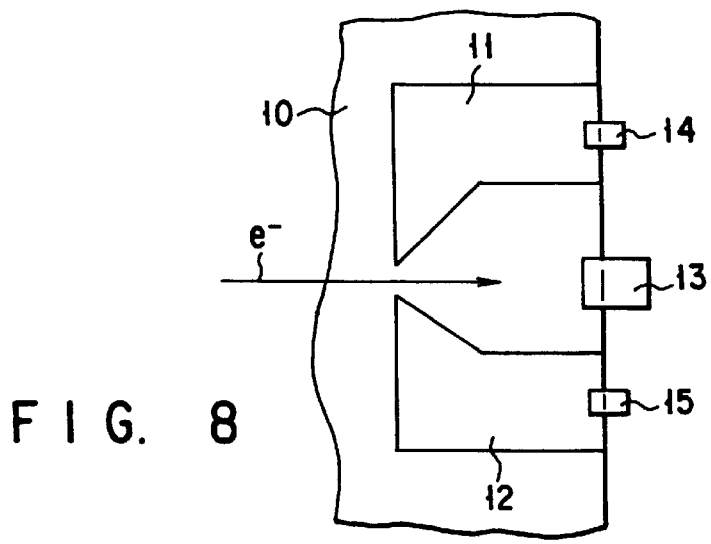
F I G. 8

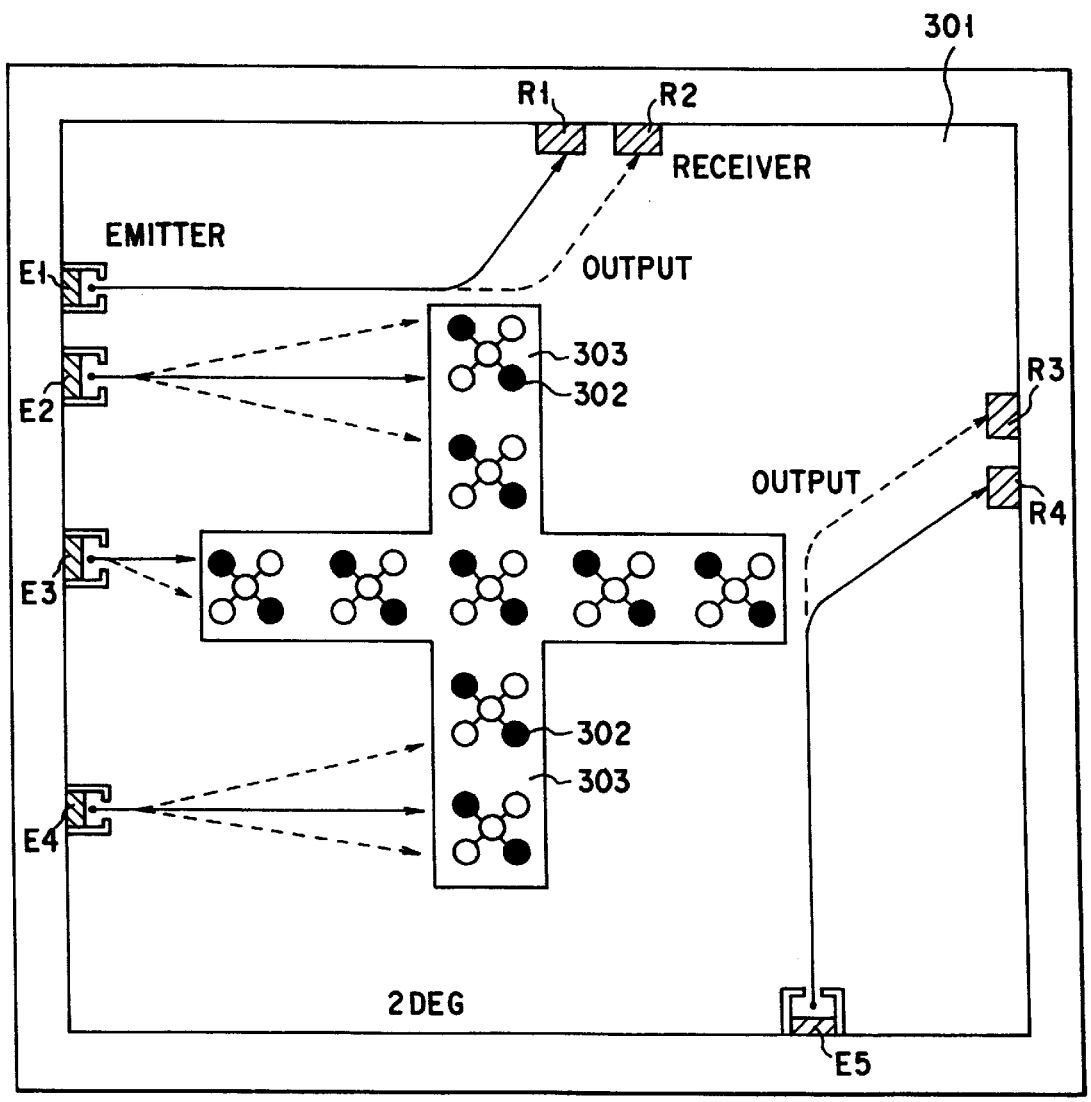
F I G. 33

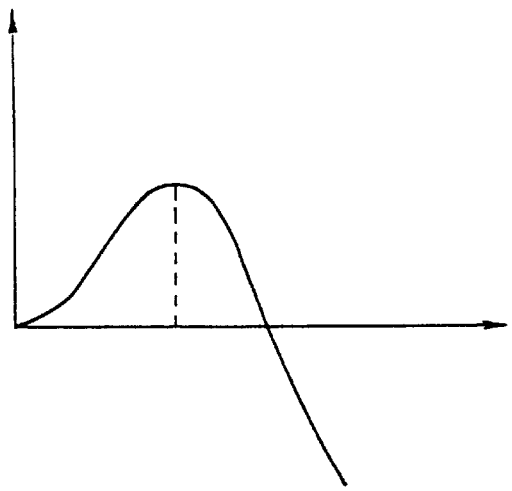
F I G. 36
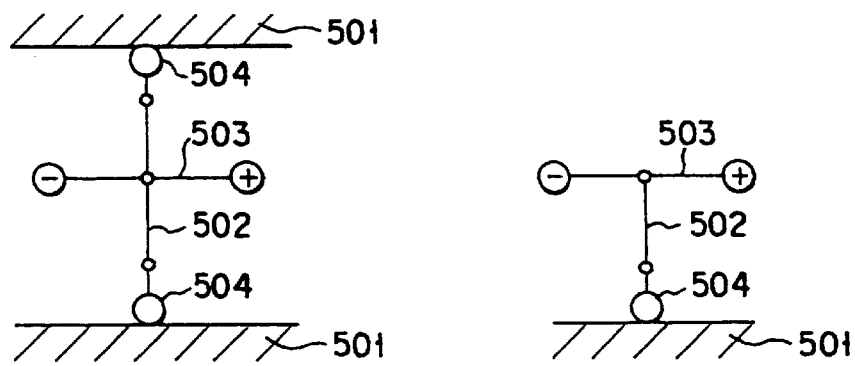
F I G. 37A        F I G. 37B
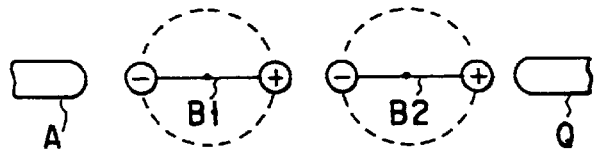
F I G. 38
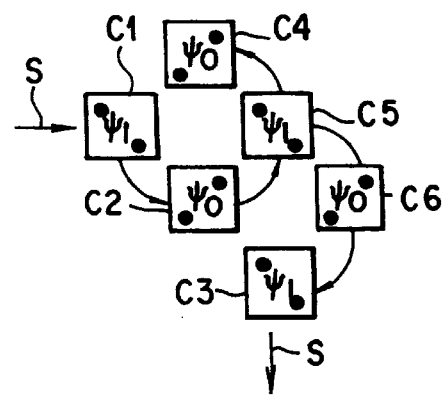
F I G. 39

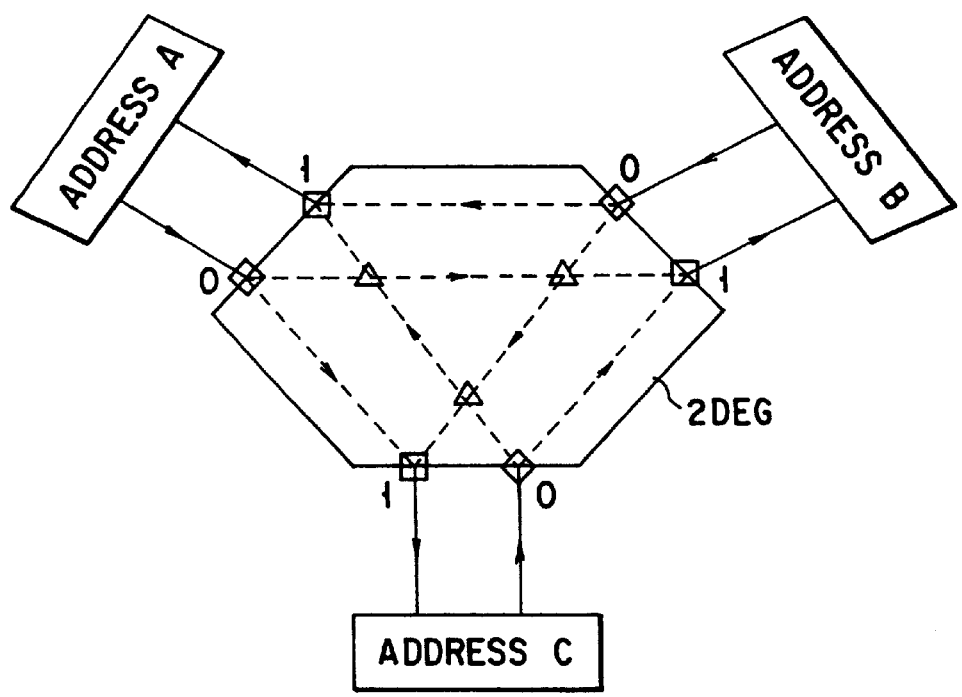
F I G. 44
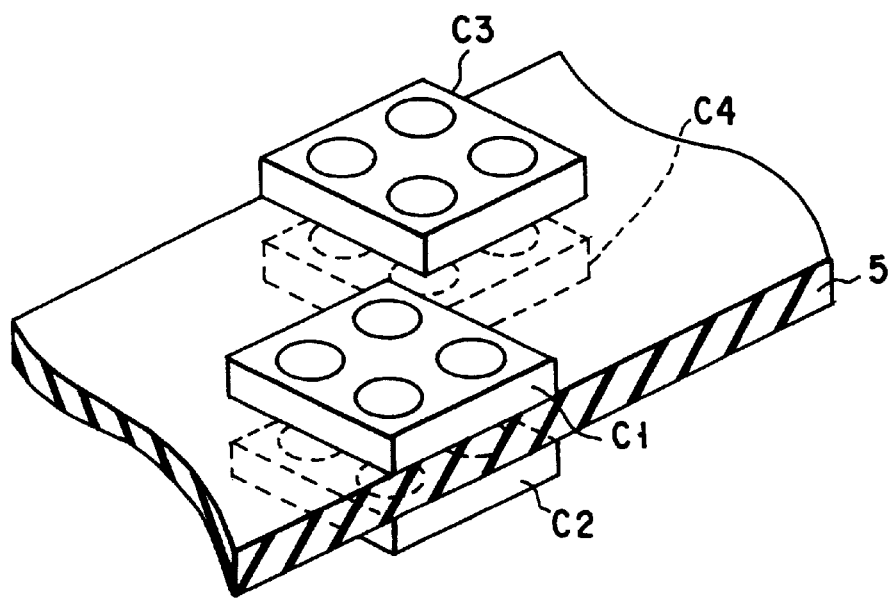
F I G. 45

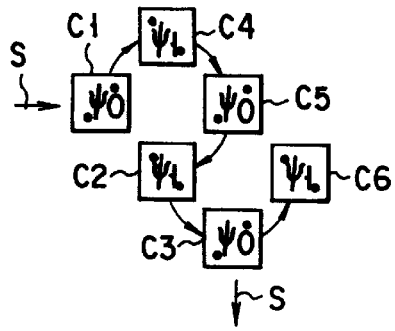
F I G. 46
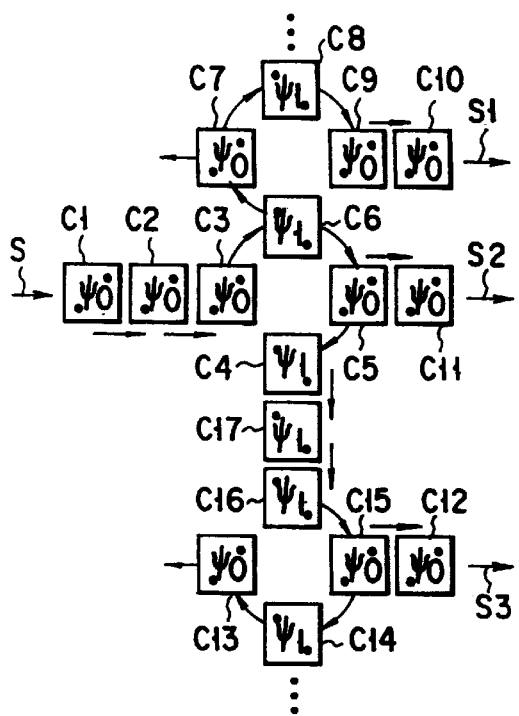
F I G. 47
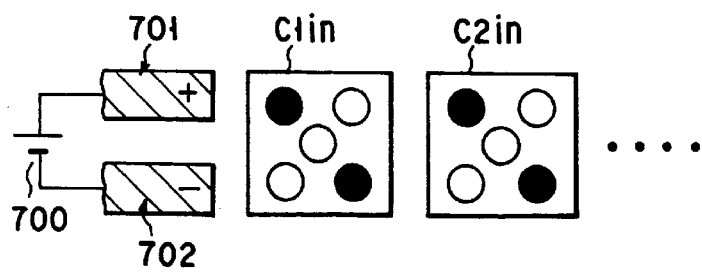
F I G. 50

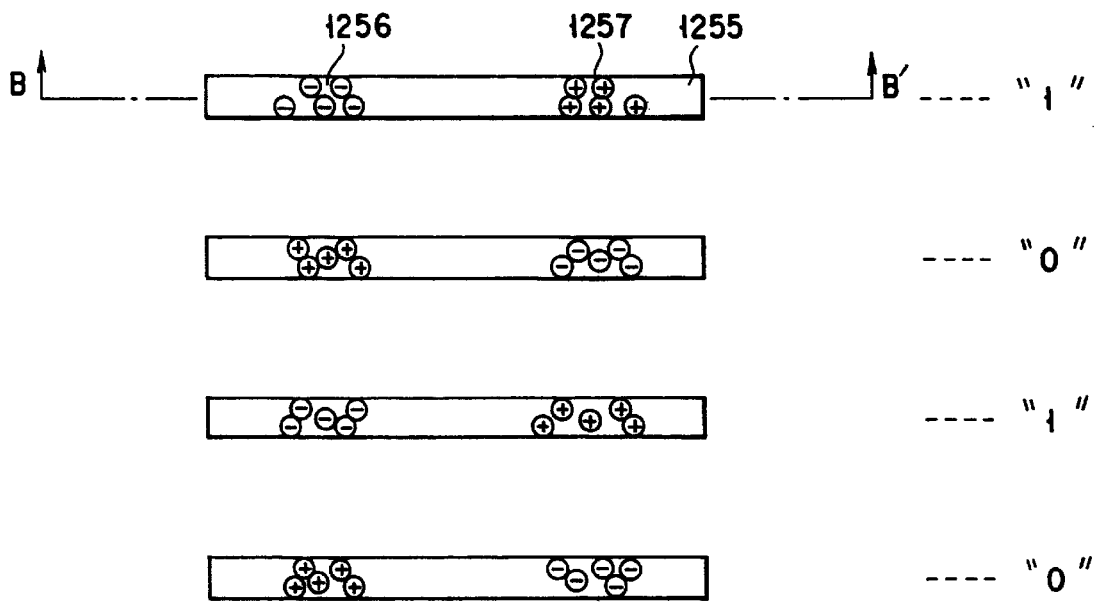
F I G. 55
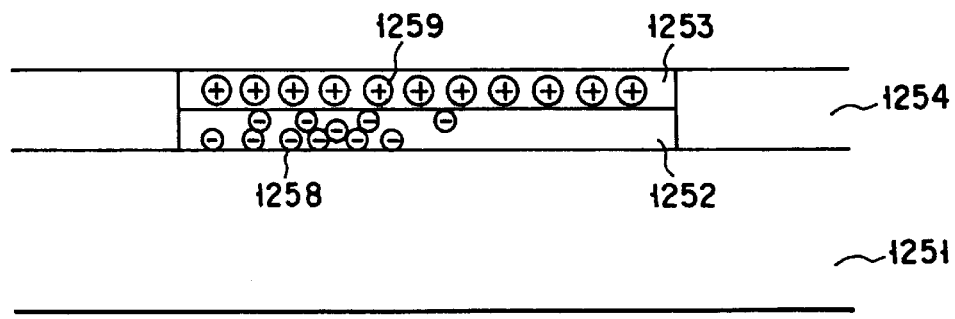
F I G. 56

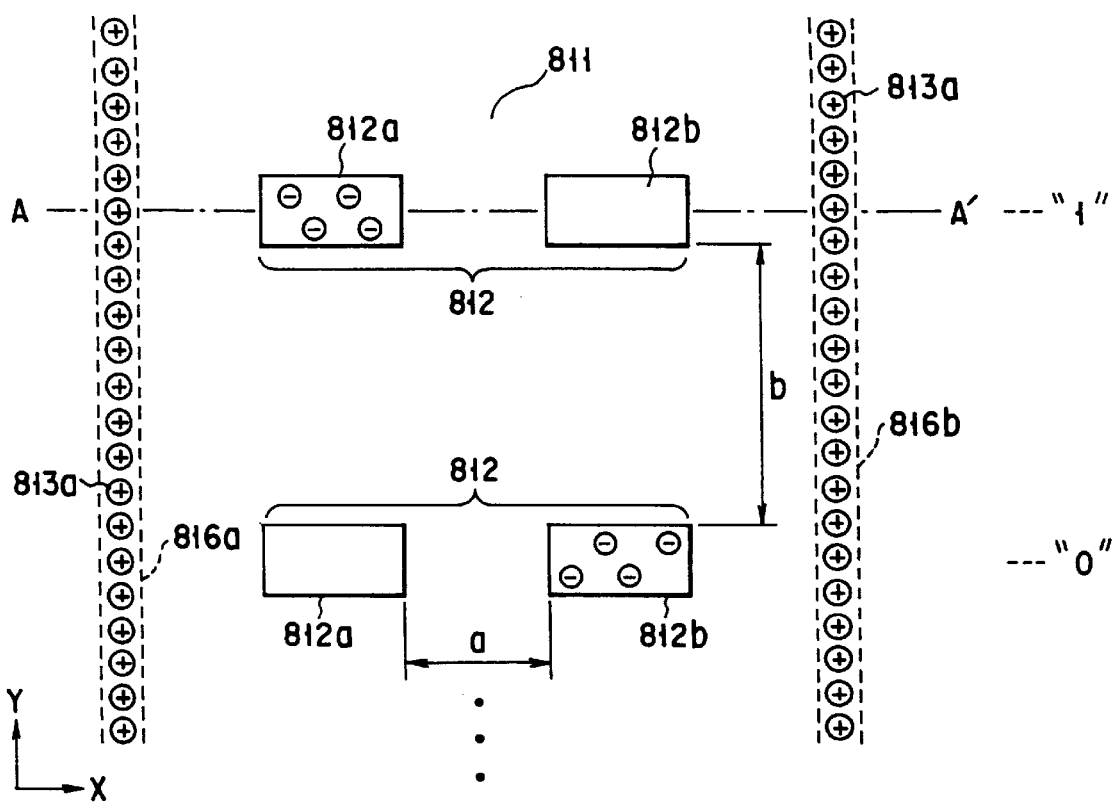
F I G. 57
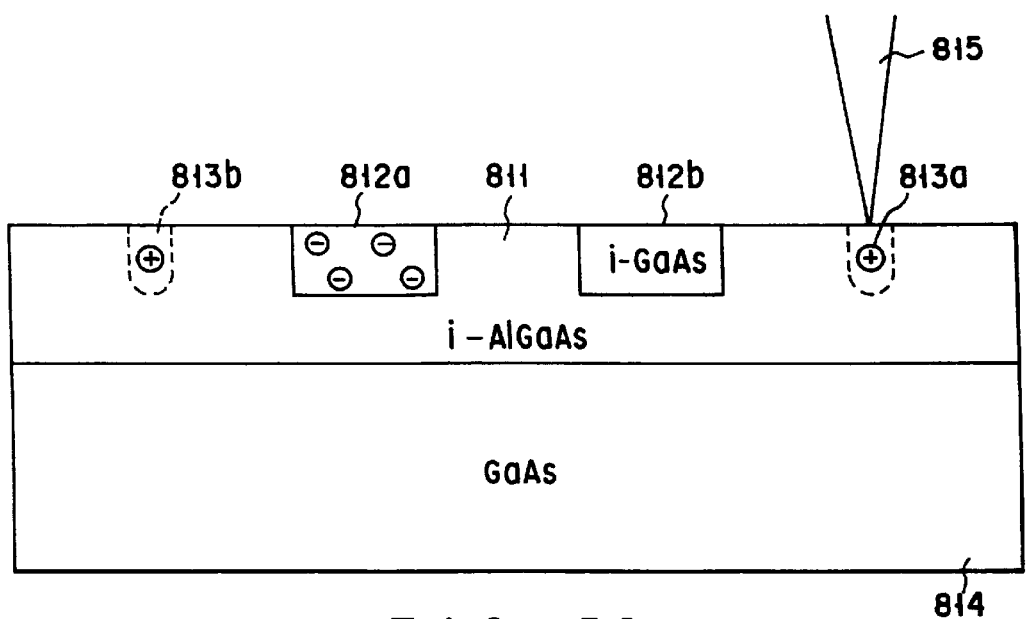
F I G. 58

QUANTUM EFFECT DEVICE

This application is a Continuation of application Ser. No. 08/306,314, filed on Sep. 15, 1994, now abandoned.

BACKGROUND OF THE INVENTION

1. Field of the Invention

The present invention relates to a quantum effect device which utilizes a quantum effect such as tunnel effect.

2. Description of the Related Art

In recent years, it has been proposed that a logic circuit be assembled without using three-terminal transistors such as bipolar transistors. (See Craig S. Lent et al., *Quantum Cellular Automata Nanotechnology*, Vol. 4, pp. 49–57.)

FIGS. 18A and 18B schematically show an inverter circuit incorporating no conventional transistors, which is called a "cell-connected inverter circuit." As FIGS. 18A and 18B show, the cell-connected inverter circuit comprises six 5-quantum dot cells C1 to C6. A 5-quantum dot cell has five quantum dots D1 to D5, two of which contain one electron each, as illustrated in FIGS. 19A and 19B. It can assume two recognizable, stable ground states $\Psi_1$ and $\Psi_2$ since the two electrons undergo Coulomb interaction and repel each other, trying to acquire a lower energy level.

How the cell-connected inverter circuit operates will be described, with reference to FIGS. 18A and 18B. An input "1" is supplied to the 5-quantum dot cell C1, setting the cell C1 into ground state $\Psi_1$. Then, the 5-quantum dot cell C2 takes ground state $\Psi_1$ which is electrically stable with respect to the cell C1. Further, the 5-quantum dot cell C3 assumes ground state $\Psi_1$ which is electrically stable with respect to the cell C2. Next, the 5-quantum dot cell C4 assumes ground state $\Psi_2$ which is electrically stable with respect to the cell C3, and the 5-quantum dot cell C5 assumes ground state $\Psi_2$ which is electrically stable with respect to the cell C4. Finally, the 5-quantum dot cell C6 takes ground state $\Psi_2$ which is electrically stable with respect to the cell C5. As a result, the cells C1 and C6, which are the input and output cells, respectively, assume different ground states. The cell-connected inverter circuit therefore outputs "0" when it receives "1."

The cell-connected inverter circuit is, however, disadvantageous in one respect. When the input binary value is changed from "1" to "0," the 5-quantum dot cells C1 to C3 assume ground state $\Psi_2$, but the 5-quantum dot cells C4 to C6 remain in ground state $\Psi_2$, as is illustrated in FIG. 18B. In this case, the output binary value is identical to the input binary value. In other words, the circuit fails to function as an inverter.

A plurality of 5-quantum dot cells can transfer a signal if they are arranged in a row or a column. When a bias is applied on the first 5-quantum dot cell, thereby setting this cell into, for example, ground state $\Psi_1$ the second 5-quantum dot cell assumes the same ground state ($\Psi_1$) due to its Coulomb interaction with the first cell. Similarly, the third to sixth 5-quantum dot cells assume ground state $\Psi_1$. Therefore, the ground state $\Psi_1$, is transferred as a signal from the first cell to the last via the remaining cells. When the first 5-quantum dot cell is set into ground state $\Psi_2$, this ground state is transferred as a signal from the first cell to the last via the remaining cells.

If 5-quantum dot cells are arranged in a row or a column, they can transfer a signal (either ground state) along a straight path only. In an integrated circuit, 5-quantum dot cells must be arranged, forming bent paths and branched paths. Otherwise they could not change the direction of transferring signals or branch a signal transfer path in order to supply the signals to an arithmetic logic unit or a memory located at a given position in the integrated circuit.

To change the direction of transferring signals, 5-quantum dot cells may be arranged as shown in FIG. 48. To branch a signal transfer path, they may be arranged as shown in FIG. 49. Both arrangements are those proposed by Lent et al.

The cell arrangement shown in FIG. 48 is a so-called "bent-back wire" consisting of five 5-quantum dot cells C1 to C5. A signal S is first transferred through the cells C1 to C3 in the direction of 3 o'clock and then through the cells C3 to C5 in the direction of 6 o'clock. The bent-back wire has a problem, however. The 5-quantum dot cells C2 and C4 are unstable. They do not always assume a ground state since one of the electrons in the cell C2 and one of the electrons in the cell C4 are so close to have Coulomb interaction and repel each other, inevitably rendering the states of the cells C2 and C4 electrically unstable. It is difficult for the bent-back wire to change the direction of transferring the signal S, while maintaining the information which the signal S conveys.

The cell arrangement shown in FIG. 49 is a so-called "multi fan-out branched wire" consisting of ten 5-quantum dot cells C1 to C10. In the multi fan-out branched wire, the input signal S is branched twice—first at the cell C3, and then at the cell C5. As a result, the signal S is split into two signals $S_1$ and $S_2$ which are transferred in the direction of 3 o'clock along two parallel paths. The multi fan-out branched wire has a problem, too. Since the cells C4, C6, C7 and C9 are not electrically stable, it is difficult for the multi fan-out branched wire to split the input signal S into two signals $S_1$ and $S_2$, while maintaining the information which the signal S conveys.

C. S. Lent et al. have proposed that a plurality of 5-quantum dot cells be combined to constitute a quantum effect device named "cellular automaton."(See Appl. Phys. Lett. 62 (1993), p. 714. ) As diagrammatically shown in FIG. 42, a 5-quantum dot cell is rectangular and comprised of five spherical quantum boxes. Each quantum box is small enough to confine electrons in 0-dimensional fashion. Of these five quantum boxes, four are located in the corners of the cell, and the remaining one is located at the center of the cell. Two of the five quantum boxes, i.e., boxes 1017, contain one electron each.

The five quantum boxes are arranged so close to one another that electrons can move back and forth between any two adjacent quantum boxes by virtue of tunnel effect. In contrast, the 5-quantum dot cells constituting a quantum effect device are spaced apart by so long a distance that electrons cannot move among the cells despite tunnel effect.

The two electrons in one 5-quantum dot cell repel each other due to Coulomb interaction, and assume the lowest energy level when they are at the ends of a diagonal. Therefore, the 5-quantum dot cell can take two electrically stable states ("0" and "1"). Namely, the cell is bistable.

Since 5-quantum dot cells are bistable (0,1), they can form a memory when arranged close to one another, each for storing one bit of information. For example, four 5-quantum dot cells may be arranged in a row as shown in FIG. 43. If this is the case, when state "0" is input to the left cell, it will be transferred to the right cell via the intermediate two cells—by virtue of the Coulomb repulsion acting between the two electrons contained in each 5-quantum dot cell.

Obviously, 5-quantum dot cells can form a wire for transferring electric signals only if they are arranged close to one another. Moreover, 5-quantum dot cells can constitute a logic circuit if they are arranged in an appropriate pattern.

However, 5-quantum dot cells of the type described above have the following problem.

As indicated above, the conventional 5-quantum dot cell is rectangular, and the five quantum boxes in the cell are spherical. It follows that any two adjacent quantum boxes arranged in a diagonal are less spaced apart than are the two adjacent quantum boxes arranged in a line parallel to any side of the cell. The tunneling probability is therefore high, and electrons can move between any adjacent quantum boxes due to tunnel effect.

Certainly, the cell indeed remains in a specific state while a bias is being applied to it. When the application of the bias to it is stopped, however, its state becomes less stable with time. Therefore, the conventional 5-quantum dot cell cannot be used in, for example, a nonvolatile memory.

A plurality of the conventional 5-quantum dot cells may be arranged to form an optical memory. Then, light (optical bias) is applied to each cell to write data into it. The cell stays in a specific state while being irradiated with light, but its state becomes unstable after the application of light has been terminated. To enable the optical memory to perform its function well, the cells must be connected by wires. There is then no longer an advantage in using 5-quantum dot cells, which might not otherwise be necessarily connected by wires.

The conventional 5-quantum dot cells may be arranged, forming a logic circuit. In this case, a problem arises. As described above, electrons move sideways as well due to tunnel effect. Consequently, each cell has its threshold energy decreased too much, and operates erroneously.

The conventional quantum effect device is disadvantageous in the following respect.

A quantum effect device of QIC (Quantum Interconnections with Cellular Automata) type can be operated only if its constituent quantum cells remain in ground state. The operating temperature of the device depends on the energy difference between the ground state and the primary excited state. The energy difference is determined by the Coulomb interaction among the quantum cells (e.g., 5-quantum dot cells). More specifically, the more each quantum cell is influenced by the adjacent quantum cells, the greater the energy difference. Hence, the shorter the distance among the quantum cells, the higher the operating temperature of the quantum effect device. As the distance among the quantum cells is reduced, however, the Coulomb interaction among them becomes prominent, impairing the bistable state of the quantum cells. Inevitably, the quantum effect device fails to perform its function.

SUMMARY OF THE INVENTION

As described above, the 5-quantum dot cells incorporated in the conventional cell-connected inverter circuit include some states of which do not change in a predetermined manner. Consequently, the inverter circuit cannot operate stably. It fails to invert an input in some cases. Accordingly, the first object of the present invention is to provide a quantum effect device which comprises quantum cells and which can operate stably.

To attain the first object, a quantum effect device according to this invention comprises a plurality of cells, including a cell for receiving an input and a cell for supplying an output. Each quantum cell takes one of two recognizable states in accordance with the physical interaction between it and adjacent quantum cells. The quantum cells are arranged in such a two-dimensional pattern that the input cell and the output cell have a predetermined relation and that each quantum cell has physical interaction with two adjacent quantum cells.

To attain the first object, another quantum effect device according to the invention comprises a plurality of cells, including a cell for receiving an input and a cell for supplying an output. Each quantum cell takes one of two recognizable states in accordance with the physical interaction between it and adjacent quantum cells. The quantum cells are arranged in such a two-dimensional pattern that the input cell and the output cell have a predetermined relation and that the output cell and some other cells constitute a loop structure.

In their research, the inventors hereof found that in a quantum effect device comprising a plurality of quantum cells, the output of each cell is stabilized if the cell has physical interaction with two adjacent cells. The inventors also found that a quantum effect device of a similar type operates stably to obtain a desirable input-output relationship if the output cell and some other cells form a loop structure. This mechanism has yet to be analyzed. Nonetheless, the desirable input-output relationship can be attributed to a quasi-stable state which is created due to the loop structure. That is, thanks to the quasi-stable state, none of the quantum cells assume an indefinite state, whereby the quantum effect device operates stably.

The present invention, which is based on these findings of the inventors', provides a quantum effect device which can operate stably.

As indicated above, the bent-back wire comprised of the conventional 5-quantum dot cells cannot change the direction of transferring a signal, while maintaining the information the signal conveys. It is therefore the second object of the invention to provide a quantum effect device which can change the direction of transferring a signal, while reliably maintaining the information the signal conveys.

To achieve the second object, a quantum effect device according to the present invention comprises a plurality of cells, including a cell for receiving an input and a cell for supplying an output. Each quantum cell takes one of two recognizable states in accordance with the physical interaction between it and adjacent quantum cells. Of the quantum cells arranged between the input cell and the output cell, some constitute a first loop structure, whereas the others constitute a second loop structure.

In their research, the inventors found that in a quantum effect device comprising a plurality of quantum cells, including a cell for receiving an input and a cell for supplying an output, none of the cells assume an indefinite state if the cells arranged between the input cell and the output cells constitute two loop structures. The quantum effect device can thereby change the direction of transferring a signal, while reliably maintaining the information the signal conveys.

The present invention, which is based on this finding of the inventors', provides a quantum effect device which can change the direction of transferring a signal, while reliably maintaining the information the signal conveys.

As pointed out above, the conventional multi fan-out branched wire comprised of the conventional 5-quantum dot cells cannot split an input signal into two signals, while maintaining the information the signal conveys. Therefore, it is the third object of this invention to provide a quantum effect device which can split an input signal into two signals, while maintaining the information the signal conveys.

To accomplish the third object, a quantum effect device according to the invention comprises a plurality of cells, including one cell for receiving an input and two cells for supplying outputs. Each quantum cell takes one of two recognizable states in accordance with the physical interaction between it and adjacent quantum cells. The cells arranged between the input cell and the first output cell constitute a first loop structure, whereas the cells arranged between the input cell and the second output cell constitute a second loop structure.

In their research, the inventors found that in a quantum effect device comprising a plurality of quantum cells, including a cell for receiving an input and two cells for supplying an output, none of the cells assumes an indefinite state if the cells arranged between the input cell and the first output cell constitute a first loop structure and the cells arranged between the input cell and the second output cell constitute a second loop structure. The quantum effect device can thereby split an input signal into two signals, while maintaining the information the signal conveys.

The invention, which is based on this finding of the inventors', provides a quantum effect device which can split an input signal into two signals, while maintaining the information the signal conveys.

As described above, in a memory or a logic circuit using the conventional 5-quantum dot cells, the state of each cell becomes less stable with time unless a bias is applied to the cell. It is therefore the fourth object of the present invention is to provide a quantum effect device which comprises quantum artificial molecules each of which can stay in a specific state even if no bias is applied to it.

In order to attain the fourth object, a quantum effect device according to the invention comprises a plurality of quantum artificial molecules which are rectangular and which are arranged in a two-dimensional pattern. Each quantum artificial molecule is comprised of five quantum boxes, each containing two carriers. Four of the five quantum boxes are located at the four corners of the quantum artificial molecule, and are shaped and spaced apart so as to prevent carriers from moving among the quantum boxes due to tunnel effect. The remaining quantum box (or the fifth quantum box) is positioned in the quantum artificial molecule or on any side thereof, and is shaped and spaced from the other four quantum boxes so as to allow carriers to move between it and any other quantum box.

In the present invention, the carriers pass through the fifth quantum box of each rectangular quantum artificial molecule, rendering the molecule bistable. This is because the first to fourth quantum boxes are located at the four corners of the quantum artificial molecule and are shaped and spaced apart so as to prevent carriers from moving among the quantum boxes due to tunnel effect, and the fifth quantum box is located in the quantum artificial molecule or on any side thereof and is shaped and spaced from the other four quantum boxes so as to allow carriers to move between it and any other quantum box. Once each quantum artificial molecule has assumed either the "0" state or the "1" state, it will remain in that state unless a bias is externally applied to the molecule, although the carriers move among the first to the fourth quantum boxes. Furthermore, after each molecule has assumed the "0" state or the "1" state, the carriers moving from the fifth quantum box toward any other quantum box is repelled back into the fifth quantum box by the Coulomb repulsion which the other carriers exert. Hence, the quantum artificial molecule will stay in that state unless a bias is externally applied to the molecule.

As indicated above, in a quantum effect device in which the quantum cells are arranged close to one another and which can therefore operate at high temperatures, the Coulomb interaction among the quantum cells is so prominent that the bistable state of each quantum cell is impaired. Inevitably, the quantum effect device fails to perform its function. It is accordingly the fifth object of the invention to provide a quantum effect device which comprises quantum cells and which can reliably operate at high temperatures.

To attain the fifth object, a quantum effect device according to this invention comprises a plurality of quantum artificial molecules. Each quantum artificial molecule takes one of two or more recognizable states in accordance with the physical interaction between it and any adjacent quantum artificial molecule. The quantum artificial molecules are arranged in such a three-dimensional pattern that the quantum effect device has a predetermined input-output relationship.

In their research, the inventors found that in a quantum effect device comprising a plurality of quantum artificial molecules arranged in a three-dimensional pattern, the energy difference between the ground state of each molecule and the primary excited state thereof is great, and that the quantum effect device can operate at high temperatures. They also found that any recognizable state each molecule assumes is stable since the molecule is spaced apart from the adjacent molecules by a short distance.

Therefore, the present invention, which is based on these findings of the inventors', provides a quantum effect device which can operate reliably at high temperatures.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIGS. 1A and 1B are diagrams explaining a cell-connected inverter according to a first embodiment of the present invention;

FIGS. 2A and 2B are diagrams showing a 4-quantum dot cell;

FIGS. 3A to 3D are diagrams representing the structure of a cell-connected OR device which is a second embodiment of the invention;

FIGS. 4A to 4D are diagrams representing the structure of a cell-connected AND device which is a third embodiment of the invention;

FIG. 5 is a diagram showing a scatter/collision type inverter utilizing ballistic electrons, which is a fourth embodiment of the present invention;

FIG. 6 is a diagram showing a scatter/collision type NOR device utilizing ballistic electrons, which is a fifth embodiment of the invention;

FIG. 7 is a diagram showing a scatter/collision type NAND device utilizing ballistic electrons, which is a fourth embodiment of the present invention;

FIG. 8 is a diagram showing a receiver;

FIG. 33 is a schematic representation of a quantum effect device (quantum interconnections) which is a seventeenth embodiment of the invention;

FIG. 36 is a graph for defining a critical nucleus;

FIGS. 37A and 37B show two types of rotary units;

FIG. 38 is a diagrammatic representation of a rotary logic device (an information transfer path) which is a nineteenth embodiment of the invention;

FIG. 39 is a schematic representation of a cell-connected, signal guiding device which is a twenty-third embodiment of the invention;

FIG. 44 is a schematic representation of a quantum effect device (i.e., a quantum effect information control system);

FIG. 45 is a perspective view showing the quantum effect device which is the sixteenth embodiment of the invention;

FIG. 46 is a schematic representation of a cell-connected, signal guiding device which is a twenty-third embodiment of the invention;

FIG. 47 is a schematic representation of a cell-connected, signal branching device which is a twenty-fourth embodiment of this invention;

FIG. 50 shows the input section of a quantum effect device which is a twenty-fifth embodiment of the present invention;

FIG. 55 is a plan view showing the quantum effect signal transfer device in greater detail;

FIG. 56 is a sectional view of the signal transfer device, taken along line B—B' in FIG. 55;

FIG. 57 is a schematic representation of a quantum effect signal transfer device which is a twenty-seventh embodiment of the invention;

FIG. 58 is a sectional view of the signal transfer device, taken along line A—A' in FIG. 57;

DETAILED DESCRIPTION OF THE PREFERRED EMBODIMENTS

With reference to the accompanying drawings, embodiments of the present invention will now be described.

First Embodiment (claims 1–4)

FIGS. 1A and 1B schematically show a cell-connected inverter which is the first embodiment of the invention.

Figure 18A:
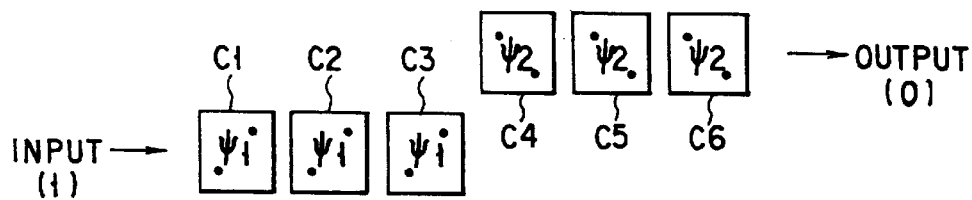
FIGS. 18A and 18B are diagrams schematically illustrating an inverter circuit which has no conventional transistors
Figure 18B:
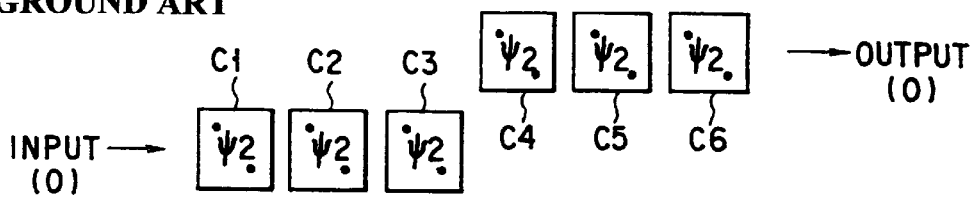
Figure 19A:
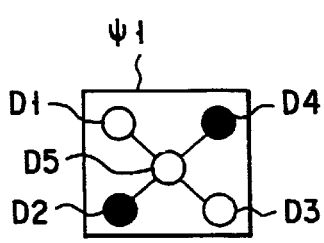
FIGS. 19A and 19B are diagrammatic representation of a 5-quantum dot cell.
Figure 19B:
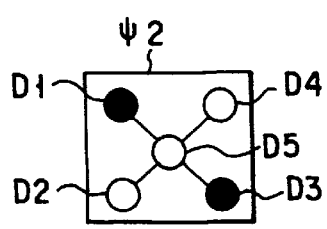

As shown in FIGS. 1A and 1B, the cell-connected inverter comprises four 5-quantum dot cells C1 to C4 of the type shown in FIG. 18. The cells C1 to C4 are arranged, forming a loop. The cell C1 is used as an input cell, and the cell C4 as an output cell. The 5-quantum dot cells C1 to C5 contain two electrons (black dots) each. Each cell is a bistable element, taking one of two ground states $\Psi_0$ and $\Psi_1$ in accordance with the positions of the two electrons. More precisely, it assumes the ground state $\Psi_0$ when the electrons located on a right inclined diagonal, and assumes the ground state $\Psi_1$ when the electrons are located on a left inclined diagonal.

When an input "0" is supplied to the 5-quantum dot cell C1 as shown in FIG. 1A, the cell C1 assumes the ground state $\Psi_0$. Then, the two electrons in the 5-quantum dot cell C2 move toward the right inclined diagonal, but are pulled back onto the left inclined diagonal due to Coulomb repulsion. The cell C2 therefore remains in the ground state $\Psi_0$. The 5-quantum dot cell C4 can assume either ground state, $\Psi_0$ or $\Psi_1$, with respect to the ground state $\Psi_0$ of the 5-quantum dot cell C1. Nevertheless, the cell C3 takes the ground state $\Psi_0$ since the two electrons in the cell C3 are arranged on the right inclined diagonal due to Coulomb repulsion. The moment the cell C3 takes the ground state To, the two electrons in the 5-quantum dot cell C4 are arranged on the left inclined diagonal. The cell C4 cannot help but assume the ground state $\Psi_1$.

Namely, when an input "0" is supplied to the 5-quantum dot cell C1, the cells C1 to C4 assume states $\Psi_0$, $\Psi_1$, $\Psi_0$ and $\Psi_1$, respectively. The state of the cell C4 (the output cell), which differs from that of the cell C1 (the input cell), is detected as an output "1." Thus, the input "0" has been inverted to "1."

On the other hand, when an input "1" is supplied to the 5-quantum dot cell C1 while the cells C1 to C4 remain in the specific states shown in FIG. 1A, the cell C1 assumes the ground state $\Psi_1$. Then, the two electrons in the 5-quantum dot cell C4 move toward the left inclined diagonal, but are pulled back onto the right inclined diagonal because of Coulomb repulsion, whereby the cell C4 stays in the ground state $\Psi_0$. Since the cell C4 remains in the ground state $\Psi_0$, the two electrons in the 5-quantum dot cell C3 are pulled back onto the left inclined diagonal due to Coulomb repulsion, though they intend to move toward the right inclined diagonal. The cell C3 therefore assumes the ground state $\Psi_1$. Once the cell C3 has assumed the ground state $\Psi_1$, the two electrons in the cell C2 are pulled back onto the right inclined diagonal due to Coulomb repulsion, though they intend to move toward the left inclined diagonal. The cell C2 takes the ground state $\Psi_0$.

Immediately after the input "1" has been applied to the 5-quantum cell $Cl_{in}$ the condition shown in FIG. 1A, the 5-quantum dot cell C2 may assume either ground state, $\Psi_0$ or $\Psi_1$, with respect to the ground state $\Psi_1$, of the cell C1. Nonetheless, the cell C2 cannot help but take the ground state $\Psi_0$ after the cells C3 and C3 have sequentially assumed specific states.

That is, when an input "1" is supplied to the 5-quantum dot cell C1, the cells C4, C3 and C2 sequentially assume specific states. The output cell C4 takes the ground state $\Psi_0$, which is detected as an output "0." Obviously, the input "1" has been inverted to "0."

Similarly, when an input "0" is supplied to the 5-quantum dot cell C1 while the cells C1 to C4 stay in the states shown in FIG. 1B, the cells C2, C3 and C4 sequentially assume specific states. In this case, the output cell C4 takes the ground state $\Psi_1$. To state another way, the input "0" has been converted into "1."

As can be seen from the above, the cell-connected inverter according to the first embodiment does not have any 5-quantum dot cell which assumes an indefinite state, unlike the conventional cell-connected inverter. It generates an output "1" from an input "0", and vice versa, without fail.

The cell-connected inverter according to the first embodiment has no electrodes or wires to supply a current from one element to another, thus transferring a signal. Rather, it utilizes the physical interaction (or Coulomb interaction) between any two adjacent 5-quantum dot cells, to change the state of each element, thereby to transfer a signal. Without electrodes or wires, the cell-connected inverter is free from inductive crosstalk and capacitative delay and is easy to manufacture. In addition, since no current flows through the inverter, except the input section, the cell-connected inverter consumes but very little power.

The first embodiment comprises 5-quantum dot cells. Instead, it may comprise 4-quantum dot cells of the type illustrated in FIGS. 2A and 2B. The 4-quantum dot cell shown in FIGS. 2A and 2B has the same electric charge distribution as the 5-quantum dot cell shown in FIG. 18, but differs in terms of electron transition. In a 4-quantum dot cell, an electron directly moves to a quantum dot located in one corner, whereas in a 5-quantum dot cell, an electron passes through the center dot before moving to a quantum dot located in one corner.

A 4-quantum dot cell and a 5-quantum dot cell can be manufactured by the following method. First, quantum dots having a diameter of tens of nanometers are formed by etching selected surface portions of an epitaxial wafer having a modulation-doped structure, such as an n-type AlGaAs/i-type GaAs wafer. Next, an insulating film such as an $SiO_2$ film or a film of high band-gap material such as undoped AlGaAs is made to grow on the epitaxial wafer, or an insulating film such as an $SiO_2$ film is formed on the epitaxial wafer, covering the same.

The first embodiment comprises quantum dot cells which interact, generating Coulomb repulsion. Instead, it may comprise quantum dot cells which undergo another type of physical interaction such as magnetic interaction.

Second Embodiment

FIGS. 3A to 3D schematically show the structure of a cell-connected OR device which is the second embodiment of the invention.

As can be understood from FIGS. 3A to 3D, the cell-connected OR device is a combination of the first embodiment (a cell-connected inverter) and quantum dot cells CS to C8. The cell CS is arranged near the upper-right corner of the cell C2, the cell C6 near the upper-right corner of the cell C3, the cell C7 near the lower-right corner of the cell C3, and the cell C8 at the right side of the cell C6.

The quantum dot cells C4 and C7 are used as input cells, and the quantum dot cell C8 is used as an output cell. The cell C6, which is the output cell, and the cells C2, C3 and CS constitute a first loop. The cells C1 to C4 constituent a second loop.

When two inputs "0" are supplied to the cells C4 and C7 as shown in FIG. 3A, the cells C1 and C3 assume the ground state $\Psi_1$. Then, the cell C6 can take either ground state with respect to the ground state of the cell C3 (i.e., the ground state $\Psi_1$), but takes the ground state $\Psi_0$ which is electrically stable with respect to the ground state $\Psi_1$ of the cell C5. This is because the cells C2 and CS assume the ground states $\Psi_0$ and $\Psi_1$, respectively. Thus, the quantum dot cell C8 outputs "0" when both inputs it has received are "0."

When two inputs "0" and "1" are supplied to the input cells C4 and C7, respectively, as illustrated in FIG. 3B, the cells C1 and C3 assume the ground state $\Psi_1$ and a quasi-ground state $\Psi_S$, respectively. Although the quasi-ground state $\Psi_S$ is less stable than the ground states $\Psi_0$ and $\Psi_1$, it is sufficiently stable for practical application. The quasi-ground state $\Psi_S$ is not present in the conventional cell-connected OR device. The quasi-ground state enables the cell-connected OR device of this invention to operate stably. The reason why the cell C3 assumes the quasi-ground state $\Psi_S$ has yet to be clarified. The research which the present inventors have conducted shows that no is quasi-ground state is generated unless the output cell C6 and the cells C2, C3 and C5 constitute a first loop.

The quantum dot cell C6 assumes ground state $\Psi_1$ with respect to the quasi-ground state $\Psi_S$ of the cell C3, and the cell C6 takes the ground state $\Psi_1$ which is electrically stable. This is because the cells C2 and C5 assume the ground states $\Psi_0$ and the quasi-ground state $\Psi_S$, respectively. As a result, the quantum dot cell C8 outputs "1" when the two inputs it has received are "0" and "1."

The reason why the cell C5 assumes the quasi-ground state $\Psi_S$ may be as follows.

Since the quantum dot cell C8 serving as the output cell is located on the right side of the cell C6, more energy is required to move the cell C6 than to move the cell C5. Hence, the circuit, as a whole, is at a lower energy level and more stable in terms of energy when the cell C5 takes the quasi-ground state than when the cell C6 assumes the quasi-ground state.

Figure 3C:
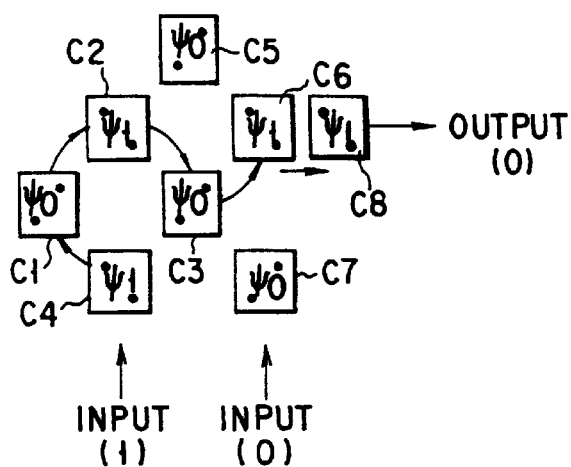
Figure 3D:
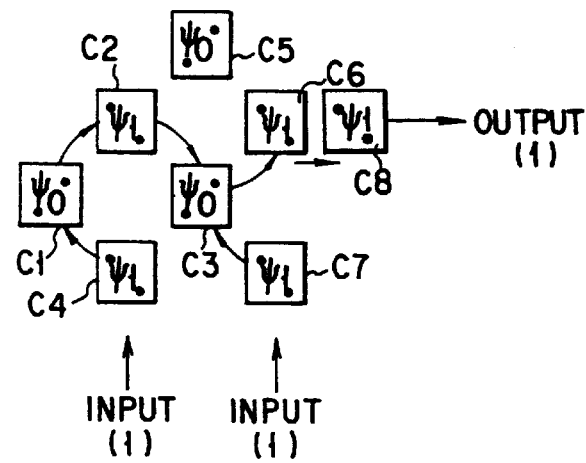

When two inputs "1" and "0" are supplied to the input cells C4 and C7, respectively, as illustrated in FIG. 3C, the cell-connected OR device outputs "1." When two inputs "1" and "1" are supplied to the input cells C4 and C7, respectively, as illustrated in FIG. 3D, the cell-connected OR device outputs "1."

More specifically, when the inputs are "1" and "0" as shown in FIG. 3C, the quantum dot cell C4 assumes the ground state $\Psi_1$, whereby the cells C1, C3 and C6 sequentially assume specific states in the order they are mentioned. Since the state the cell C6 takes is the ground state $\Psi_1$, the quantum dot cell C8 outputs "1."

When the inputs are "1" and "1" as shown in FIG. 3D, the cell C4 assumes the ground state $\Psi_1$, whereby the cells C1, C2, C3 and C6 sequentially assume specific states in the order they are mentioned. The state the cell C6 takes in this case is the ground state $\Psi_1$. Therefore, the quantum dot cell C8 outputs "1."

As described above, the device has a reliable OR logic input-output relationship, unlike the conventional cell-connected OR device.

Third Embodiment

FIGS. 4A to 4D show the structure of a cell-connected AND device which is the third embodiment of the present invention.

As seen from FIGS. 4A to 4D, the cell-connected AND device is a combination of the first embodiment (a cell-connected inverter) and three quantum dot cells C5, C6 and C7. The cell C5 is arranged near the upper-left corner of the cell C2, the cell C6 near the upper-left corner of the cell C1, and the cell C7 near the lower-left corner of the cell C1. The quantum dot cell C8 is arranged below the quantum dot cells C2.

The quantum dot cells C1 to C4 constitute a first loop. The quantum dot cells C1, C3, C5 and C6 constitute a second loop.

The cells C6 and C7 are input cells, and the cell C2 is the output cell. The output cell C2 and the cells C1, C3 and C4 constitute a loop structure. Hence, when two inputs "1" and "0" are supplied to the input cells C6 and C7, respectively, as shown in FIG. 4C, the cells C1 and C4 take the quasi-ground state $\Psi_S$. None of the quantum dot cells C1 to C7 is unstable, unlike in the conventional cell-connected AND device. The AND device therefore has a reliable AND logic input-output relationship. Forming the loop structure, the quantum dot cells C1 to C4 can be fixed in recognizable states.

Figure 4A:
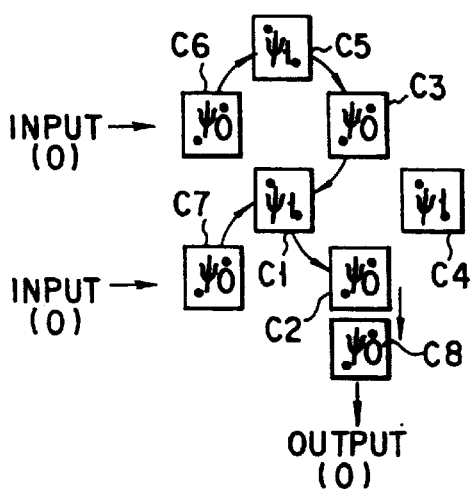

In operation, when the inputs are "0" and "0," the quantum dot cell C6 assumes the ground state $\Psi_0$ as shown in FIG. 4A, whereby the cells C5, C3, C1 and C2 sequentially take specific states in the order they are mentioned. Since the quantum dot cell C2 assumes the ground state $\Psi_0$, the quantum dot cell C8 outputs "0."

Figure 4B:
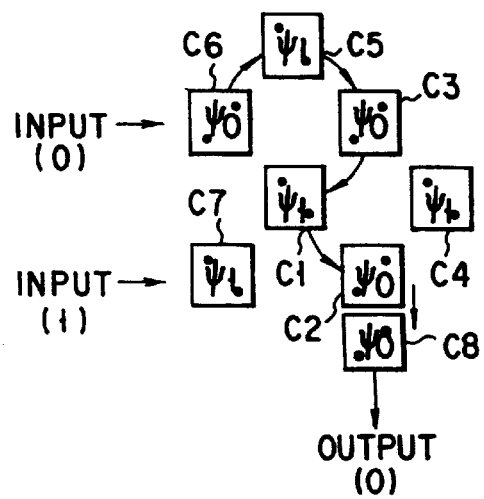

When the inputs are "0" and "1," the quantum dot cell C6 assumes the ground state $\Psi_0$ as shown in FIG. 4B, whereby the cells C5, C3, C1 and C2 sequentially take specific states in the order thy are mentioned. Since the quantum dot cell C2 assumes the ground state $\Psi_0$, the quantum dot cell C8 outputs "0."

When the inputs are "1" and "0," the quantum dot cells C6 and C7 assume the ground state $\Psi_1$, and the ground state o, respectively, as shown in FIG. 4C, whereby the cell C1 assumes the quasi-ground state $\Psi_S$. As a result, the cell C2 takes the ground state $\Psi_0$. In this case, the quantum dot cell C8 outputs "0."

When the inputs are "1" and "1," the quantum dot cell C6 assumes the ground state $\Psi_1$, as shown in FIG. 4D, whereby the quantum dot cells C1, C3, C4 and C2 sequentially take specific states in the order they are mentioned. Since the quantum dot cell C2 assumes the ground state $\Psi_1$, the quantum dot cell C8 outputs "1."

A desired logic circuit, which is constituted by integrating the quantum effect devices of the first to third embodiments, can easily be achieved by using a substrate on which quantum dot cells are arranged in a matrix. Some of the quantum dot cells, which are unnecessary, are irradiated with an energy beam such as an ion beam, and their resistance is increased.

Figure 20:
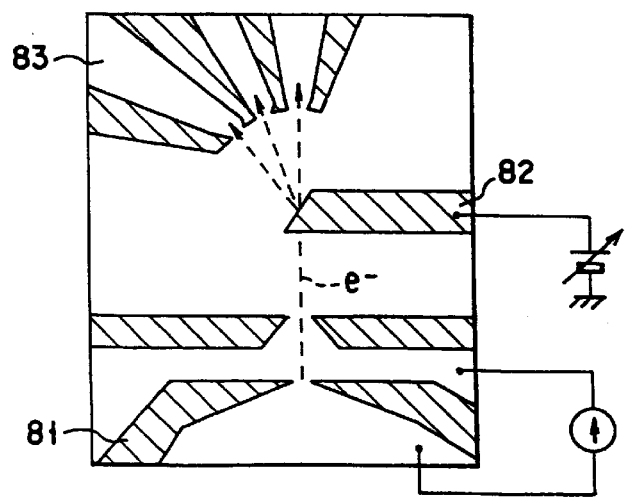
FIG. 20 is a schematic representation of a cell-connected, signal branching device which is a twenty-fourth embodiment of this invention.

FIG. 20 is a schematic representation of the semiconductor logic device proposed by J. Spector et al. (See Appl. Phys. Lett., Vol. 56, No. 24, 1990, p. 2433.) The device can operate at high speeds and can be miniaturized. This is a semiconductor logic device in which a ballistic electron e⁻ is controlled by the voltages applied to the gate terminal 81 and the emitter terminal 82 and is received by the receiver 83.

The inventors hereof think that the semiconductor logic device is disadvantageous. When used to manufacture a logic device other than an inverter, the semiconductor logic device needs to have the gate terminal 81 which is indispensable for controlling a ballistic electron $e^-$. The gate terminal 81 causes crosstalk, and stable operation of the device cannot be expected.

The present inventors have invented a quantum effect device which comprises an energy filter for guiding a ballistic electron having a predetermined energy to receiving means, at least one first emitter section for emitting the ballistic electron toward the energy filter, and at least one second emitter section for emitting a group of electrons and impinging these electrons onto the ballistic electron, thereby to change the energy of the ballistic electron. The presence and absence of the group of electrons are used as two logic inputs of the quantum effect device. The presence and absence of the ballistic electron at the receiving means are used as two logic outputs of the quantum effect device.

Three embodiments of the quantum effect device of this type, or the fourth, fifth and sixth embodiments of the present invention, will be described below:

Fourth Embodiment

FIG. 5 is a diagram showing a scatter/collision type inverter utilizing ballistic electrons, which is the fourth embodiment of the present invention. The system realizing this inverter is 2DEG (2-dimensional electron gas) generated at the heterojunction of a chemical compound semiconductor device such as a GaAs semiconductor device.

Figures 9, 10A:
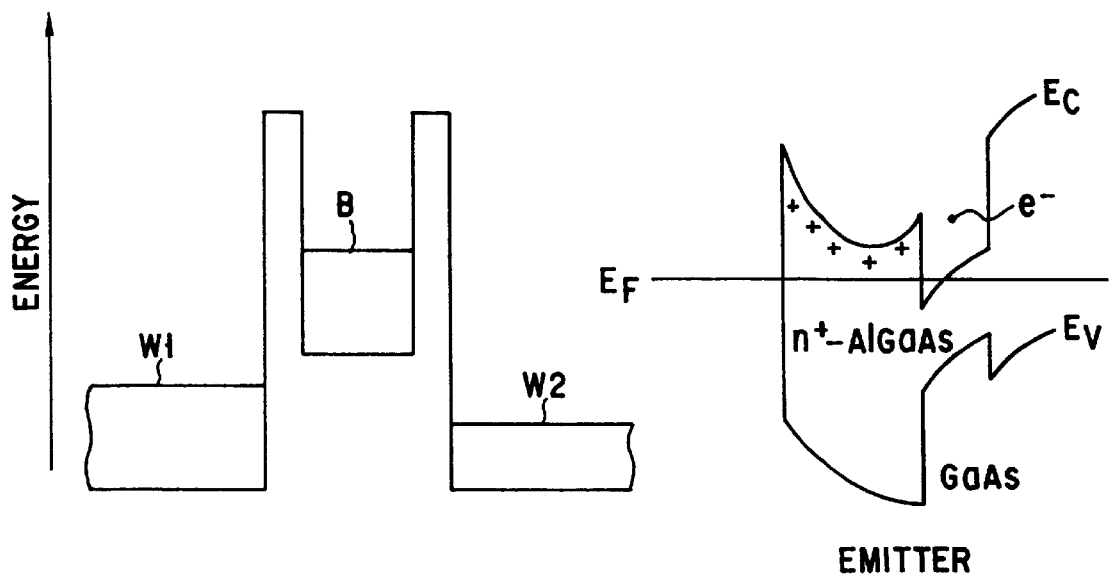
FIG. 9 is a diagram showing a main emitter section.
FIGS. 10A to 10C illustrate how a ballistic electron behaves in the various regions of a scatter/collision quantum effect device according to the present invention.

As shown in FIG. 5, the scatter/collision type inverter comprises a main emitter section 1, an input emitter section 2, an energy filter 3 and a receiver 4. The main emitter section 1 emits a ballistic electron toward the energy filter 3 in response to a system clock pulse EN. The ballistic electron is accelerated and used as first energy. As shown in FIG. 9, the main emitter section 1 comprises two well layers W1 and W2 and a barrier layer B. At least one electron in the well layer W1 moves into the barrier layer B and hence into the well layer W2—due to tunnel effect. The electron is emitted as a ballistic electron $e^-$ from the main emitter section 1. The transition of the ballistic electron $e^-$ from the well layer W1 to the well layer W2 can be controlled by the voltage applied to the barrier layer B. This transition is effected the moment a system clock pulse EN is supplied to the main emitter section 1. The acceleration voltage for the ballistic electron $e^-$ can be controlled by the voltage applied on the well layer W2.

The energy filter 3 is designed to deflect the ballistic electron $e^-$ so that the receiver 4 (i.e., receiver means) may receive the ballistic electron $e^-$. It may be of the type which has electrodes on which a deflection voltage is applied, the type which generates a magnetic field, or the type which has an electron density prism for varying the electron density of the 2DEG.

As FIG. 8 shows, the receiver 4 comprises control electrodes 11 and 12, an ohmic electrode 13 and control terminals 14 and 15—all placed in the 2DEG 10. The control electrodes 11 and 12 surround the ohmic electrode 13 for receiving the ballistic electron $e^-$. The 2DEG 10 is depleted at the positions below the control electrode 11 and 12 when a voltage is applied on the control electrodes 11 and 12 through the control terminals 14 and 15. The ballistic electron $e^-$ cannot reach the ohmic electrode 13 unless they pass through the gap between the control electrodes 11 and 12. The receiver 4 can therefore perform its function.

The input emitter section 2 shown in FIG. 5 emits a group of electrons, in response to a system clock pulse EN. These electrons are accelerated to acquire a second predetermined energy different from the first energy and are emitted toward the ballistic electron emitted from the main emitter section 1. To be more specific, the input emitter section 2 does not emit a group of electrons when the receiver 4 receives the ballistic electron, and emits them when receiver 4 does not receive the ballistic electron. The electrons emitted from the input emitter section 2 raises the temperature of the 2DEG 10, whereby the ballistic electron emitted from the main emitter section 1 is scattered. The electrons emitted from the section 2 are accelerated to have second energy which differs from the first energy.

The main emitter section 1, the input emitter section 2 and the receiver 4 are so positioned, and the input emitter section 2 emits electrons at such a speed, that the temperature of the 2DEG 10 is raised to scatter the ballistic electrons $e^-$.

The operation of the scatter/collision type inverter shown in FIG. 5 will now be explained.

A system clock pulse EN is supplied to the main emitter section 1, which emits a first ballistic electron, while the input emitter section 2 emits no group of electrons. The first ballistic electron does not collide with the 2DEG and is not scattered at all. It moves toward the energy filter 3, maintaining the first energy. The first ballistic electron is therefore received by the receiver 4 when no electrons are emitted from the input emitter section 2.

When the main emitter section 1 and the input emitter section 2, both emitter section sections 1 and 2 emit a first ballistic electron and a group of electrons, respectively, in response to a system clock pulse EN (that is, when an input is supplied), the temperature of the 2DEC rises at time $t_1$, and the first ballistic electron collides with the 2DEG and is scattered. The first ballistic electron can no longer maintain the first energy, failing to reach the receiver 4. Thus, when the input emitter section 2 emits electrons (when an input is supplied), the first ballistic electron cannot be received by the receiver 4.

That is, the receiver 4 receives the ballistic electron when the input emitter section 2 emits no group of electrons, and does not receive the ballistic electron when the input emitter section 2 emits a group of electrons. This may be summarized in the following Table 1:

TABLE 1

| Group of electrons | Ballistic electron |
| --- | --- |
| Not emitted (0) | Received (1) |
| Emitted (1) | Not received (0) |

As is understood from Table 1, the scatter/collision type inverter can perform its function reliably. This is because this inverter utilizes ballistic electrons (i.e., electrons existing in a quantum effect region), and also the collision of the ballistic electron with the 2DEG and the subsequent scattering of the ballistic electron. Since the information is transferred by a small number of ballistic electrons, the scatter/collision type inverter is superior to the conventional inverter comprising transistors (e.g., bipolar transistors) in terms of integration density, power consumption and operating speed.

Fifth Embodiment

FIG. 6 shows a scatter/collision type NOR device utilizing ballistic electrons, which is the fifth embodiment of the invention. Some of the components of the NOR device are identical to those of the inverter shown in FIG. 5. They are therefore designated by the same numerals and will not be described in detail.

As FIG. 6 shows, the scatter/collision type NOR device differs from the inverter of FIG. 5, only in that a second input emitter section 2a is provided. The second input emitter section 2a emits a group of electrons having energy different from that of a ballistic electron.

In the present embodiment, the group of electrons emitted from the input emitter section 2 is called "first group," and the group of electrons emitted from the input emitter section 2a is called "second group."

The operation of the scatter/collision type NOR device will be explained in the following.

A system clock pulse EN is supplied to the main emitter section 1, which emits a ballistic electron toward the energy filter 3. The ballistic electron does not collide with the 2DEG if neither the first input emitter section 2 nor the second input emitter section 2a emit a group of electrons. If this is the case, the ballistic electron keeps on moving toward the energy filter 3, while maintaining a predetermined first energy, and is eventually received by the receiver 4.

If system clock pulse EN is supplied to the main emitter section 1 and the first input emitter section 2, but not to the second input emitter section 2a, the section 1 emits a ballistic electron toward the energy filter 3, and the first input emitter section 2 emits a group of electrons. The temperature of the 2DEG is thereby increased at time $t_1$. At time $t_1$, the ballistic electron collides with the 2DEG and is subsequently scattered. The ballistic electron no longer maintains the predetermined first energy and inevitably fails to reach the receiver 4, which cannot receive the ballistic electron.

If system clock pulse EN is supplied to the main emitter section 1 and the second input emitter section 2a, but not to the first input emitter section 2, the section 1 emits a ballistic electron toward the energy filter 3, and the second input emitter section 2a emits a group of electrons. The temperature of the 2DEG is thereby increased at time $t_2$. At time $t_2$, the ballistic electron collides with the 2DEG and is scattered. The ballistic electron no longer maintains the predetermined first energy and fails to reach the receiver 4. Also in this case, the receiver 4 cannot receive the ballistic electron.

If system clock pulse EN is supplied to the main emitter section 1, the first input emitter section 2 and the second input emitter section 2a, the section 1 emits a ballistic electron toward the energy filter 3, the first input emitter section 2 emits a group of electrons, and the second input emitter section 2a emits a group of electrons. The ballistic electron and the electrons emitted from the section 2 raises the temperature of the 2DEG at time $t_1$. At time $t_2$, the ballistic electron collides with the 2DEG and is scattered. The ballistic electron no longer maintains the predetermined first energy and fails to reach the receiver 4. In this case, too, the receiver 4 cannot receive the ballistic electron.

The operation of the scatter/collision type NOR device, described above, may be summarized in the following Table 2:

TABLE 2

| First group of electrons | Second group of electrons | Ballistic electrons |
|---|---|---|
| Not emitted (0) | Not emitted (0) | Received (1) |
| Not emitted (0) | Emitted (1) | Not received (0) |
| Emitted (1) | Not emitted (0) | Not received (0) |
| Emitted (1) | Emitted (1) | Not received (0) |

The fifth embodiment has no gate terminals at all since, as indicated above, it utilizes ballistic electrons (i.e., electrons existing in a quantum effect region), and also the collision of the ballistic electron with the 2DEG and the subsequent scattering of the ballistic electron. Therefore, the scatter/collision type NOR device is free of crosstalk among gate terminals. Its operation is quite stable.

Sixth Embodiment

FIG. 7 is a diagram showing a scatter/collision type NAND device utilizing ballistic electrons, which is the sixth embodiment of the present invention.

The scatter/collision type NAND device is a combination of the scatter/collision type inverter (the fourth embodiment), a second main emitter section 1a, a second input emitter section 2a, a second energy filter 3a, and a second receiver 4a.

In this embodiment, the ballistic electrode emitted from the main emitter section 2a is called "second ballistic electron."

It will now be explained how the scatter/collision type NAND device performs its function.

A system clock pulse EN is supplied to the main emitter section 1 and 1a, but not to the input emitter sections 2 and 2a. The first main emitter section 1 emits a first ballistic electron toward the first energy filter 3, and the second main emitter section 1a emits a second ballistic electron toward the second energy filter 3a. Neither the first input emitter section 2 nor the second input emitter section 2a emit a group of electrons. The first ballistic electron does not collide with the 2DEG heated by electrons and is not scattered. Similarly, the ballistic electron of the second group does not collide with the 2DEG heated by electrons and is not scattered. Both the first ballistic electron and the second ballistic electron move therefore toward the energy filters 3 and 3a, while maintaining a predetermined first energy. Namely, if the input emitter sections 2 and 3a emit no electrons, the first ballistic electron is received by the first receiver 4, and the second ballistic electron by the second receiver 4a.

If system clock pulse EN is supplied to both main emitter sections 1 and 1a and the first input emitter section 2, but not to the second input emitter section 2a, the main emitter sections 1 and 1a emit a first ballistic electron and a second ballistic electron, respectively, and the first input emitter section 2 emits a first group of electrons. The first ballistic electron collides with the 2DEG heated by the electrons of the first group and is subsequently scattered at time $t_1$. It cannot maintain the predetermined energy, failing to reach the first receiver 4, and cannot be received by the first receiver 4. The second ballistic electron, emitted from the second main emitter section 1a, maintains the predetermined energy, reaches the second receiver 4a and is received thereby.

If system clock pulse EN is supplied to both main emitter sections 1 and 1a and the second input emitter section 2a, but not to the first input emitter section 2, the main emitter sections 1 and 1a emit a first ballistic electron and a second ballistic electron, respectively, and the second input emitter section 2a emits a second group of electrons. The second ballistic electron collides with the 2DEG heated by the electrons of the second group and is subsequently scattered at time $t_3$. The second ballistic electron cannot maintain the predetermined energy, failing to reach the second receiver 4a, and cannot be received thereby. The first ballistic electron, emitted from the first main emitter section 1, maintains the predetermined energy, reaches the first receiver 4 and is received thereby.

If a system clock pulse EN is supplied to both main emitter sections 1 and 1a and both input emitter sections 2 and 2a, the main emitter sections 1 and 1a emit a first ballistic electron and a second ballistic electron, respectively, and the input emitter sections 2 and 2a emit first and second groups of electrons, respectively. The first ballistic electron collides with the 2DEG heated by the electrons of the first group and is subsequently scattered at time $t_1$. On the other hand, the second ballistic electron collides with the 2DEG heated by the electrons of the second group and is subsequently scattered at time $t_3$. Neither ballistic electron can maintain the predetermined energy. As a result, the first ballistic electron fails to reach the first receiver 4, and cannot be received thereby, and the second ballistic electron fails to reach the second receiver 4a.

The operation of the scatter/collision type NAND device, described above, may be summarized in the following Table 3:

TABLE 3

| First group of electrons | Second group of electrons | Ballistic electrons |
| --- | --- | --- |
| Not emitted (0) | Not emitted (0) | Received (1) |
| Not emitted (0) | Emitted (1) | Received (1) |
| Emitted (1) | Not emitted (0) | Received (1) |
| Emitted (1) | Emitted (1) | Not received (0) |

The sixth embodiment has no gate terminals at all. Therefore, the scatter/collision type NAND device, i.e., the sixth embodiment, is free of crosstalk among gate terminals. Its operation is very stable.

The system realizing this scatter/collision type NAND device is 2DEG. Any other system can be utilized instead, such as a system comprised of a vacuum space and a micro-emitter, which is a system generally known in the field of vacuum microelectronics.

Figures 10B, 10C:
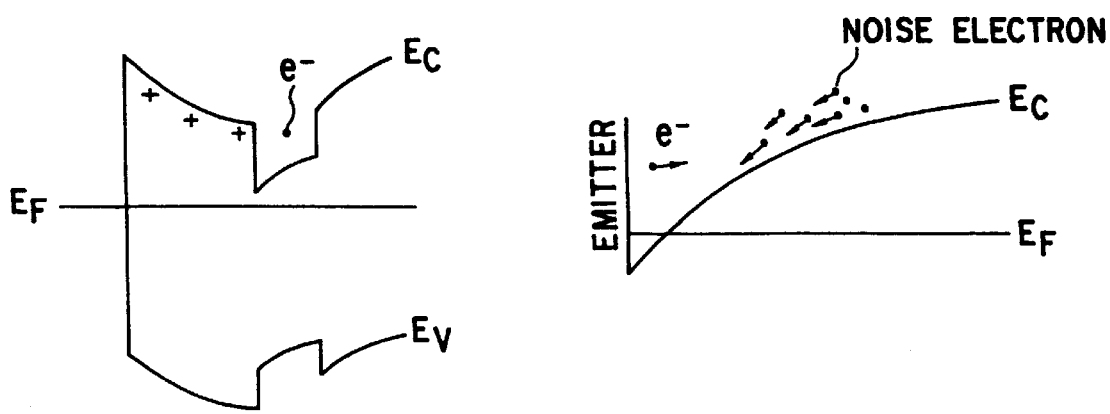

FIG. 10A is a band diagram showing how a ballistic electron $e^-$ behaves in an emitter section and in a plane perpendicular to its path. FIG. 10B is also a band diagram explaining how the ballistic electron $e^-$ behaves in a collision/scatter region and in a plane perpendicular to its path.

As can be understood from FIGS. 10A and 10B, the scatter/collision type quantum effect device according to the invention can operate more stably, provided that two conditions are satisfied. The first condition is a proper change in the density of electrons in the region of the 2DEG system, where ballistic electrons interact with the electrons emitted from the input emitter section. The second condition is appropriate measures taken to suppress the screening effect of Coulomb potential in the collision/scatter region, thereby to intensify the Coulomb interaction among the ballistic electrons.

FIG. 10C is a band diagram showing how a ballistic electron $e^-$ behaves in a collision/scatter region in a plane parallel to its path. The path $E_C$ of the ballistic electron $e^-$ is curved upwards from the main emitter section to the collision/scatter region. Noise electrons, if abruptly generated from cosmic rays or the like, move toward the main emitter section along the path $E_C$, exerting Coulomb repulsion on the ballistic electron $e^-$ and, thus, prohibiting the ballistic electron $e^-$ from reaching the sensor. This prevents the quantum effect device from making errors.

Seventh Embodiment

Figure 11:
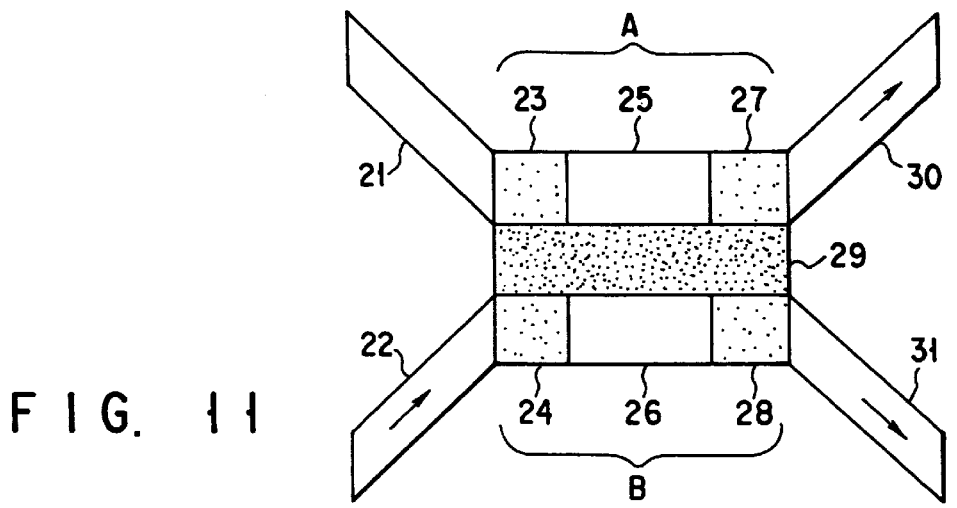
FIG. 11 is a schematic representation of an electron-wave directional coupling switch which is a seventh embodiment of the present invention.

FIG. 11 schematically illustrates an electron-wave directional coupling switch which is the seventh embodiment of the present invention.

As shown in FIG. 11, the electron-wave directional coupling switch comprises three major components, i.e., a first waveguide A, a second waveguide B, and a quantum barrier layer 29 coupling these waveguides. The first waveguide A has a resonance tunnel structure and comprises a quantum barrier layer 23, a quantum well layer 25, and a quantum barrier layer 27. The second waveguide B also has a resonance tunnel structure (double-barrier structure) and comprises a quantum barrier layer 24, a quantum well layer 26, and a quantum barrier layer 28.

The quantum barrier layer 29 has a transmission-band level which is higher than those of the quantum well layers 25 and 26. The first waveguide A has an input section 21 and an output section 30. Similarly, the second waveguide B has an input section 22 and an output section 31. The resonance tunnel structure of either waveguide is so designed that a peak current flows at a voltage which corresponds to the potential difference between the input and output sections of the waveguide. Each waveguide has two gate electrodes (not shown) provided on the sides of the waveguide, for controlling the switching operation.

In the electron-wave directional coupling switch, thus structured, the electron waves input to the input waveguides 21 and 22 tunnel through the quantum barrier layers 23 and 24 into the quantum well layers 25 and 26. The electron waves immediately tunnel through the quantum layers 27 and 28 and are supplied to the output waveguides 30 and 31.

Figure 21:
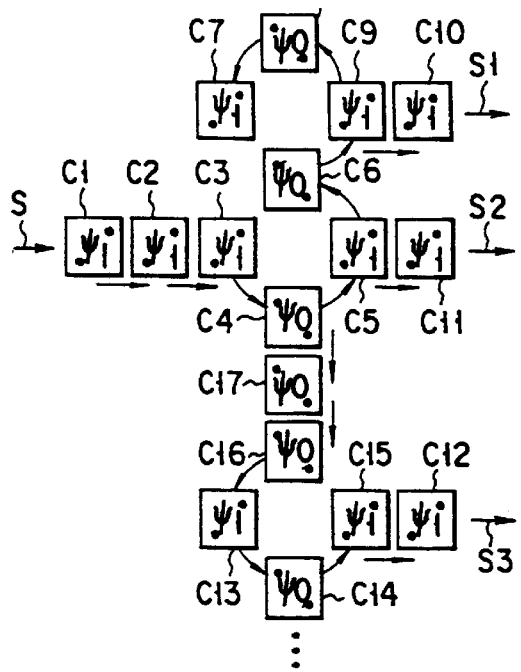
FIG. 21 is a schematic representation of an electron-wave directive coupling switch.

Due to the resonance tunnel effect, the ratio of the peak current to the valley current (i.e., peak current/valley current) is sufficiently great even at room temperature. The coupling switch has a higher limit to the operating temperature, than that (e.g., 10K) of a conventional electron-wave directional coupling switch disclosed in, for example, C. C. Eugster and J. A. del Alamo, Phys. Rev. Lett., 67 (1991), 3538. FIG. 21 is a schematic representation of the conventional coupling switch. The conventional coupling switch differs from the coupling switch of FIG. 11 (i.e., the seventh embodiment) in that the waveguides 25a and 26a are made of a single material, neither having resonance tunnel effect.

In the electron-wave directional coupling switch, the resonance energy levels of the quantum well layers 25 and 26 which are discrete can be adjusted by appropriately changing the thicknesses or heights of the quantum barrier layers 23, 27, 24 and 28. A peak current can thereby flow at a bias voltage determined by the input and output.

For example, if the quantum barrier layers 23, 27, 24 and 28 and quantum well layers 25 and 26 of the waveguides A and B have a thickness of 5 n, a peak current will flow at a bias voltage of 0.15 V, whereby electron waves propagate.

Namely, a peak current can be generated at a given bias voltage, making the electron waves propagate, by adjusting the thickness or heights of the quantum barrier layers and quantum well layers.

The quantum well layers may be made of metal, and the quantum barrier layers may be covered with an insulator. In this case, too, a resonance tunnel structure can be provided. The limitation to the materials that can be used is greatly reduced.

According to this invention, the quantum well layers and the quantum barrier layers can be made of various materials, among which are semiconductor materials such as GaAs-based one, Si-based one and the like, metals such as Ti, Al and the like, and insulating materials such as aluminum oxide, silicon oxide and the like.

As shown in FIG. 11, two electrodes are provided on the quantum well layers 25 and 26, respectively, and a voltage is applied to these electrodes. The energy levels of the quantum well layers 25 and 26 are thereby adjusted, whereby the electron-wave directional coupling switch performs its function.

When the energy levels of the quantum well layers 25 and 26 are rendered equal, the electron wave input from the input waveguide 22 are guided into the quantum well layer 26 and tunnels through the quantum barrier layer 27 into the output waveguide 30. At the same time, the electron wave injected from the input wave guide 22 into the quantum well layer 26 tunnels through the quantum well layer 28 into the output waveguide 31.

When the energy levels of the quantum well layers 25 and 26 are not made equal, the electron wave from the quantum well 26 does not tunnel through the quantum well layer 2 and is not output to the output waveguide 30.

Figure 12:
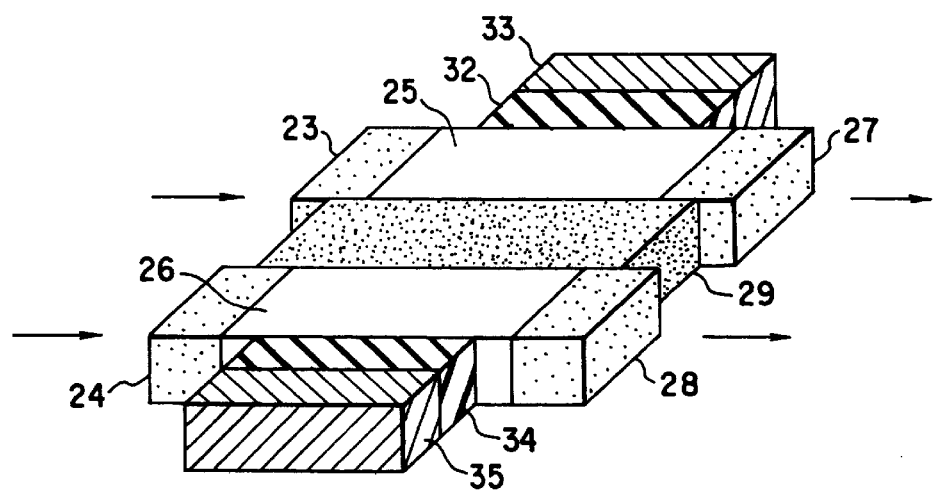
FIG. 12 is a perspective view of a planar type of the electron-wave directional coupling switch shown in FIG. 11.
Figure 13:
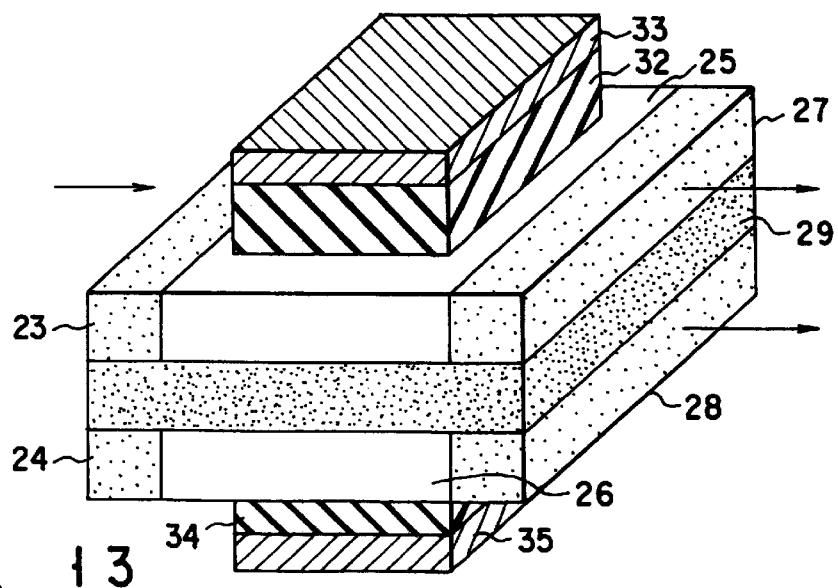
FIG. 13 is a perspective view of a multi-layered type of the electron-wave directional coupling switch shown in FIG. 11.

FIGS. 12 and 13 show two types of the electron-wave directional coupling switches illustrated in FIG. 11. More precisely, FIG. 12 is a perspective view of a electron-wave directional coupling switch of a planar type, and FIG. 13 is a perspective view of an electron-wave directional coupling switch of a multi-layered type. In FIGS. 12 and 13, the components identical to those shown in FIG. 11 are designated at the same reference numerals.

In either type of an electron-wave directional coupling switch, the quantum barrier layers 23, 24, 27 and 28 are made of, for example, AlGaAs, and the quantum well layers 25 and 26 are made of, for example, GaAs. The quantum barrier layer 29 may be made of AlGaAs which has a mixed-crystal ratio identical to, or AlGaAs which has a mixed-crystal ratio different from, the quantum barrier layers 23, 24, 27 and 28. As shown in FIGS. 12 and 13, either electron-wave directive coupling switch has gate insulating films 32 and 34 made of insulating materials such as $SiO_2$ and gate electrodes 33 and 35 made of conductive material such as aluminum.

Either type of the electron-wave directional coupling switch is designed such that the quantum well layers 25 and 26 become symmetrical when a gate voltage is applied to the switch. While no gate voltage is being applied to the switch, electron waves pass through the coupling section 29. While a gate voltage is being applied to the switch, the actual potentials of both quantum well layers 25 and 26 change, making the layers 25 and 26 asymmetrical to each other, and electron waves cannot pass through the coupling section 29. That is, the switch performs a switching operation, allowing the passage of the electron waves when a gate voltage is applied to it, and prohibiting the passage of the electron waves when no gate voltage is applied to it.

In the coupling switch of the multi-layered type (FIG. 13), the quantum well layers 25 and 26 may be used as a front gate and back gate, respectively. In addition, this coupling switch can easily be manufactured by forming the layers by epitaxial growth.

The electron-wave directional coupling switch (FIG. 11) which is the seventh embodiment of the invention, is a GaAs/AlGaAs system. Nonetheless, an electron-wave directional coupling switch according to the invention may be made of two or more materials which differ in band gap.

Eighth Embodiment

Figure 14:
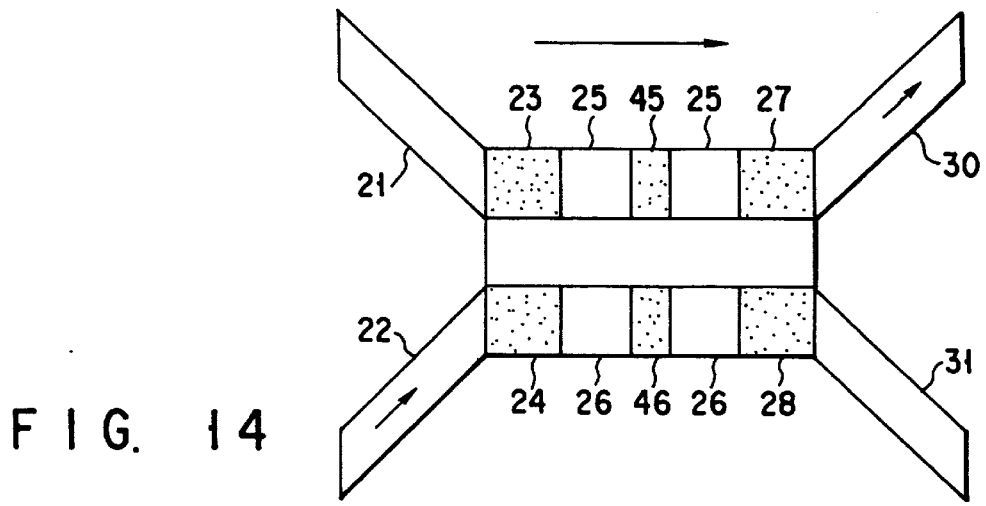
FIG. 14 is a schematic diagram of an electron-wave directional coupling switch which is an eighth embodiment of this invention.
Figure 15:
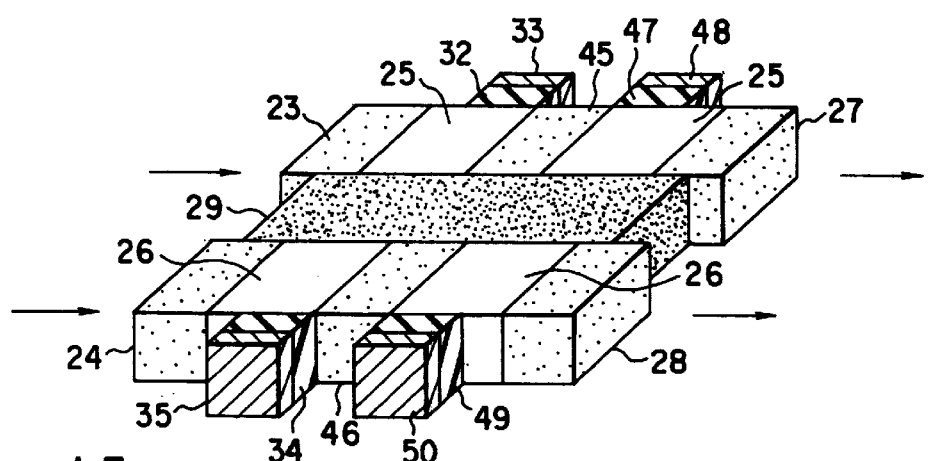
FIG. 15 is a perspective view of a multi-layered type of the electron-wave directional coupling switch shown in FIG. 14.
Figure 16:
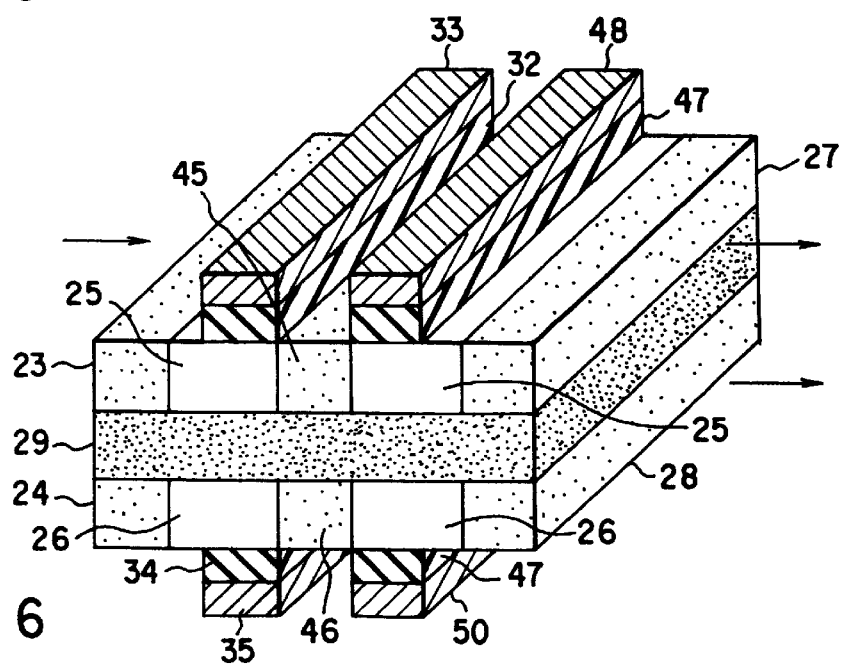
FIG. 16 is a perspective view of a planar type of the electron-wave directional coupling switch shown in FIG. 14.

FIG. 14 is a schematic diagram of an electron-wave directive coupling switch which is the eighth embodiment of this invention. FIGS. 15 and 16 show two types of this coupling switch. More correctly, FIG. 15 is a perspective view of a planar type of the coupling switch shown in FIG. 14, and FIG. 16 is a perspective view of a multi-layered type of the coupling switch shown.

The electron-wave directional coupling switches of FIGS. 15 and 16 differ from the those of the seventh embodiment (FIGS. 12 and 13) in that additional quantum barrier layers 45 and 46 are provided in the quantum well layers 25 and 26, respectively, constituting a triple-barrier structure in each waveguide. Either type of the coupling switch has gate insulating films 47 and 48 and gate electrodes 48 and 50.

Both types of the electron-wave directional coupling switches, shown in FIGS. 15 and 16, have the same advantage as those of the seventh embodiment. They are further advantageous in that since two quantum wells exist in each wave guide, the two gate electrodes provided on the outer sides of the waveguide can serve to adjust the quantum level of the waveguide minutely. To put it another way, the four gate electrodes 33, 35, 48 and 50 can control the number of electrons which are input to the switch in the form of electron waves.

The quantum dot cells are incorporated in the eighth embodiment. They made be replaced by magnetic coupling cells each of which is comprised of two directive magnets and which undergo magnetic interaction among themselves.

Ninth Embodiment

Figure 22:
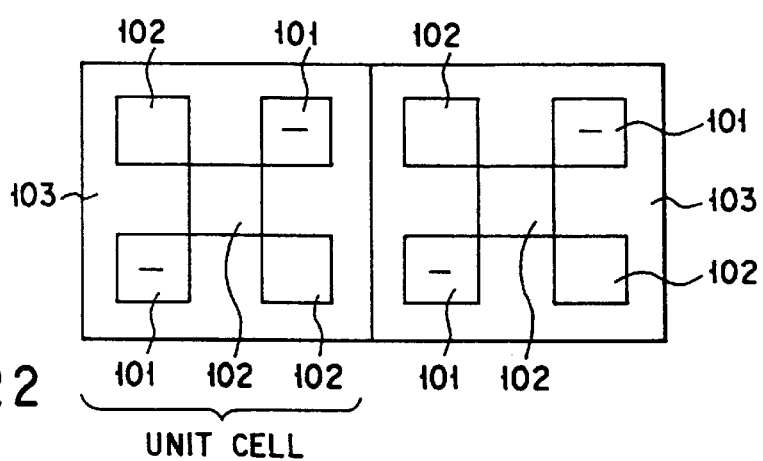
FIG. 22 is a diagrammatic plan view showing a quantum effect device which is a ninth embodiment of the present invention.

FIG. 22 is a diagrammatic plan view showing a quantum effect device which is the ninth embodiment of the present invention.

As FIG. 22 shows, the quantum effect device comprises two 5-quantum dot cells (i.e., unit cells) which are used as quantum artificial molecules. Each 5-quantum dot cell is comprised of two square quantum boxes 101 which contain one electron each, three square quantum boxes 102 which contains no electron, and a barrier layer 103 for blocking electrons.

The unit cells are different from the conventional 5-quantum dot cells in three respects. First, the five quantum boxes are square ones. Second, the center quantum box contacts the remaining four quantum boxes at its four corners, respectively. Third, the four quantum boxes arranged in a row and a column are spaced far enough to prohibit electrons from moving among these four quantum boxes despite tunnel effect. In other words, the distance between any two adjacent quantum boxes is far longer than the de Broglie wavelength of electron waves.

In each unit cell, thus constituted, an electron always passes through the center quantum box, when moving from another quantum box to still another quantum box to change the state of the unit cell, from the "0" state to the "1" state, or vice versa. Once the unit cell has assumed the "0" or "1" state, an electron must pass through the center quantum box to set the unit cell into the other state. However, as an electron moves toward the center quantum box when no bias is applied, the Coulomb repulsion between it and another electron increases. The electron is thereby prohibited from moving to the center quantum box. As a result of this, the unit cell stays in the "0" or "1" state even after the application of a bias to the unit cell has been terminated. Namely, the unit cell maintains a threshold energy.

Having these unit cells, the quantum effect device shown in FIG. 22 can function as a nonvolatile memory or a logic circuit, which cannot be constituted by the conventional 5-quantum dot cells. When a bias is applied to the input cell, the electrons in the adjacent cell moves to set this cell and the input cell into a condition stable in terms of energy.

The logic circuit makes an inverter circuit if the unit cells are arranged as shown in FIG. 1, an OR circuit if the unit cells are arranged as illustrated in FIG. 3, and an AND circuit if the unit cells are arranged as depicted in FIG. 4.

Figure 23:
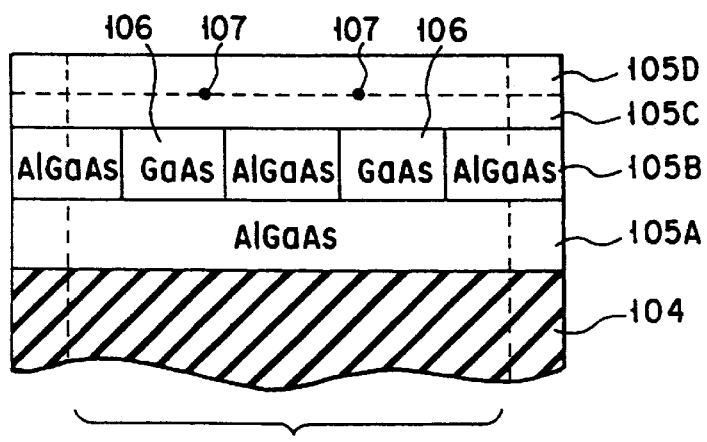
FIG. 23 is a sectional view of the quantum effect device illustrated in FIG. 22.

FIG. 23 is a sectional view of the quantum effect device illustrated in FIG. 22. The structure shown in FIG. 23 can be obtained by forming semiconductor layers, one upon another, on a semiconductor substrate by means of ordinary selective growth technique utilizing epitaxial growth such as MBE or MOCVD. A method of manufacturing the structure of FIG. 23 will be explained below.

First, an $Al_xGa_{1-x}As$ layer 105A, i.e., a high band-gap barrier layer for blocking electrons, is formed on a GaAs substrate 104. Another $Al_xGa_{1-x}As$ layer 105B is formed on the layer 105A. The quantum box regions of the layer 105B are etched away, forming recesses. GaAs is filled in these recesses, thereby forming GaAs quantum boxes 106. Next, an $Al_xGa_{1-x}As$ layer 105C, which will be used as a barrier layer, is formed on the layer 105B and the GaAs quantum boxes 106. Thereafter, two donors 107 are planar-doped for each unit cell in the layer 105C. An $Al_xGa_{1-x}As$ layer 105D is formed on the layer OSC. If necessary, a protective film, e.g., an oxide film, is formed on the $Al_xGa_{1-x}As$ layer 105D. Any desirable value can be selected for the molar ratio of Al.

In this case, electrons are selectively injected from the donor 1–7 into the GaAs quantum box 106 by means of modulation doping, forming a bistable cell.

Tenth Embodiment

Figure 24:
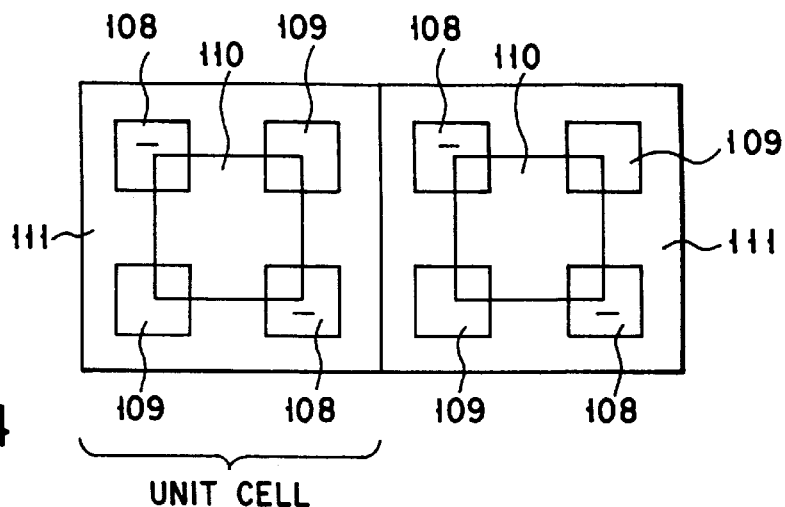
FIG. 24 is a diagrammatic plan view showing a quantum effect device which is a tenth embodiment of the present invention.

FIG. 24 is a diagrammatic plan view showing a quantum effect device which is the tenth embodiment of the present invention.

As is seen from FIG. 24, this quantum effect device comprises two unit cells. Each unit cell has five square quantum boxes—two small quantum boxes 108 containing one electron each, two small quantum boxes 109 containing no electron at all, and one large quantum box 110. The small quantum boxes 108 and 109 are arranged in a row and a column, spaced apart from one another by distances much longer than the de Broglie wavelength of electron waves. Therefore, electrons are prohibited from moving among the small quantum boxes in spite of tunnel effect. The large quantum box 110 is arranged above the small quantum boxes, so close thereto that electrons can tunnel through it, numeral 111 denotes a barrier layer to the electrons.

In each unit cell of the device shown in FIG. 24, an electron cannot move directly from one small quantum box to another small quantum box—despite the tunnel effect. It can move to a small quantum box to another, only by passing through the large (center) quantum box 110. The large quantum box 110 works in the same way as the quantum box 102 incorporated in either unit cell of the ninth embodiment (FIG. 22). The unit cells of the quantum effect device shown in FIG. 24, therefore, have the same advantage as those of the ninth embodiment.

The tenth embodiment (FIG. 24) can be made by forming the small quantum boxes 108 and 109 in the same plane, and then by forming the large quantum box 110 above the small quantum boxes. This manufacturing method not only is easy to perform, but also provides large process margins. Further, the vertical distance between the large quantum box and the four small quantum boxes located in the same plane can be adjusted in units of atom layers. This greatly enhances the freedom of design for this quantum effect device.

Figure 25:
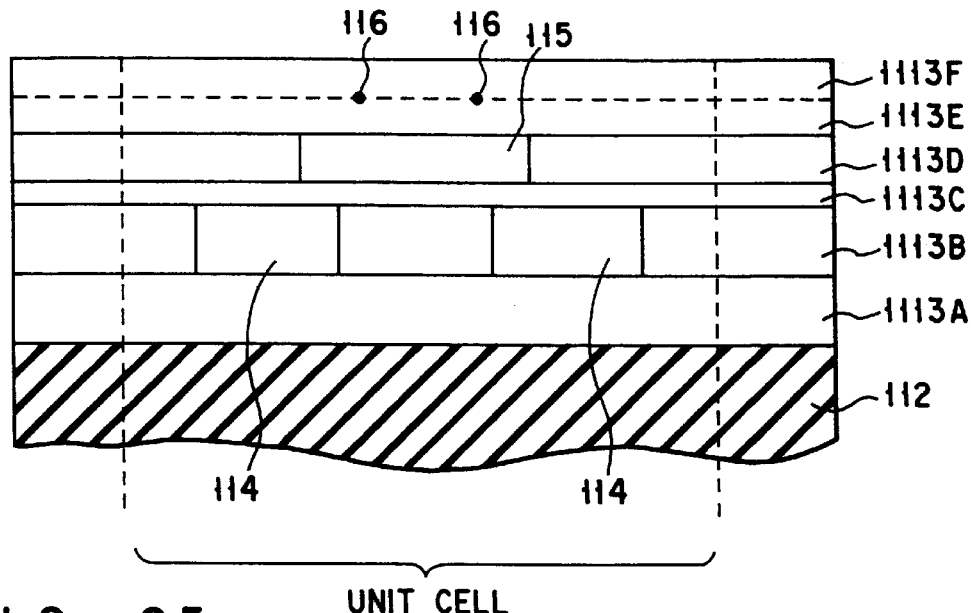
FIG. 25 is a sectional view of the quantum effect device illustrated in FIG. 24.

FIG. 25 is a sectional view of the quantum effect device shown in FIG. 24. Having the structure of FIG. 25, the device can be manufactured by the same method as the ninth embodiment (FIGS. 22 and 23). That is, it can be made by forming semiconductor layers, one upon another, on a semiconductor substrate by means of ordinary selective growth technique utilizing epitaxial growth such as MBE or MOCVD. A method of manufacturing the structure of FIG. 25 will be explained below.

First, an $Al_xGa_{1-x}As$ layer 113A, i.e., a high band-gap barrier layer for blocking electrons, is formed on a GaAs substrate 112. Another $Al_xGa_{1-x}As$ layer 113B is formed on the layer 113A. The small quantum box regions of the layer 113B are etched away, forming recesses. GaAs is filled in these recesses, thereby forming GaAs quantum boxes 114. Next, an $Al_xGa_{1-x}As$ layer 113C, which will be used as a barrier layer, is formed on the layer 113B and the GaAs quantum boxes 114. Further, an $Al_xGa_{1-x}As$ layer 113D, which will be used as a barrier layer, too, is formed on the $Al_xGa_{1-x}As$ layer 113C. The large quantum box region of the layer 113D is etched away, forming a recess. This recess is filled with GaAs, thereby forming the large quantum box 115. Then, an $Al_xGa_{1-x}As$ layer 113E, which will be used as a barrier layer, is formed on the layer 113D and the large quantum box 115. Thereafter, two donors 116 are planar-doped for each unit cell in the layer 113E. An $Al_xGa_{1-x}As$ layer 113F is formed on the layer 113E. If necessary, a protective film, e.g., an oxide film, is formed on the $Al_xGa_{1-x}As$ layer 113F. Any desirable value can be selected for the molar ratio of Al. In this case, electrons are selectively injected from the donor 116 into the GaAs quantum box 114 by means of modulation doping, forming a bistable cell.

In the ninth embodiment and the tenth embodiment, the quantum boxes are made of GaAs, whereas the barrier layers are made of AlGaAs. This combination of materials may be replaced by InGaAs/InP, InGaAs/AlInAs, GaSb/AlSb, or GaAs/GaP. Furthermore, an $Si/SiO_2$ combination may be employed. Alternatively, a combination of materials which forms a hetero junction, such as InAs/GaSb or (InAs)(GaAs)/(GaSb)(GaAs), may be utilized to spatially isolate electrons from holes in order to avoid electron-hole recombination.

Eleventh Embodiment

Figures 26A, 26B:
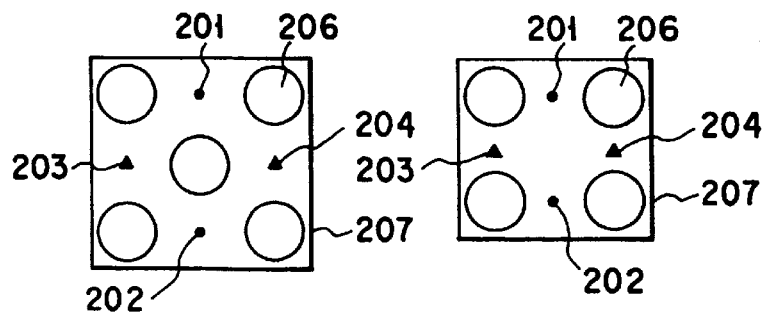
FIGS. 26A and 26B are schematic plan views of a quantum effect device which is an eleventh embodiment of this invention.

FIGS. 26A and 26B are schematic plan views of a quantum effect device which is the eleventh embodiment of this invention. More precisely, FIG. 26A shows one of identical 5-quantum dot cells to be incorporated into the device, and FIG. 26B illustrates one of identical 4-quantum dot cells to be incorporated into the device. Either type of a quantum dot cell comprises a substrate 207 and five or four quantum boxes 206. Each quantum box 206 is formed in the substrate 207 and has a band gap greater than that of the substrate 207.

The eleventh embodiment is characterized in that two impurity atoms which release electrons are implanted into the two regions 201 and 202 of substrate 207 or into two regions 203 and 204 thereof. Electrons will separate from the impurity ions, by virtue of Coulomb interaction and will be reliably absorbed, even at low temperatures, into the quantum boxes 206 which have a small band gap.

In the conventional quantum dot cell which has been manufactured by modulation doping, each impurity atom modulation-doped is likely to remain stable at low temperatures, failing to split into an ion and an electron. Namely, there is the possibility that no electrons are absorbed into the quantum boxes of the conventional quantum dot cell.

In the eleventh embodiment, as indicated above, impurity atoms are implanted into the substrate 207. Instead, a semiconductor layer may be formed on the substrate 207, and the impurity atoms may be implanted into those portions of this layer which are aligned with the regions 201 and 202 or regions 203 and 204 of the substrate 207, by means of atomic manipulation.

Twelfth Embodiment

Figure 27:
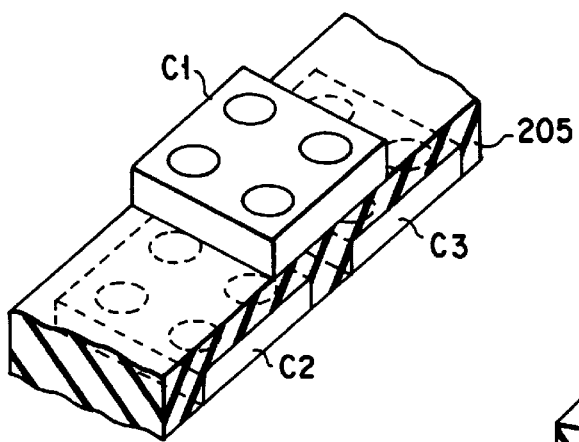
FIG. 27 is a perspective view showing a quantum effect device which is a twelfth embodiment of the present invention.

FIG. 27 is a perspective view showing a quantum effect device which is the twelfth embodiment of the present invention.

As shown in FIG. 27, the quantum effect device comprises three 4-quantum dot cells (quantum artificial molecules) C1, C2 and C3 and an insulating layer 205. The cells C2 and C3 are arranged in the same plane and isolated by and covered with the insulating layer 205. The cell C1 is mounted on the insulating layer 205, overlapping the opposing portions of the cells C2 and C3. The 4-quantum dot cells C1, C2 and C3 are arranged in a 3-dimensional pattern, which characterizes the twelfth embodiment.

Figure 31:
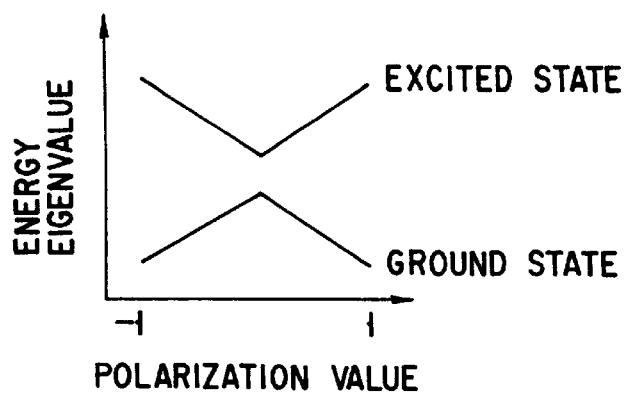
FIG. 31 is a diagram showing how the energy-level difference between the ground and excited states of each 4-quantum dot cell constituting the device of FIG. 27 depends upon the entra-cell electron distribution which acts as an external force.
Figure 32:
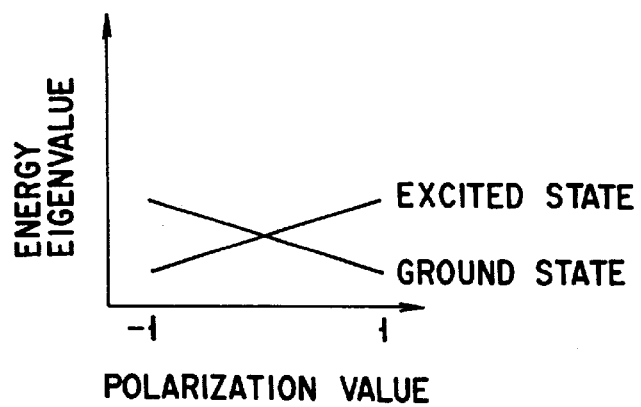
FIG. 32 is a diagram explaining how the energy-level difference between the ground and excited states of each of two 4-quantum dot cells arranged in the same plane depends upon the entra-cell electron distribution which acts as an external force.

FIG. 31 is a diagram illustrating how the energy-level difference (i.e., energy eigenvalue) between the ground and excited states of each 4-quantum dot cell used in the twelfth embodiment depends upon the entra-cell electron distribution (i.e., polarization value) which acts as an external force. FIG. 32 is a diagram showing how the energy-level difference between the ground and excited states of each of two 4-quantum dot cells arranged in the same plane depends upon the entra-cell electron distribution which acts as an external force.

As clearly seen from FIGS. 31 and 32, the energy eigenvalue of each 4-quantum dot cell used in the twelfth embodiment (FIG. 27) is more than twice as much as the energy eigenvalue of each 4-quantum dot cells which are arranged in the same plane, constituting a conventional quantum effect device. Stated another way, the energy-level difference between the ground and excited states of each 4-quantum dot cell is sufficiently large, though the cells C1, C2 and C3 are spaced far from one another. Thanks to the large energy-level difference, the twelfth embodiment can operate at high temperatures.

As described above, the 4-quantum dot cells C1, C2 and C3 need not be arranged close to one another, they remain bistable, whereby the twelfth embodiment reliably functions as a quantum effect device.

The reason why the cells C1 to C3 have a large energy-level difference has yet to be further analyzed, but it is probably because the cell C1 applies a feedback to the electron distribution between the cells C2 to C3 to render the cells C2 and C3 more bistable.

The logic circuit makes an inverter circuit if the unit cells, each consisting of three quantum dot cells C1 to C3 arranged in a three-dimensional pattern, are arranged as shown in FIG. 1, an OR circuit if the unit cells are arranged as shown in FIG. 3, and an AND circuit if the unit cells are arranged as depicted in FIG. 4.

Thirteenth Embodiment

Figure 28:
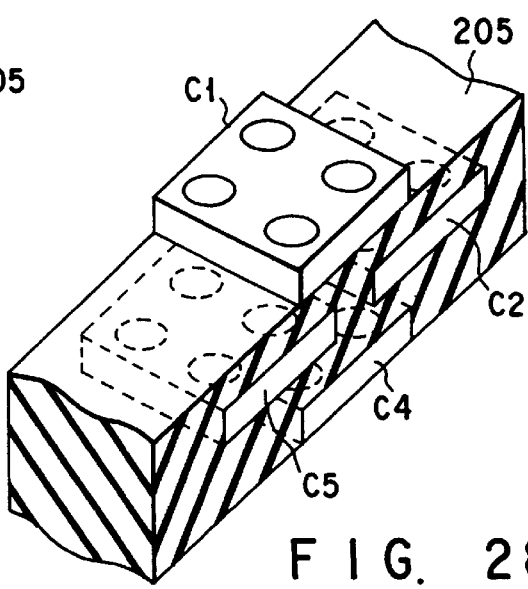
FIG. 28 is a perspective view showing a quantum effect device which is a thirteenth embodiment of the invention.

FIG. 28 is a perspective view showing a quantum effect device which is the thirteenth embodiment of the invention. The thirteenth embodiment is a modification of the twelfth embodiment (FIG. 27). It differs in that a fourth 4-quantum dot cell C4 is provided on an insulating layer which covers the lower surface of the dot cells C2 and C3.

Fourteenth Embodiment

Figure 29:
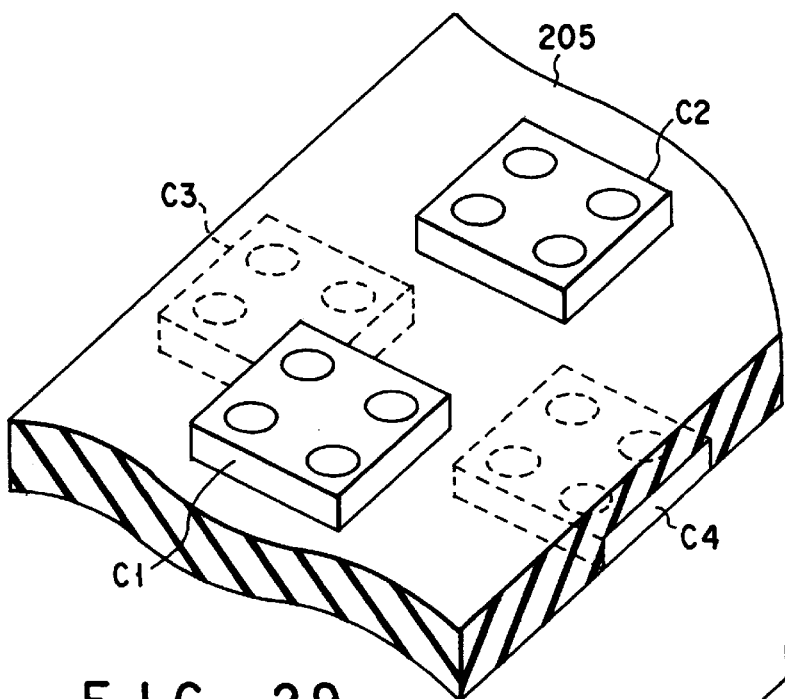
FIG. 29 is a perspective view showing a quantum effect device which is a fourteenth embodiment of this invention.

FIG. 29 is a perspective view showing a quantum effect device which is the fourteenth embodiment of this invention. The fourteenth embodiment has four 4-quantum dot cells C1 to C4. It is a three-dimensional version of the loop structure of the first embodiment. The cells C1 and C2 are arranged in one plane, and the cells C3 and C4 in another plane. Therefore, the coupling of any two adjacent cells is strengthened.

Fifteenth Embodiment

Figure 30:
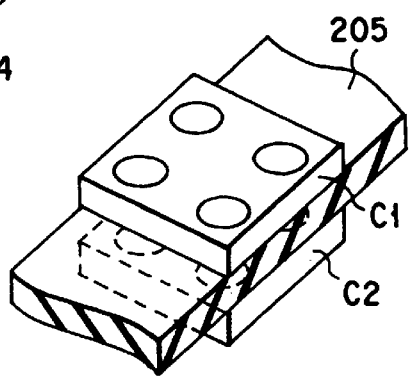
FIG. 30 is a perspective view showing a quantum effect device which is a fifteenth embodiment of the present invention.

FIG. 30 is a perspective view showing the quantum effect device which is a fifteenth embodiment of the present invention.

The fifteenth embodiment comprises two 4-quantum dot cells C1 and C2 and an insulating layer 205. It is characterized in that the second cell C2 is located right above the first cell C1, with the insulating layer 205 interposed between the cells C1 and C2. The quantum dot cells C1 and C2 are thereby arranged in a 3-dimensional pattern. The fifteenth embodiment is more advantageous than the twelfth to fourteen embodiments. It can stably operate when the cells C1 and C2 are in a state more excited by 3 states than the ground state. It can therefore perform a QIC operation and, hence, can be used even at room temperature (301K).

Sixteenth Embodiment

FIG. 45 is a perspective view showing the quantum effect device which is the sixteenth embodiment of the invention.

This embodiment has a 3-dimensional structure of an inverter circuit. It comprises four 4-quantum dot cells C1 to C4 and one semiconductor layer 5. The cells C1 and C3 are mounted on the upper surface of the layer 5. The cells C2 and C4 are provided on the lower surface of the layer 5 and vertically aligned with the cells C1 and C3, respectively. The semiconductor layer 5 has a larger band gap than an insulating layer or the layers forming each cell. The sixteenth embodiment can perform a stable QIC operation while the cells C1 to C4 stay in the ground state, and can therefore operate even at room temperature (301K).

As described above, the twelfth to sixteenth embodiments have quantum cells arranged in a 3-dimensional pattern. Owing to the 3-dimensional pattern of quantum cells, these embodiments can be made small, can have the output cell located in either the upper or lower surface, and can therefore serve as multi-function circuits. Were the quantum cells arranged in the same plane, that is, in a 2-dimensional pattern, the output cell should be provided in the upper surface only, inevitably reducing the freedom of design.

FIG. 44 is a schematic representation of a quantum effect information control system, in which information is exchanged among addresses A, B and C by using the ballistic electrons present in a 2-dimensional electron gas (2DEG). The addresses A, B and C are terminals or processors.

In FIG. 44, the triangles indicate the regions where the paths of ballistic electrons intersect with one another in the same plane, the diamonds represent the regions where the paths of ballistic electrons branch, and the rectangles show the region where the ballistic electrons collide with one another.

The quantum effect information control system is free of capacitative delay, unlike information control systems which have metal wires. This is because the system utilizes the ballistic electrons existing in the 2DEG to control information.

The inventors hereof, however, think that this quantum effect device has but insufficient freedom of design, if the device is to be put to practical use. They have invented a quantum effect device which has greater freedom of design and which can function as an information control system. The inventors' quantum effect device comprises: a plurality of quantum artificial molecules; quantum wires for transferring information by virtue of physical interaction between the adjacent quantum artificial molecules; information transfer control means for impinging ballistic electrons onto the quantum wires, thereby to change the states of the quantum wires and to control the information being transferred through the quantum wires; and detector means for detecting the states of the quantum wires which have been changed by impinging the ballistic electrons onto the quantum wires.

In the quantum effect device according to this invention, information can be controlled by impinging ballistic electrons onto the quantum wires. This use of ballistic electrons accomplishes the control of information being transferred through quantum wires, which has hitherto been impossible.

As a result, the quantum wires have high freedom of design and are very feasible.

Seventeenth Embodiment

FIG. 33 is a schematic representation of a quantum effect device (a quantum wire) which is the seventeenth embodiment of the invention.

A 2DEG region 301 is provided at a semiconductor hetero junction such as GaAs/AlGaAs or Si/SiGe. The 2DEG region 301, except for the cross-shaped area, is used as a transfer space in which ballistic electrons having prominent particle property move at high speed along paths indicated by solid lines.

Nine quantum artificial molecules 303 are arranged close to one another in the center of the 2DEG region 301, forming a cross-shaped area. Each of the quantum artificial molecules 303 is a 5-quantum dot cell having five quantum artificial atoms 302. The quantum artificial atoms 302 are quantum boxes. Two of the five quantum boxes (two black dots) of each molecule 302 contain one electron each, and the remaining three quantum boxes (three white dots) thereof contain no electron. The two electrons assume positions by virtue of tunnel effect so that the molecule 302 assumes one of two stable states. Information is transferred among the quantum artificial molecules 303 by virtue of state transition which is achieved not by moving electrons, but by the Coulomb interaction of electrons.

As shown in FIG. 33, the quantum effect device comprises five electron emitters $E_1$ to $E_5$ (information transfer control means) for emitting ballistic electrons, and four electron receivers $R_1$ to $E_4$ (detector means) for receiving the ballistic electrons.

In operation, the ballistic electrons emitted from the electron emitters $E_1$ to $E_5$ collide with the quantum artificial molecules 303, changing the states of the molecules 303. Any molecule 303 whose state is thereby changed alters the state of the adjacent molecule 303. Thus, the states of all quantum artificial molecules 303 are changed in a chain reaction. The state of the molecule 303, which is located at one of the four tips of the cross-shaped area and which is used as an output molecule, is detected in the form of a change in the path of a ballistic electron which has resulted from the Coulomb interaction between the ballistic electron and a quantum artificial atom 302 in the molecule 303.

To explain more specifically, a ballistic electron emitted from, for example, the electron emitter $E_4$ collides with a quantum artificial atom 302 in an input molecule 303 (the lowest one in FIG. 33), changing the state of the input molecule 303. The state of the second molecule immediately above the input molecule 302 is changed, then the state of the third molecule located above the second is changed, and so forth. Finally, the uppermost molecule 303, i.e., an output molecule, has its state changed. The change in the state of the output molecule 303 is detected in the form of a change in the path of a ballistic electron emitted from the electron emitter $E_1$, which has resulted from the Coulomb interaction between the ballistic electron and a quantum artificial atom 302 in the output molecule 303.

If the state of the output molecule 303 remain unchanged, the path of the ballistic electron emitted from the electron emitter $E_1$ does not change, and the ballistic electron reaches the electron receiver $R_1$. If the state of the output molecule 303 has changed, the path of the ballistic electron changes, and the ballistic electron reaches the electron receiver $R_2$. Whether the path of the ballistic electron has changed or not is determined in accordance with which electron receiver, the receiver $R_1$ or the receiver $R_2$, detects that ballistic electron.

Figure 34:
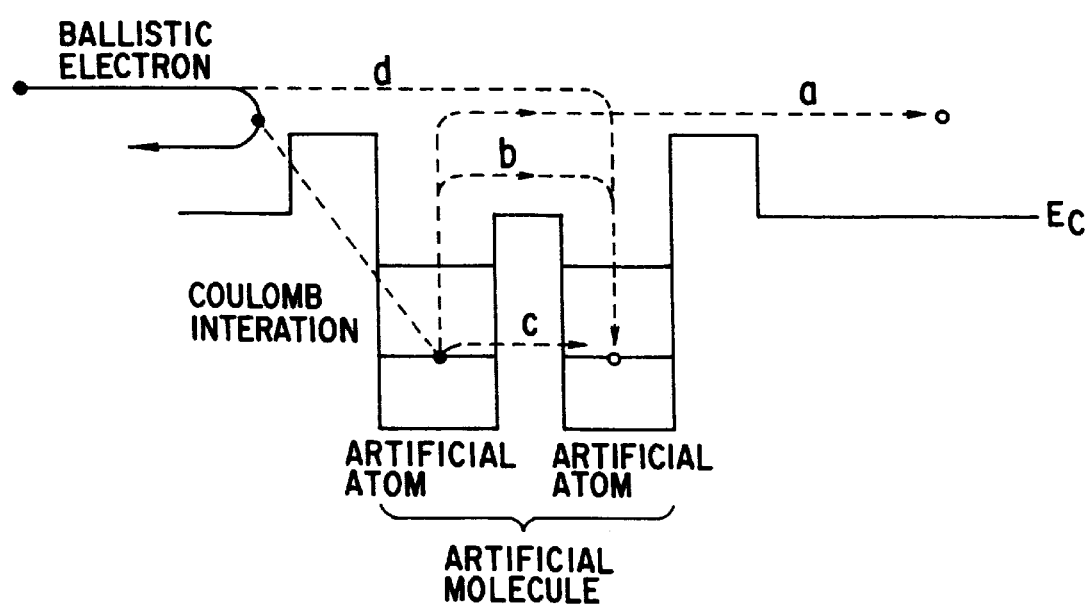
FIG. 34 is a diagram explaining how a ballistic electron and an artificial molecule collide in various manners.

How a ballistic electron collides with an artificial molecule 303 will now be explained, with reference to FIG. 34. As FIG. 34 shows, a ballistic electron may collide with a molecule in various fashion, such as ionization, excited shift, tunnel shift, and trapping.

In the case of ionization, the electrons in the molecule 303 acquire sufficient energy due to the Coulomb interaction between them and the ballistic electron, and will no longer be held within the molecule 303. In excited shift, the electrons in the molecule 303 attains energy by virtue of the Coulomb interaction between them and the ballistic electron. The energy the electrons attains is not so sufficient they acquire in ionization, but is so great that they will assume ground state again and then move into the next quantum artificial molecule 303. In tunnel shift, the electrons move within the molecule 303 due to tunnel effect. In the case of trapping, a ballistic electron is trapped in a quantum artificial molecule 303 and is eventually annihilated.

In the seventeenth embodiment (FIG. 33), any ballistic electron can be used as an input signal and an output signal.

Hitherto, quantum boxes have been formed by techniques of manufacturing semiconductor devices, such as photolithography, wet etching, dry etching and the like. With these techniques, however, it is impossible to provide quantum boxes with high size precision or quantum boxes having a few crystal defects.

The present inventors have invented a method of manufacturing a semiconductor device which comprises the steps of: forming a first semiconductor film made of semiconductor material of a first type on a substrate; forming a surface-terminating layer on the first semiconductor film; removing a part of the surface-terminating layer, thereby exposing a part of the first semiconductor film; forming a drop of semiconductor material of a second type on the exposed part of the first semiconductor film; growing columnar semiconductor crystals of semiconductor material of a third type by using the drop as a seed; and forming a second semiconductor film made of the semiconductor material of the first type and covering the columnar semiconductor crystals.

The inventors' method does not include techniques of manufacturing semiconductor devices, such as photolithography, wet etching, dry etching and the like. Rather, the method includes a step of growing semiconductor crystals. The method according to the present invention can therefore form quantum boxes with high size precision, which have but only a few crystal defects.

Eighteenth Embodiment

FIGS. 35A to 35E are sectional views for explaining the method of manufacturing a quantum box which is an eighteenth embodiment of the invention.

Figure 35A:
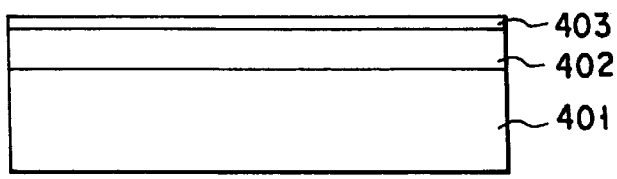
FIGS. 35A to 35E are sectional views for explaining a method of manufacturing a quantum box which is an eighteenth embodiment of the invention.

As FIG. 35A shows, an $Al_{0.7}Ga_{0.3}As$ film (first semiconductor film) 402 is formed on a GaAs substrate 401 having a major (001) surface, by means of molecular beam epitaxy (MBE). Then, the shutter of a solid sulfur (S) source is opened, thereby forming a sulfur layer 403 (surface-terminating layer) having a thickness of one atom on the $Al_{0.7}Ga_{0.3}As$ film 402. The shutter of the solid sulfur source is closed when the sulfur layer 403 changes from crystal structure (c(4×4)) to another crystal structure (2×2) 1). The surface of the $Al_{0.7}Ga_{0.3}As$ film 402 is thereby terminated with the sulfur layer 403. In other words, the arsenic atoms in the surface of the film 402 are replaced by sulfur atoms.

Figure 35B:
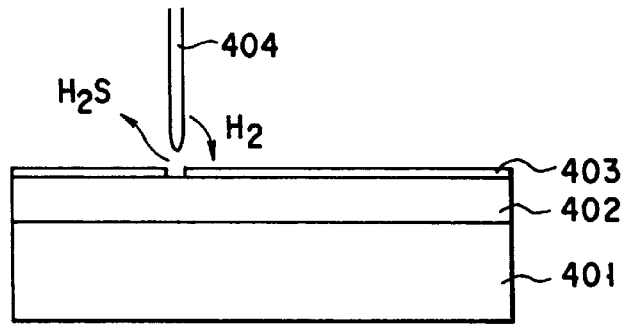

Next, as shown in FIG. 35B, a −3V pulse having a width of 50 ms is supplied to the platinum stylus 404 of a scanning tunnel microscope (STM) in an H2 atmosphere of $10^{-3}$ Pa. One sulfur atom in the surface of the $Al_{0.7}Ga_{0.3}As$ film 402 reacts with the pulse, leaving the sulfur layer 403 in the form of a component of $H_2S$. $H_2$ dissociated from the sulfur atom (S) is adsorbed to the surface of the platinum stylus 404, generating hydrogen atoms (H). The hydrogen atoms (H) are released from the stylus 404 as a pulse is applied to the stylus 404, and eventually collide with the sulfur atoms in the surface of the $Al_{0.7}Ga_{0.3}AS$ film 402. The platinum stylus 404 is repeatedly moved. Every time the stylus 404 is moved, a pulse is applied to the stylus 404, whereby a sulfur atom (S) leaves the sulfur layer 403 in the form of a component of $H_2S$. As a result, windows having a desired size are formed in the sulfur layer 404.

Figure 35C:
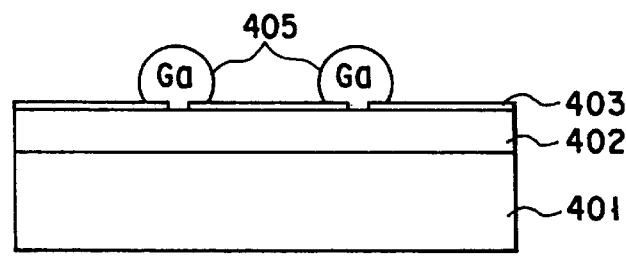

Thereafter, gallium (Ga) is vapor-deposited at 550° C. by means of MBE on the sulfur layer 403. However, gallium does not adhere to the sulfur layer 403 (i.e., the surface-terminating layer). Rather, it is adsorbed in the windows made in the sulfur layer 403. Germanium is further deposited, forming gallium droplets 405 (semiconductor droplets) grow at the windows, as shown in FIG. 35C.

Figure 35D:
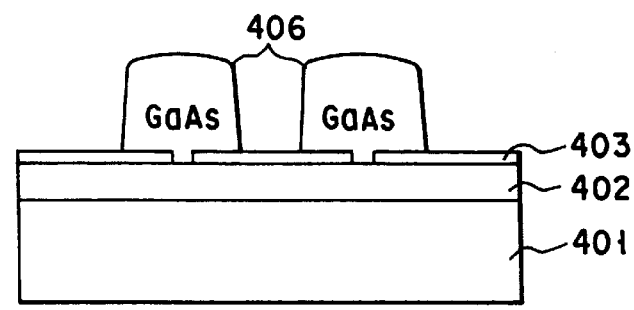

Then, the shutter of an arsenic (As) source is opened, applying arsenic onto the upper surface of the unfinished product. Arsenic is absorbed into the gallium droplets 405, whereby columnar GaAs crystals 406 grow as illustrated in FIG. 35D. The temperature is raised to 650° C., while keeping the shutter of the arsenic source, thereby evaporating the exposed portions of the sulfur layer 403.

Figure 35E:
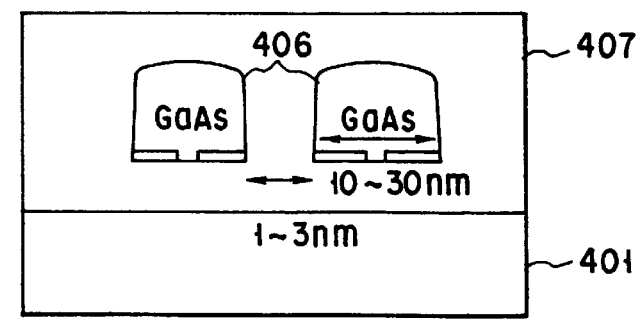

Finally, as shown in FIG. 35E, an $Al_{0.7}Ga_{0.3}As$ film 407 (second semiconductor film) is made to grow, covering the upper surface of the unfinished product. A GaAs quantum box is thereby formed.

In the method of manufacturing the quantum box, i.e., the eighteenth embodiment of the invention, the windows made in the sulfur layer 403 must be larger than a critical nucleus of gallium. Otherwise, the gallium droplets 405 would not grow at all. The term "critical nucleus" is the size which a nucleus has when it acquires maximum free energy, as illustrated in FIG. 36.

The size of the critical nucleus is given as:

$$2\sigma Tv/L(Tv-T)$$

where σ is surface energy, Tv is boiling point, L is latent heat associated with evaporation, and T is the temperature of the substrate.

When the above formula is applied, the size of the critical nucleus is found to be 0.3 nm. Experiments which the inventors conducted teaches that the windows should be at least about 1×1 nm in consideration of the slight diffusion of sulfur (S). The size of the GaAs quantum boxes and the distance among the boxes can be controlled in units of 0.1 nm by changing the amount of gallium evaporated and the distances among the windows made in the sulfur layer (surface-terminating layer).

Preferably, each GaAs quantum box has a size ranging from 10 nm to 30 nm so as to confine an electron in 0-dimensional fashion. It is desirable that the GaAs quantum boxes be spaced apart by a distance of 1 to 3 nm, so that the tunneling of an electron may easily be accomplished.

As indicated above, sulfur (S) is used to deactivate the surface of the film 402. Instead, selenium (Se) may be applied for the same purpose. It is desirable that the transmission band and valence-electron band of a compound semiconductor crystal (i.e., a quantum box) have a lower energy level with respect to electrons than the barrier semiconductor layers surrounding the crystal. For example, an $Al_{0.48}In_{0.52}As$ layer may be used as a barrier layer for an InP quantum box.

The quantum box according to the eighteenth embodiment of the invention can be manufactured by means of crystal growth, not by the conventional method including photolithography, wet etching, dry etching and the like. The quantum box, thus manufactured, can have high size precision and has but a few crystal defects. The quantum box can therefore confine an electron in 0-dimensional fashion and exhibit tunneling property even when applied with an infinitesimal potential.

Microtechnology for manufacturing ULSIs is advanced in an effort to increase the integration density of ICs. As the elements of an IC are increasingly miniaturized, quantum effect will be more useful. In a region where very tiny elements are arranged, electrons exhibit prominent wave property.

The present inventors are of the opinion that the prominent wave property of electron results in various problems in a logic device which uses electron currents to transfer information. Namely, the logic device operates but unstably or makes errors. The logic device consumes much power and generates much heat, particularly when it has many elements arranged densely. Further, the wires connecting the elements to one another occupy a considerably large space, inevitably reducing the integration density of the logic device.

Accordingly, the inventors have invented a rotary logic device which comprises a plurality of rotary units including an input rotary unit and an output rotary unit. Each rotary unit consists of a diplole made up of two electric charges of different types or two magnetic poles of different types, which are spaced apart by a predetermined distance. The dipole of each rotary unit rotates due to the interaction between it and the dipole of an adjacent rotary unit, in terms electric charge or magnetic pole. When it rotates, the dipole changes the polarization direction of the rotary unit.

In the rotary logic device, the polarization direction of the dipole of each rotary unit is changed to transfer information; information is transferred without using electron currents. To be more specific, the electric charge of the dipole of the input rotary unit (hereinafter called "input dipole") is made to interact with an external charge, or the magnetic poles of the input dipole are made to interact with external magnetic poles, thereby fixing the polarization direction of the input dipole. Until the polarization direction is thus fixed, the input dipole keeps rotating.

When the polarization direction of the input dipole is fixed, the dipole of the other rotary unit adjacent to the input dipole has its polarization direction fixed and stops rotating. When the polarization direction of the dipole of the other rotary unit is fixed, the dipole of the still other rotary unit adjacent to that other rotary unit has its polarization direction fixed and stops rotating. Further, the dipoles of the remaining rotary units have their polarization directions fixed and stop rotating, in the manner of a chain reaction. As a result of this, information is transferred from the input rotary unit to the output rotary unit.

Nineteenth Embodiment

FIG. 38 is a diagrammatic representation of a rotary logic device (an information transfer path) which is the nineteenth embodiment of the invention. As shown in FIG. 38, the rotary logic device has two rotary units B1 and B2 which function as the input unit and the output unit, respectively. Each rotary unit may be either the cross-shaped one shown in FIG. 37A or the T-shaped one shown in FIG. 37B.

As shown in FIGS. 37A and 37B, each type of rotary unit comprises one or two supports 501 made of silicon or the like, a vertical member 502 supported by the support or supports 501, a rotary member 503 (a dipole) connected to the vertical member 502, and one or two metal spheres 504 connecting the lower end of the member 502 or the lower and upper ends thereof to the support or supports 501. The rotary member 503 is positively charged at one end and negatively charged at the other end. The member 503 can rotate in a plane perpendicular to the vertical member 502. The metal sphere or spheres 504 are made of gold (Au) or the like to which high-molecular material is attached by means of selective chemical adsorption. Alternatively, the metal sphere or spheres 504 may be formed by micro mechanical technology, or may be replaced by a sphere or spheres of liquid crystal which is a material having orientation property.

As FIG. 38 shows, the rotary logic device further comprises a charge-applying member A and a polarity-detecting member Q. The member A applies an external charge to the input rotary unit B1, and the member Q detects the polarity of the right end of the output rotary unit B2. The rotary units B1 and B2 are spaced apart from each other. The electric charge which the member A applies to the rotary unit B1 is greater than the charge applied on the rotary member 503 of the input rotary unit B1. The input rotary unit B1 is thereby prevented from making errors or operating unstably, despite the Coulomb interaction between it and the output rotary unit B2.

The operation of the rotary logic device shown in FIG. 38 will be explained below.

If the electric charge which the member A applies to the rotary unit B1 is positive, the rotary member 503 of the rotary unit B1 keeps on rotating until the unit B1 assumes a stable state by virtue of the Coulomb interaction between the units B1 and B2. That is, the member 503 of the unit B1 continues to rotate until its negatively charged end is fixed at the charge-applying member A. Meanwhile, the rotary member 503 of the rotary unit B2 rotates as its counterpart of the rotary unit B1 rotates. When the rotary member 503 of the unit B1 is fixed, the negatively charged end of the unit B2 is fixed at the positively charged end of the unit B1. The positively charged end of the rotary member 503 of the unit B2 is fixed at the polarity-detecting member Q.

In this case, the polarity applied by the charge-applying member A is identical to the polarity the polarity-detecting member Q detects. Hence, the rotary logic device comprising the rotary units B1 and B2 functions as an information transfer path which corresponds to a conventional wire. Since the polarization direction of the rotary member 503 of the unit B1 is transmitted to the rotary member 503 of the unit B2 because of the Coulomb interaction between the units B1 and B2, no current needs to flow to transmit information. The rotary logic device consumes but a very little power and generates but a very small amount of heat.

The following Table 4 shows the input-output relationship of the rotary logic device shown in FIG. 38, i.e., the relationship between the polarity of the charge the member A applies on the rotary unit B1 and the polarity of the charge the member Q detects:

TABLE 4

| Input polarity A | Output polarity Q |
| --- | --- |
| Negative (−) | Negative (−) |
| Positive (+) | Positive (+) |

Figure 17:
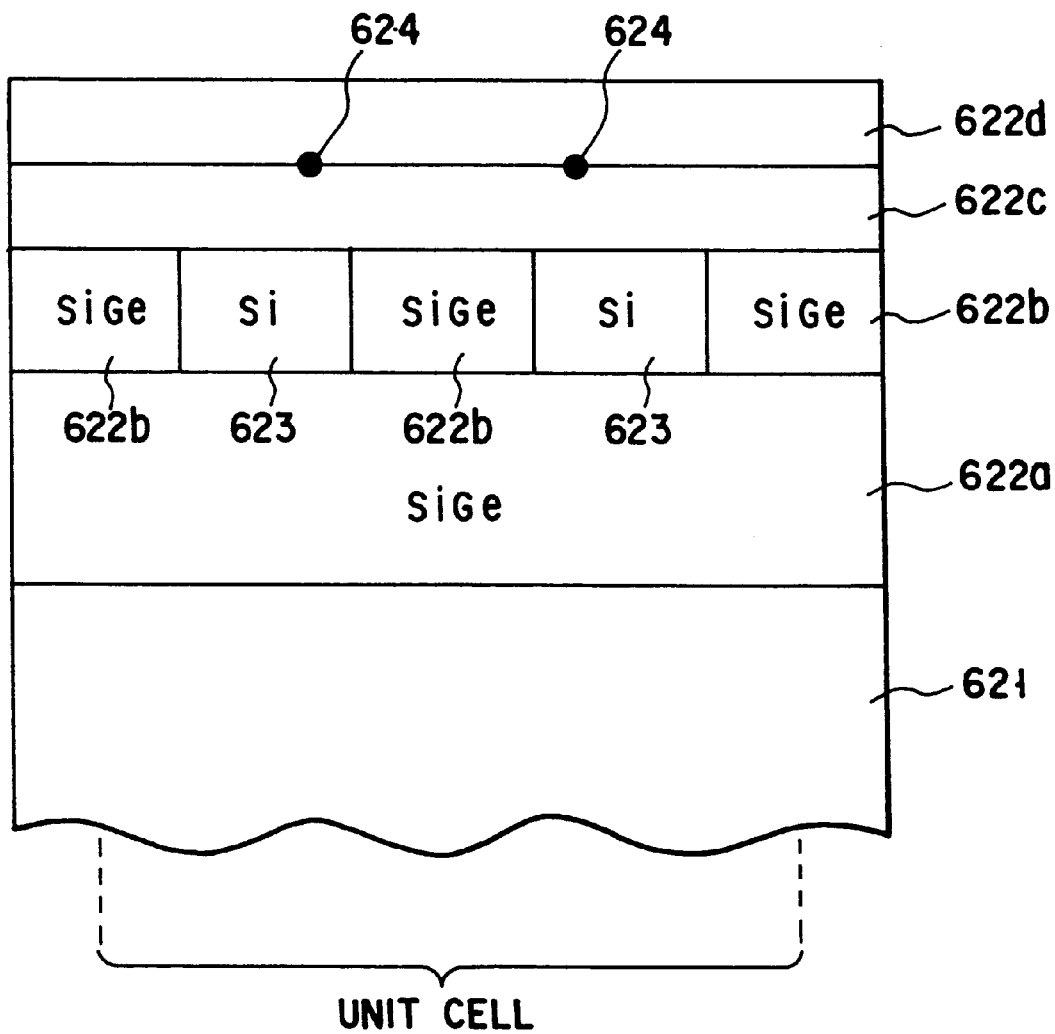
FIG. 17 is a sectional view showing a quantum effect device which is a twentieth embodiment of the invention.

Twentieth Embodiment FIG. 17 is a sectional view sketching a quantum effect device which is the twentieth embodiment of the present invention.

As can be understood from FIG. 17, this quantum effect device has a modulation-doped structure which comprises a semiconductor substrate and an Si—Ge semiconductor layer provided on the substrate. The method of manufacturing this device will be explained below.

First, an $Si_xGe_{1-x}$ layer 622a which will function as a barrier layer against electrons is formed on an Si substrate 621, and a $Si_xGe_{1-x}$ layer 622b which will function as a barrier layer against electrons, too, is formed on the layer 622a. The part 623 of the layer 622b is etched away, forming an annular recesses. Silicon is filled in this recess, forming an Si quantum boxes 623. Next, an $Si_xGe_{1-x}$ layer 622c, which will function as a barrier layer, is formed on the barrier layer 622b and the Si quantum box 623. Two donor ions 624 are implanted into the $Si_xGe_{1-x}$ layer 622c by means of planar doping. Then, an $Si_xGe_{1-x}$ layer 622d is formed on the $Si_xGe_{1-x}$ layer 622c. A unit cell is thereby manufactured.

Having this specific structure, the quantum box 623 can be formed by an epitaxial growth technique such as MBE or CVD. MBE (Molecular Beam Epitaxy) using a gas source is particularly preferred since it can provide an abrupt SiGe heterojunction. The quantum box 623 is therefore of high quality.

To relax the lattice mismatch between the Si substrate 621 and the $Si_xGe_{1-x}$ layer 622a, the layer 622a has been made comparatively thick. The $Si_xGe_{1-x}$ layer 622a may be formed by epitaxial growth, in which case, as well, the layer 622a should be made thick for the same reason.

Since the $Si_xGe_{1-x}$ layer 622a is thick, it does not warp at all. Nor do the $Si_xGe_{1-x}$ layers 622b and 622c which are formed on the layer 622a. Provided in the space defined by the layers 622a, 622b and 622c, the Si quantum box 623 has tensile stress. The conduction band of Si is at an energy level lower than that of $Si_xGe_{1-x}$. Electrons are thereby effectively confined in the Si quantum box 623. At this time, the Si-$Si_xGe_{1-x}$ system makes a so-called type II super lattice. The top of the valence band is separated from the bottom of the conduction band, rendering it difficult for electrons and holes to recombine. This is why the quantum effect device can stably operate for a long period of time.

The composition ratio (x) of Si in the $Si_xGe_{1-x}$ layers may take various values. Nevertheless, it is desirable that the $Si_xGe_{1-x}$ layer contacting the Si quantum box 623 have a smaller Si composition ratio (x) than the $Si_xGe_{1-x}$ layer which contacts the Si substrate 621. This measure taken, an appropriate compression stress is applied to the $Si_xGe_{1-x}$ layer which contacts the Si quantum box 623. As a result of this, the conduction band of the $Si_xGe_{1-x}$ layer contacting the quantum box 623 shifts to the high-energy side, its discontinuity increases. The quantum box 623 can thereby confine electrons more firmly than otherwise.

Twenty-first Embodiment

Figure 40:
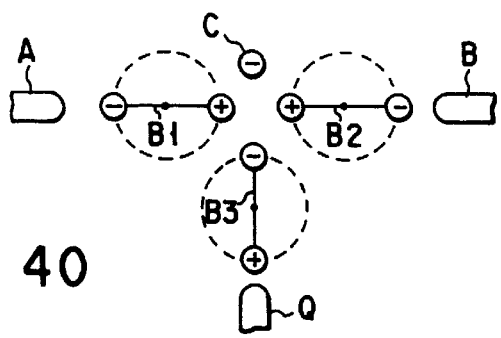
FIG. 40 schematically shows a rotary logic device (an AND gate) which is a twenty-first embodiment of the present invention.

FIG. 40 schematically shows a rotary logic device (an AND gate) which is the twenty-first embodiment of the invention. The truth Table 5 presented below shows the input-output relationship of the rotary logic device according to the twenty-first embodiment:

TABLE 5

| Input polarity A | Input polarity B | Output polarity Q |
| --- | --- | --- |
| Negative (−) | Negative (−) | Negative (−) |
| Negative (−) | Positive (+) | Negative (−) |
| Positive (+) | Negative (−) | Negative (−) |
| Positive (+) | Positive (+) | Positive (+) |

As shown in FIG. 40, this rotary logic device comprises three rotary units B1, B2 and B3, two charge-applying members A and B, and one polarity-detecting member Q. The rotary units B1 and B2 are input units, and the rotary unit B3 is the output unit. A negative fixed charge C (a bias charge) is applied between the input rotary units B1 and B2. The rotary members of both input units B1 and B2 continue to rotate in accordance with the polarities of charges applied by the members A and B, by virtue of the Coulomb interaction among the rotary units B1, B2 and B3, until the units B1 and B2 assume a stable state. The rotary member of the output unit B3 rotates due to the Coulomb interaction among the units B1 and B2 and the fixed negative charge C until the unit B3 takes a stable state. The polarity-detecting member Q detects a positive polarity only when the charges applied by the members A and B are of positive polarity.

Hence, when the positive charge and the negative charge are made to correspond to logic "1" and logic "0," respectively, the rotary logic device functions as an AND gate.

Twenty-second Embodiment

Figure 41:
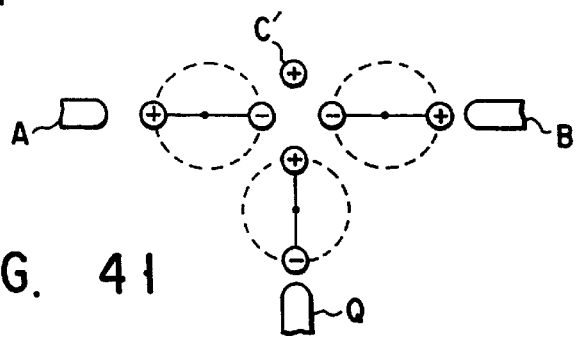
FIG. 41 schematically shows a rotary logic device (an OR gate) which is a twenty-second embodiment of this invention.
Figure 42A:
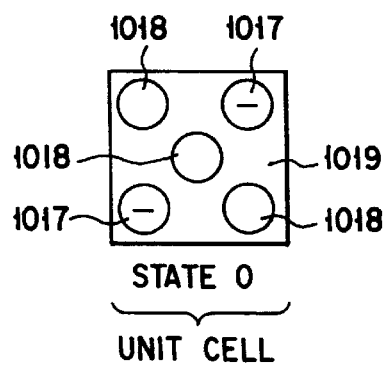
FIGS. 42A and 42B are diagrams illustrating the two alternative states a conventional 5-quantum dot cell may assume.
Figure 42B:
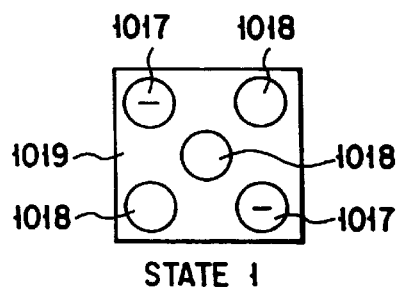
Figure 43:
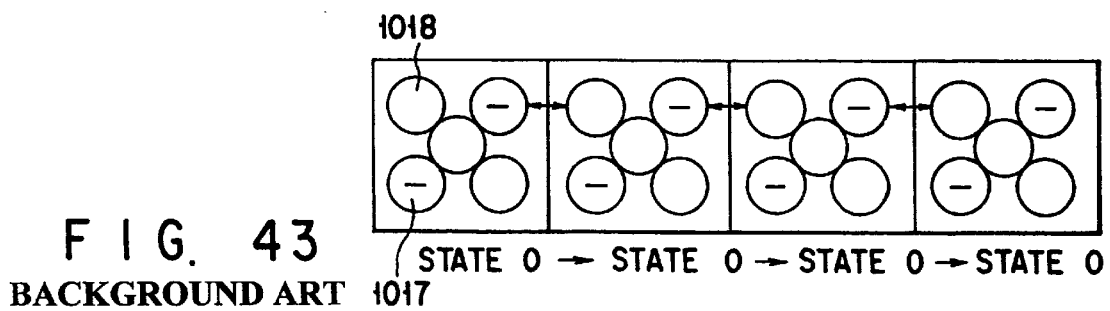
FIG. 43 shows a conventional quantum wire made up of conventional 5-quantum dot cell.

FIG. 41 schematically shows a rotary logic device (an OR gate) which is the twenty-second embodiment of this invention. The truth Table 6 presented below shows the input-output relationship of the rotary logic device according to the twenty-first embodiment:

TABLE 6

| Input polarity A | Input polarity B | Output polarity Q |
| --- | --- | --- |
| Negative (−) | Negative (−) | Negative (−) |
| Negative (−) | Positive (+) | Positive (+) |
| Positive (+) | Negative (−) | Positive (+) |
| Positive (+) | Positive (+) | Positive (+) |

The twenty-second embodiment differs from the twenty-first embodiment (FIG. 40) in that a positive fixed charge C' is applied instead of a negative fixed charge C. The polarity-detecting member Q detects a negative polarity only when the charges applied by the members A and B are of negative polarity. Hence, when the positive charge and the negative charge are made to correspond to logic "1" and logic "0," respectively, the rotary logic device functions as an OR gate.

The nineteenth embodiment (information transfer path), the twentieth embodiment (inverter), the twenty-first embodiment (AND gate), and the twenty-second embodiment (OR gate) may be used in various possible combinations, thereby constituting rotary logic devices which perform logic operations in the same say as the logic circuits comprising ordinary semiconductor elements such as MOSFETS. Such rotary logic devices are of course superior to the conventional rotary logic devices in terms of power consumption and heat generation.

The rotary logic devices according to the nineteenth to twenty-second embodiments operate by virtue of Coulomb interaction achieved in accordance with the changes in the charge polarities of the constituent rotary units. Nonetheless, these rotary logic devices can operate as well, by virtue of magnetic interaction based on the changes in the magnetic polarities of the rotary units.

In the nineteenth to twenty-second embodiments, there may be used a cross-shaped rotary unit and the T-shaped rotary unit, both to be later described in conjunction with the twenty-ninth embodiment.

Twenty-third Embodiment

FIG. 46 is a schematic representation of a cell-connected, signal guiding device which is the twenty-third embodiment of the invention.

As shown in FIG. 46, the signal guiding device comprises six quantum dot cells C1 to C6. The cell C1 is the input cell, and the cell C3 is the output cell. Provided between the input cell C1 and the output cell C2 are two loop structures continuous to each other. The first loop structure consists of the quantum dot cells C1, C2, C4 and C5. The second loop structure is comprised of the quantum dot cells C2, C3, C5 and C6.

Figure 48:
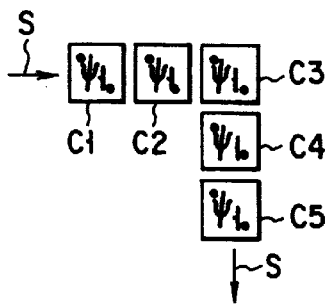
FIG. 48 is a diagrammatic illustration of a bent-back wire.

Unlike in the bent-back wire shown in FIG. 48 and described above, none of the quantum dot cells C1 to C6 assumes an unstable state. A signal S, first transferred to the 3 o'clock direction, changes its course to the 6 o'clock direction, while maintaining the information, as it passes through the quantum dot cells C1, C2, C3, C4 and C5. Owing to the two loop structures continuous to each other, the cell-connected, signal guiding device can change the direction of transferring information, without altering the information.

The ground state the cells C4 and C2 assume differs from the ground state the input cell C1. It follows that the signal guiding device can be used as a cell-connected inverter, merely by using the cells C4 and C6 as output quantum dot cells. The cells C1 to C6 may be of any type of the quantum dot cells described above. (This also applies to the embodiments to be described hereinafter). If the quantum dot cell C1 assumes the ground state $\Psi_1$, all other quantum dot cells will take such states as are shown in FIG. 39.

Twenty-fourth Embodiment

FIG. 47 is a schematic representation of a cell-connected, signal branching device which is the twenty-fourth embodiment of this invention.

As is shown in FIG. 47, the signal branching device comprises 17 quantum dot cells C1 to C17. Of these cells, the cell C1 is used as the input quantum dot cell, and the cells C10, C11 and C12 as output quantum dot cells.

Provided between the input cell C1 and the first output cell C10 are two loop structures continuous to each other. The first loop structure consists of the cells C3 to C6. The second loop structure consists of the cells C6 to C9. Further, provided between the input cell C1 and the second output cell C12 are the first loop structure (C3–C6) and the third loop structure consisting of the cells C13 to C16 and located near the first loop structure (C3–C6). The first loop structure (C3–C6) is provided between the input cell C1 and the third output cell C11.

Figure 49:
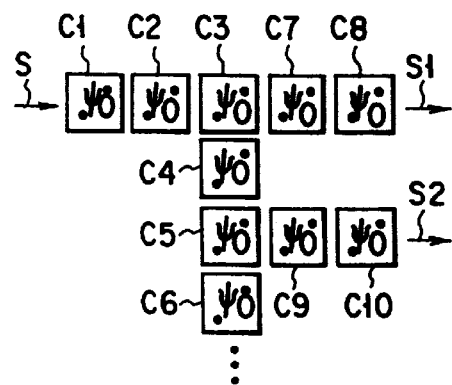
FIG. 49 is a diagrammatic representation of a multi fan-out branched wire.

Unlike in the multi fan-out branched wire shown in FIG. 49 and described above, none of the quantum dot cells C1 to C17 assumes an unstable state. A signal S can therefore be branched into three signals $S_1$, $S_2$ and $S_3$, each maintaining both the information and the transfer direction (i.e., the 3 o'clock direction). The signals $S_1$, $S_2$ and $S_3$ are output from the quantum dot cells C10, C11 and C12, respectively.

The quantum dot cells C7 and C13 may be used as output cells. If this is the case, the input signal S can be branched into two signals which propagate in the direction (i.e., the 9 o'clock direction) opposite to the direction (i.e., the 3 o'clock direction) in which the signal S has been input. Alternatively, the cells C7, C10, C11, C12 and C13 may be used as input quantum dot cells, so that the input signal S may be branched into five signals. If the quantum dot cell C1 assumes the ground state $\Psi_1$, all other quantum dot cells will take such states as are shown in FIG. 21.

Quantum cells, such as 5-quantum dot cells, are extremely small, each about 0.12 $\mu$m×0.12 $\mu$m. The quantum dots contained in one cell are even smaller, having a diameter of about 50 nm. They are spaced by an infinitesimal distance of about 20 nm. Signals cannot be input to an input quantum cell through a metal electrode. A great number of electrons present in the metal electrode, not the signal electrode, would alter the state of the few electrons (usually, two electrons) in the input quantum cell. In other words, a Schottky junction would be formed between the metal electrode and the input quantum cell, which greatly changes the band structure of the input quantum cell. Consequently, the bistable state of the quantum cell would be destroyed.

In view of this, the inventors hereof invented a quantum effect device which comprises a plurality of cells, including a cell for receiving an input and a cell for supplying an output. Each quantum cell takes one of two recognizable states in accordance with the electromagnetic interaction between it and adjacent quantum cells. The device further comprises an input semiconductor electrode which is shaped like a wire, located at the input quantum cell and electrically isolated from all quantum cells.

Made of semiconductor material and shaped like a wire, the input electrode contains but far less electrons than the conventional metal electrode. The electrons in the input electrode are too small in number to change the state of the input quantum cell. Therefore, a signal can be reliably supplied to the input quantum cell.

Twenty-fifth Embodiment

FIG. 50 shows the input section of a quantum effect device which is the twenty-fifth embodiment of the present invention.

This quantum effect device comprises a number of quantum dot cells and two input quantum wires 701 and 702. The quantum dot cells constitute a device system. only the first two of the quantum dot cells are shown in FIG. 50, namely two input quantum dot cells $C1_{in}$ and $C2_{in}$. The quantum wires 701 and 702 are arranged in the vicinity of the quantum dot cell $C1_{in}$, electrically insulated from the device system including the cells $C1_{in}$ and $C2_{in}$.

Both input quantum wires 701 and 702 are made of the same semiconductor material as the quantum dots of the quantum dot cell $C1_{in}$ or a semiconductor material having an energy gap similar to that of the quantum dots. For example, the quantum wires 701 and 702 are made of GaAs having a high impurity concentration in the case where the quantum dots of the cell $C1_{in}$ are made of GaAs and surrounded by a layer made of AlGaAs. The tips of the quantum wires 701 and 702 have a size similar to that of the quantum dots of the cell $C1_n$. The quantum wires 701 and 702 are aligned with the upper quantum dots of the cell $C1_n$ and with the lower quantum dots thereof, respectively.

The input quantum wires 701 and 702 are connected by the positive and negative terminals of an external power supply 700 by two thin metal electrodes (not shown), respectively. These metal electrodes are positioned remote from the the input cell $C1_n$, so as not to change the state of the cell $C1_n$. The thin electrodes are made of a metal (e.g., Au) which can form ohmic contacts with the input quantum wires 701 and 702.

The state of the quantum dot cell $C1_n$ is controlled by the electric field generated by the input quantum wires 701 and 702. In the magnetic field, the potential gradually decreases from the wire 701 toward the wire 702. The quantum dot cell $C1_n$ therefore assumes a ground state wherein two electrons are contained in the upper-left quantum dot and the lower-right quantum dot.

The input quantum wires 701 and 702 contains only a few electrons, not so many electrons as metal wires. The electrons in either input quantum wire do not influence the quantum dot cell $C1_n$. In other words, since no metal electrodes are used, no Schottky junction is formed between the input quantum wires 701 and 702, on the one hand, and the quantum dot cell $C1_{in}$, on the other. The state of the quantum dot cell $C1_{in}$ and the like remain unchanged. A signal can therefore be input reliably to the quantum dot cell $C1_n$ through the input quantum wires 701 and 702.

In the twenty-fifth embodiment described above, the quantum wires 701 and 701 generate one type of an electric field. The wires 701 and 702 may generate two types of electric fields; they may generate an electric field of the first type while connected to the positive and negative terminals of the external power supply 700, respectively, and an electric field of the second type while connected to the negative and positive terminals of the external power supply 700, respectively. In this case, the quantum wires 701 and 702 can supply signals of two types to the quantum dot cell $C1_{in}$.

When an ordinary metal electrode is used to detect the state (output) of an output quantum cell, the state of the output quantum cell inevitably changes due to the numerous electrons present in the metal electrode. The metal electrode can hardly detect the state of the output quantum cell. The state of the output quantum cell is a change in the polarized state defined by the positions of two electrons. To detect a change in the polarized state, an extremely small change in charge distribution needs to be detected. With the conventional techniques it is difficult to detect such a small change in charge distribution.

In view of this, the present inventors invented a quantum effect device which comprises a plurality of cells, including a cell for receiving an input and a cell for supplying an output. Each quantum cell takes one of two recognizable states in accordance with the electromagnetic interaction between it and adjacent quantum cells. The device further comprises at least one pair of charge-detecting semiconductor electrodes and current-detecting means. The semiconductor electrodes are shaped like a wire, located at the output end of the output quantum cell and electrically isolated from all quantum cells. The current-detecting means detects the current flowing between the semiconductor electrodes.

Made of semiconductor material and shaped like wires, the charge-detecting electrodes contain but far less electrons than the conventional metal electrode. The electrons in the input electrode are too small in number to change the state of the output quantum cell. The current flowing between the charge-detecting electrodes defines the state of the output quantum cell. Hence, the output of the output quantum cell can be accurately detected, merely by detecting the current flowing between the charge-detecting electrodes defines the state of the output quantum cell.

Twenty-sixth Embodiment

Figure 51:
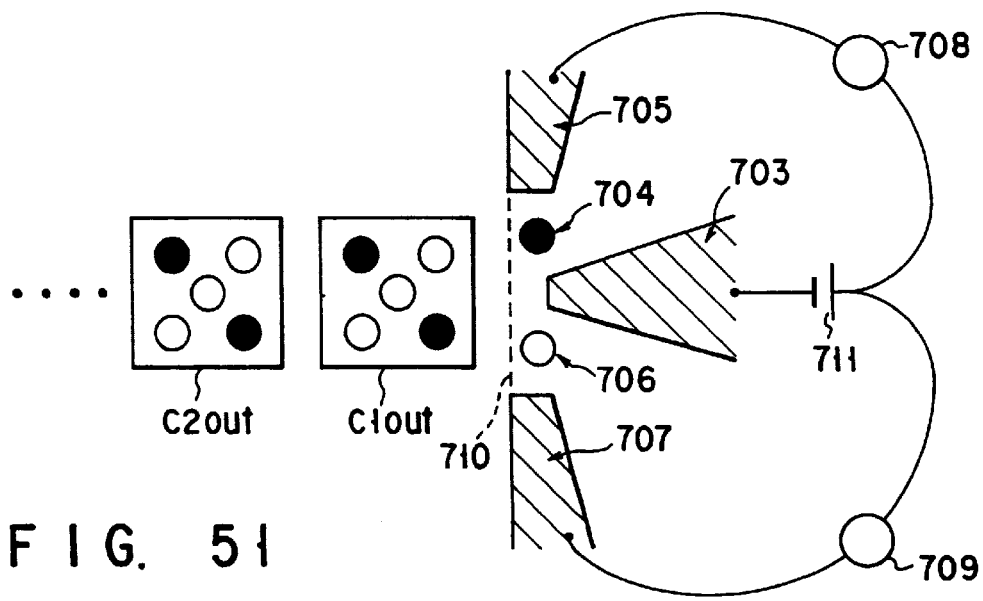
FIG. 51 shows the output section of a quantum effect device which is a twenty-sixth embodiment of the invention.

FIG. 51 shows the output section of a quantum effect device which is the twenty-sixth embodiment of the invention.

As shown in FIG. 51, the twenty-sixth embodiment comprises a number of quantum dot cells and an output detector. The quantum dot cells constitute a device system. Only the last two of the quantum dot cells are shown in FIG. 51, namely two output quantum dot cells $C1_{out}$ and $C2_{out}$. The output detector is provided at the output quantum dot cell $C1_{out}$ and electrically insulated from the device system including the cells $C1_{out}$ and $C2_{out}$.

The output detector comprises four major components which are: a first current-detecting section, a second current-detecting section, a first quantum dot 704, and a second quantum dot 706.

The first current-detecting section comprises a first quantum wire 703, a second quantum wire 705, an ampere meter 708 and a power supply 711. The ampere meter 708 is connected at one end to the positive terminal of the power supply 711 and at the other end to the quantum wire 705. The first quantum wire 703 is connected to the negative terminal of the power supply 711. The second current-detecting section comprises the quantum wire 703, a third quantum wire 707, an ampere meter 709 and the power supply 711. The ampere meter 709 is connected at one end to the positive terminal of the power supply 711 and at the other end to the third quantum wire 707.

The first quantum dot 704 is located between the first quantum wire 703 and the second quantum wire 705, and the second quantum dot 706 is located between the first quantum wire 703 and the third quantum wire 707. The first quantum dot 704 is spaced apart from the quantum wires 703 and 705, but by distances short enough to allow electrons to move between the first quantum dot 704 and the wires 703 and 705 by virtue of tunnel effect. Similarly, the second quantum dot 706 is spaced apart from the quantum wires 703 and 707, but by distances short enough to allow electrons to move between the second quantum dot 706 and the wires 703 and 707 by virtue of tunnel effect.

The quantum dots 704 and 706 are made of the same material (first material) as the quantum dots of the quantum dot cell $C1_{out}$, and have the same size as the quantum dots of the cell $C1_{out}$. The quantum dots 704 and 706 are surrounded by a layer made of the same material (second material) as the layer which surrounds the quantum dots of the quantum dot cell $C1_{out}$. The first quantum dot 704 and the layer of the second material constitute a double barrier wall between the first quantum wire 703 and the second quantum wire 705. The second quantum dot 706 and the layer of the second material constitute a double barrier wall between the first quantum wire 703 and the third quantum wire 707.

The second material has a band gap less than the material surrounding the quantum dot cell $C1_{out}$. The region containing the dot cells $C1_{out}$ and $C2_{out}$ and located to the left of broken line 710 has a greater band gap than the output detector located to the right of broken line 710. This prohibits the electrons in the quantum dot 704 or 706 from moving into the quantum dot cell $C1_{out}$. The state of the dot cell $C1_{out}$ is thereby prevented from being destroyed.

If the quantum dot cell $C1_{out}$ were not provided, the first current-detecting section would detect the current flowing from the second quantum wire 705 to the first quantum wire 703 through the first quantum dot 704, whereas the second current-detecting section would detect the current flowing from the third quantum wire 707 to the first quantum wire 703 through the second quantum dot 706.

Assuming that the dot cell $C1_{out}$ assumes the ground state shown in FIG. 51, the electrons being injected from the first quantum wire 703 into the second quantum dot 706 receive Coulomb interaction from the electrons present in the lower-right quantum dot contained in the quantum dot cell $C1_{out}$. Hence, the current the ampere meter 709 detects is less than in the case where the cell $C1_{out}$ is not provided. The interaction between the electrons in the cell $C1_{out}$ and the electrons in the third quantum wire 707 is so weak that the cell $C1_{out}$ maintain its state. To state another way, since no metal electrodes are used, no Schottky junction is formed between the quantum dot cell $C1_{out}$ and the third quantum wire 707. The state of the quantum dot cell $C1_{out}$ and the like remains unchanged.

On the other hand, the electrons being injected from the first quantum wire 703 into the first quantum dot 704 receive no Coulomb interaction. This is because no electrons exist in the upper-right quantum dot contained in the quantum dot cell $C1_{out}$. The current the ampere meter 709 detects is, therefore, nearly equal to the value the meter 709 would detect if the quantum dot cell $C1_{out}$ were not provided. The the interaction between the electrons in the cell $C1_{out}$ and the electrons in the first quantum wire 703 is so weak that the cell $C1_{out}$ maintains its state. To put it another way, since no metal electrodes are used, no Schottky junction is formed between the quantum dot cell $C1_{out}$ and the first quantum wire 703. The state of the quantum dot cell $C1_{out}$ and the like remains unchanged.

In the quantum effect device shown in FIG. 51, the current detected by the ampere meter 708 is greater than the current detected by the ampere meter 709. When the cell $C1_{out}$ takes another ground state, namely when two electrons are contained in the upper-right and lower-left quantum dots, respectively, the current detected by the ampere meter 708 is less than the current detected by the ampere meter 709. Thus, the state of the quantum dot cell $C1_{out}$ can be correctly determined by comparing the currents detected by the two ampere meters 708 and 709.

Recently there has been proposed a quantum effect signal transfer device which utilizes a shift of electric charge in a small semiconductor structure to transfer signals. (Refer to P. Bakshi et al., J. Appl. Phys., 70,5150 (1991), and P. D. Touaw et al., J. Appl. Phys., 74,4558 (1993).) A quantum effect signal transfer device will be briefly described below.

Figure 52:
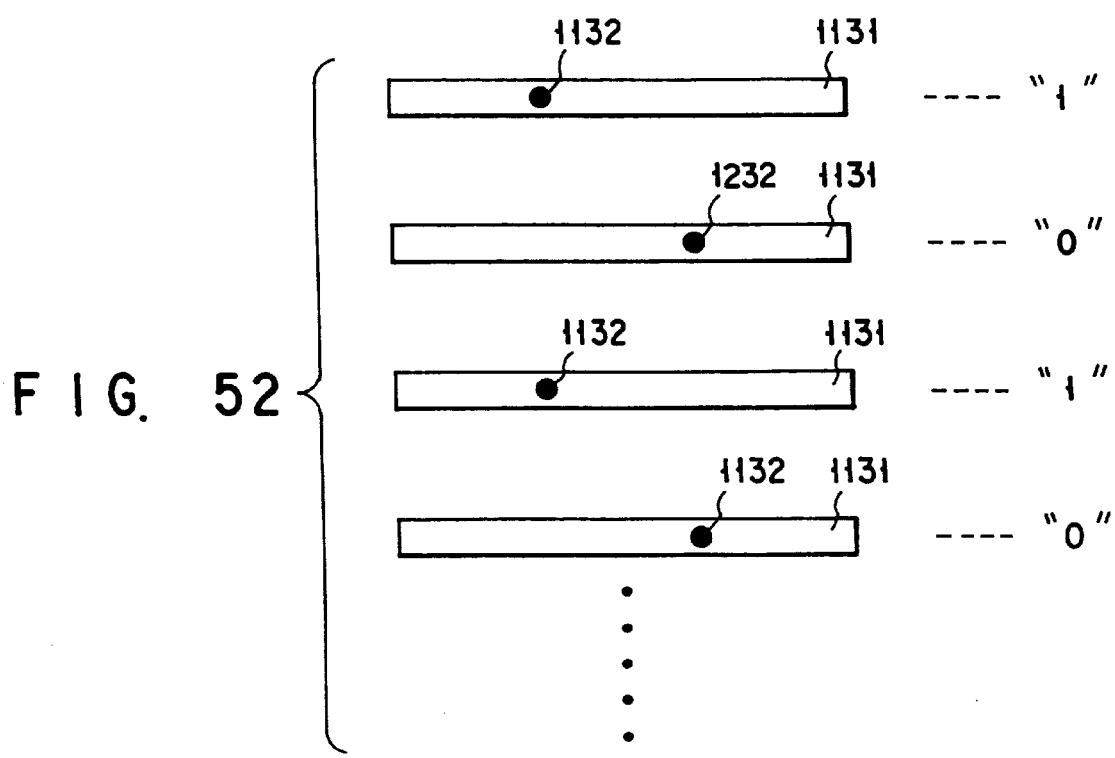
FIG. 52 is a schematic diagram showing a quantum effect signal transfer device.

As shown in FIG. 52, a quantum effect signal transfer device comprises a plurality of quantum dashes 1131, each being an elongated quantum box. The quantum dashes 1131 are arranged in parallel and spaced apart from one another. The distance between any two adjacent quantum dashes 1131 is so short that the electrons confined in each quantum dash exerts Coulomb force on the electrons confined in the adjacent quantum dash. The electrons in each quantum dash 1131 become stable when the electron density is highest at a point 1132 remote from the middle portion of the quantum dash 1131. Stated another way, the quantum dash 1131 is stable when polarized.

Assume that each quantum dash 1131 takes "0" state when the electron density is highest at a point 1132 left to the middle portion of the quantum dash 1131, and takes "1" state when the electron density is highest at a point 1132 right to the middle portion of the dash 1131. Then, the device transfers signals "0", "1", "0", "1" and so on, under the condition shown in FIG. 52.

Figure 53:
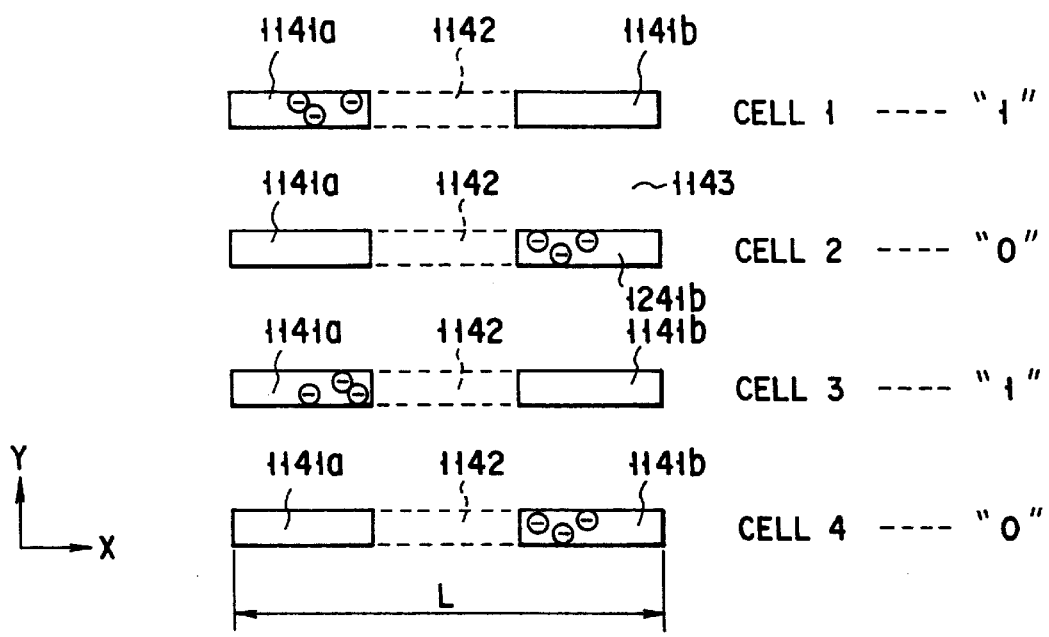
FIG. 53 is a schematic diagram representing another type of a quantum effect signal transfer device.

FIG. 53 is a schematic diagram representing an improved quantum effect signal transfer device. This device uses double quantum wells to attain strong polarization, thereby to transfer signals with high efficiency. As shown in FIG. 53, the device comprises quantum cells 1 to 4 which are elongated in the X-axis direction. Each quantum cell consists of two quantum wells 1141a and 1141b and one weak potential barrier 1142 interposed between the quantum wells 1141a and 1141b. The quantum wells 1141a and 1141b and the potential barrier 1142 constitute a double quantum well. The quantum cells 1 to 4 are spaced apart in the Y-axis direction. The space between any two adjacent cells functions as a strong potential barrier 1143. Hence, electrons can move comparatively freely within each quantum cell, but cannot move between the quantum cells. No force other than Coulomb force exists in the strong potential barrier 1143 to act on the electrons present in any quantum cell.

Figure 54:
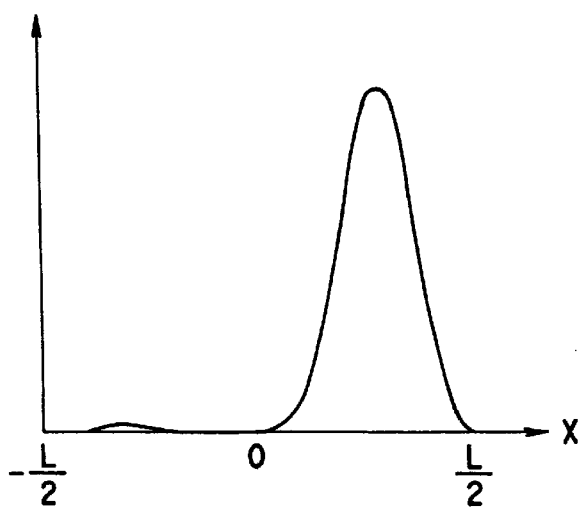
FIG. 54 is a graph showing a charge distribution along the X axis.

When the uppermost quantum cell 1 is greatly polarized, forcing the electrons to the left, thereby assuming the "1" state, the electrons in the next quantum cell 2 move to the right, as can be understood from FIG. 54 which shows a charge distribution along the X axis. That is, the cell 2 is much polarized in the opposite direction with respect to the cell 1, thereby taking the "0" state. Since the quantum cells 1 and 2 are juxtaposed, they transfer a signal "1, 0."

It is the polarized state of each cell that is transferred as a signal. The movement of the electrons in either quantum well of each cell do not serve to transfer a signal. The quantum cells have a very low resistance and generates only an infinitesimal amount of heat. They can constitute an extremely small integrated circuit which operates at high speed and consumes but a little energy.

In the quantum effect signal transfer devices shown in FIGS. 52 and 53, a positive charge is used as a uniform background.

FIGS. 55 and 56 illustrate a quantum effect signal transfer device in more detail. More precisely, FIG. 55 is a plan view of the device, and FIG. 56 is a sectional view taken along line B—B' in FIG. 55.

As FIG. 55 shows, this device comprises a plurality of quantum dashes. As shown in FIG. 56, each quantum dash comprises a semi-insulating GaAs substrate 1251, a modulation-doped layer, and a potential barrier layer 1254. The modulation-doped layer is provided on the GaAs substrate 1251 and comprised of an i-type GaAs layer 1252 and an n-type AlGaAs layer 1253. The potential barrier layer 1254 is provided on the substrate 1251, surrounding the modulation-doped layer. The layer 1254 has a potential barrier wall higher than that of the modulation-doped layer.

In each quantum dash, the i-type GaAs layer 1252 attracts electrons from the n-type AlGaAs layer 1253 provided upon the layer 1252. As a result of this, the n-type AlGaAs layer 1253 contains a positive charge fixed by donor ions, whereas the i-type GaAs layer 1252 contains free electrons, i.e., secondary-electron gas.

As illustrated in FIG. 55, an external electric field or the like, applied to the uppermost quantum dash 1255 may distort the electron-density distribution in a horizontal plane in the quantum dash 1255. If this happens, the high electron-density region of the quantum dash 1255 becomes a negatively charged region 1256, while the low electron-density region becomes a positively charged region 1257. At this time, some of the electrons 1258 in the negatively charge region 1258 are canceled out by the positive charge 1259 fixed by the donor ions as illustrated in FIG. 56. The effective electrons 1258 in the negatively charged region 1256 reduce in numbers. Consequently, no region of the quantum dash 1255 is polarized as strongly as desired.

If the quantum dashes differ in size, one quantum dash confines more donor ions, while another quantum dash confines less donor ions. Differences among the quantum dashes in terms of the number of electrons confined results in a great difference in polarization degree among the quantum dashes, inevitably because only a few electrons serve to polarize the quantum dash. The quantum effect signal transfer device may make errors in operation.

To solve the problem with the conventional quantum effect signal transfer device, the present inventors have invented a quantum effect device comprising: a semiconductor layer of a first type; a plurality of information transfer units provided in a surface of the semiconductor layer of the first type; and a pair of carrier-supplying regions provided in the surface of the first semiconductor layer and sandwiching the information transfer units, for supplying carriers of one type to the semiconductor layers of the first type. Each information transfer unit comprises a pair of semiconductor layers of a second type. The semiconductor layers of the second type have an energy band gap smaller than that of the semiconductor layer of the first type, and are spaced apart such that carriers can move between them. The information transfer units are arranged along a line extending at right angles to the line along which the semiconductor layers of the second type are spaced apart. The information transfer units are spaced apart by so short a distance that carriers are unable to move among the information transfer units and that the carriers in each unit may be polarized by virtue of tunnel effect.

The two semiconductor layers of each information transfer unit are formed in the same plane. Hence, they can be large enough to accumulate many carriers, though they are thin. Further, the semiconductor layers of the second type contain carriers of one type only which have been supplied from a carrier source. (Electrons and holes do not simultaneously exist in the semiconductor layers of the second type.) The carriers can be concentrated in a portion of the information transfer unit.

Twenty-seventh Embodiment

FIGS. 57 and 58 show a quantum effect signal transfer device which is the twenty-seventh embodiment of the invention. More precisely, FIG. 57 is a schematic plan view of the device, and FIG. 58 is a sectional view taken along line A—A' in FIG. 57.

As shown in FIG. 57, the twenty-seventh embodiment comprises a plurality of signal transfer units 812 arranged in the Y-axis direction (the direction in which to transfer signals), forming a column. Each signal transfer unit 812 is comprised of two quantum boxes 812a and 812b. The quantum boxes 812a and 812b are isolated from one another by a barrier layer 811. Donor ions are arranged in two columns 816a and 816b. It is between these columns 816a and 816b that the column of the units 812 extends.

The quantum boxes 812a and 812b are made of, for example, AlGaAs and have a length of tens of nanometers, substantially equal to a Fermi wavelength. The optimal value for the length of the quantum boxes 812a and 182b largely depends on the material of the boxes 812a and 812b.

The quantum boxes 812a and 182b of each information transfer unit 812 are spaced apart along the X axis, by such a short distance a that electrons can pass, due to tunnel effect, through the gap between the boxes 812a and 812b. The signal transfer units 812 are spaced apart along the Y axis, by a distance b which is long enough to prohibit electrons from moving between the signal transfer units 812a and 812b, and is short enough to allow Coulomb interaction to work effectively.

In the case where the quantum boxes 812a and 812b are made of GaAs and the barrier layer 811 is made of AlGaAs, electrons can move between the quantum boxes comparatively freely if the distance a is about 10 nm. If the distance b is about 50 nm, tunneling of electrons scarcely takes place between the quantum boxes, and only Coulomb interaction acts on the electrons, exerting a force over a long distance. Optimal values for the distances a and b greatly depend on the material of the quantum boxes 812a and 812b and the material of the barrier layer 811.

A method of manufacturing the quantum effect signal transfer device according to the twenty-seventh embodiment will now be explained in detail.

First, a semi-insulating GaAs substrate 814 is prepared, and a crystal of i-type AlGaAs is made to grow on the substrate 814, forming the barrier layer 811. Then, selected surface regions of the i-type AlGaAs barrier layer 811 are etched away, forming in the surface of the layer 811 a desired number of pairs of rectangular grooves. The pairs of rectangular grooves are arranged along the Y axis. These grooves are filled with i-type GaAs. The desired number of pairs of quantum boxes are thereby formed in a column extending along the Y axis, each pair consisting of quantum boxes 812a and 812b.

Next, Si ions, used as donor ions, are implanted into the surface of the i-type AlGaAs barrier layer 811, at two narrow elongated regions extending parallel to the column of pairs of quantum boxes and located on the left and right of that column, respectively. As a result, two columns 816a and 816b of donor ions are formed in the surface of the barrier layer 811.

To make the columns of donor ions straight, it is desirable that an FIB (Focused Ion Beam) apparatus be employed to control the energy of the ions and also the positions at which to implant the ions. The FIB apparatus has a deflection electrode and a plate with an extremely narrow slit and can therefore implant a prescribed number of donor ions, one by one, into a very narrow target area, thereby to form a column of donor ions which has a width of only 10 nm or less and a high ion density. The donor ions of the narrow column thus formed, which are densely arranged, can be readily activated to generate many electrons in each quantum box. In addition, the FIB apparatus can serve to adjust the distance between the column of quantum boxes and either column of donor ions and also the number of donor ions forming either column, so that the electron density in each quantum box may be freely changed.

Thereafter, the Si ions 813a of the left column 816a and the Si ions 813b of the right column 816b are activated. Due to the difference in electron affinity between i-type AlAs and i-type AlGaAs, the electrons generated from the donor ions in the i-type AlGaAs barrier layer 811 gather in the quantum boxes 812a and 812b which are made of i-type GaAs. The quantum boxes 812a and 812b of each pair therefore constitute a signal transfer unit 812.

The operation of the quantum effect signal transfer device, i.e., the twenty-seventh embodiment, will be explained.

First, an external electric field or the like is applied to the device, thereby changing the electron distribution in the quantum boxes 812a and 812b of the uppermost signal transfer unit 812 such that the left box 812a contains more electrons than in the right box 812b. The uppermost signal transfer unit 812 thereby assumes state "1."

Since the columns of donor ions, 816a and 816b, are located relatively remote from the signal transfer units 812, the positive charges on the columns 816a an 816b generate but a uniform weak external electric field, which is applied to each signal transfer unit. Therefore, the force acting on the electrons in the second uppermost signal transfer unit 812 is only the Coulomb repulsion exerted by the electrons present in the uppermost signal transfer unit 812.

As a result, the electron distribution in the second uppermost signal transfer unit 812 changes, more electrons gathering in the right quantum box 812b than in the left quantum box 812a. Namely, the second uppermost signal transfer unit 812 undergoes strong polarization, and assumes state "0." Further, in a similar way, the other signal transfer units 812, i.e., from the third on, assume states "1," "0," "1," and so forth, respectively.

As described above, the quantum dashes of the conventional quantum effect signal transfer device (FIG. 56) comprise a modulation-doped layer (i-type GaAs layer 1252/n-type AlGaAs layer 1253). To form a modulation-doped layer, the i-type GaAs layer 1252 and the n-type AlGaAs layer 1253 must be thin. They cannot be made thick in order that the modulation-doped layer may accumulate more electrodes and may be polarized greatly.

In contrast, the signal transfer units 812 of the quantum effect signal transfer device according to the invention are comprised of two quantum boxes 812a and 812b each. To accumulate more electrons in either quantum box, the area of the box must be increased. It is easy to increase the area of either quantum box. Furthermore, since a number of electrons can be effectively injected into either quantum box from one column of donor ions, each signal transfer unit can be polarized strongly. Still further, since the columns of donor ions are distant from the quantum boxes, positive electrons do not cancel out negative electrons to weaken the polarization as in the quantum dashes of the conventional device (FIG. 56).

The twenty-seventh embodiment of the invention can stably transfer signals because the signal transfer units 812 can be polarized greatly. Moreover, this embodiment is flat since it does not include a multi-layered structure (e.g., a modulation-doped layer) as the conventional device (FIG. 56). Obviously, the device according to the twenty-seventh embodiment can be manufactured by a considerably simplified method.

In the twenty-seventh embodiment, any two adjacent signal transfer units 812 are spaced apart by a comparatively long distance b, thereby to prohibit electrons from moving between the signal transfer units. Instead of taking this measure, a layer of material (e.g., dielectric material) which has a large band gap may be provided between the signal transfer units 812 to prohibit electrons from moving between the units 812.

One of methods of forming a metal pattern in a semiconductor device is a lift-off method. Details of the lift-off method are described in Kenji Gamoh, *Technique of Forming Mesoscopic Structures*, Solid-State Physics, Vol. 28, No. 11, pp 128–137 (1993). This method will be explained, with reference to FIGS. 59A to 59E.

Figure 59A:
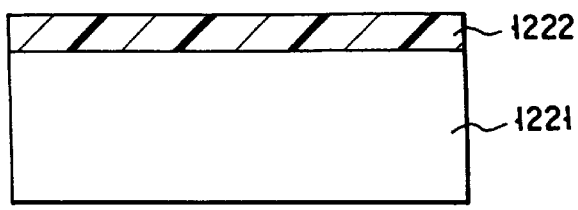
FIGS. 59A to 59E are sectional views explaining how a fine metal pattern is formed.

First, as shown in FIG. 59A, organic resist such as PMMA (Polymethyl Methacrylate) is spin-coated on a semiconductor substrate 1221. The organic resist 1222 is then pre-baked at about 100° C., evaporating the solvent from the organic resist 1222.

Figure 59B:
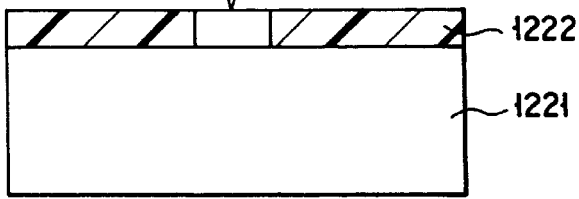

Next, as shown in FIG. 59B, an electron beam 2223 having energy of about 20 to 200 kev is applied onto that region of the organic resist 1222 in which a metal pattern will be formed, by means of an EB (Electron Beam) lithography apparatus.

Figure 59C:
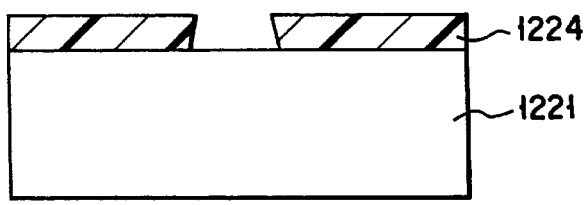

Further, as shown in FIG. 59C, the semiconductor substrate 1221 is immersed into a developing solution containing an organic solvent such as MEK (Methyl Ethyl Ketone) or MIBK (Methyl Isobutyl Ketone), thereby developing the organic resist 1222 and forming an organic resist pattern 1224 having small openings. Then, the organic resist pattern 1224 is post-baked, removing the residual developing solution from the resist pattern 1224 and, at the same time, enhancing the bonding between the semiconductor substrate 1221 and the organic resist pattern 1124.

In order to perform lift-off process readily, it is desirable that each opening made in the resist pattern 1223 have an invertedly tapered cross section. To this end, the resist 1222 should be comprised of a lower layer and an upper layer having a higher photo sensitivity than the lower layer.

Figure 59D:
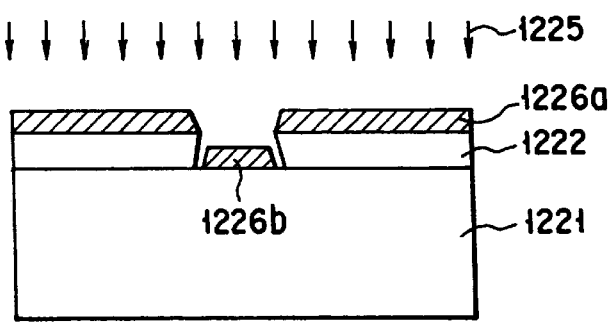

Next, as shown in FIG. 59D, metal 1225 is vapor-deposited on the organic resist pattern 1222 and also in the openings thereof, by means of a vapor deposition apparatus which has a resistive heater or an electron beam emitter. Metal films 1226a are thereby formed on the pattern 1222. Metal layers 1226b, isolated from the layers 1226a, are thereby formed in the openings.

Figure 59E:
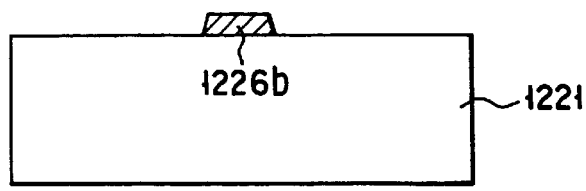

Finally, as shown in FIG. 59E, resist solvent containing an organic solvent is applied, dissolving the organic resist pattern 1222 and removing the metal layers 1226a formed on the pattern 1222. As a result, a fine metal pattern is formed on the semiconductor substrate 1221, which consists of the metal films 1226b and which has a shape faithful to the organic resist pattern 1222.

The inventors hereof, however, think that the lift-off method described above is disadvantageous in the following respects.

Since an organic resist is used in the lift-off method, the surface of the unfinished product is contaminated with carbon or carbon-containing substance (carbon contaminant) during the some processes such as spin-coating, pre-baking, resist-developing and post-baking. The cost of the subsequent washing process is inevitably very high.

Further, the lift-off method cannot be performed in a vacuum in its entirety since it includes a process using an organic substance which has high volatility. This means that the unfinished product is exposed to the atmosphere. It is therefore impossible to prevent unnecessary oxide (surface oxide) from being formed on the surface of the unfinished product. Various limitations are imposed on designing not only the metal pattern but also the method of forming the pattern.

Furthermore, it is difficult to completely remove the carbon contaminant or the surface oxide without damaging the semiconductor substrate 1221. The fine metal pattern formed on the substrate 1221 may be broken in the process of removing the carbon contaminant and the surface oxide.

Still further, the organic resist 1222 is deformed quite easily when heated. Hence, care should be taken not to raise the surface temperature of the substrate 1221 above a prescribed value.

In view of the foregoing, the present inventors have invented a method of manufacturing a semiconductor device comprising the steps of: forming a resist made of inorganic material on a substrate; applying charged particles onto selected parts of the resist; performing dry etching, thereby removing the remaining parts of the resist and exposing parts of the substrate; vapor-depositing metal on the exposed parts of the substrate, forming a first metal layer thereon, and vapor-depositing metal on the resist, forming thereon a second metal layer more porous than the first metal layer; and performing selective dry etching, thereby removing the resist and the second metal layer.

In this method, the resist is made of inorganic material, exposed by applying charged particles to it, and developed by means of dry etching. No organic solvents are applied in the method according to the invention. The method therefore solve various problems caused by an organic substance.

Twenty-eighth Embodiment

A method of forming a fine metal pattern, which is the twenty-eighth embodiment of the present invention will be described, with reference to the sectional views of FIGS. 60A to 60E.

Figure 60A:
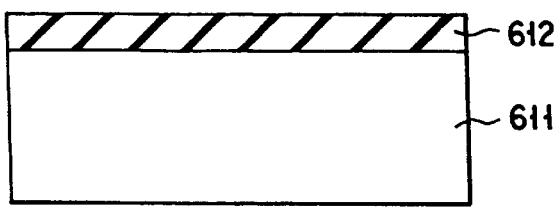
FIGS. 60A to 60E are sectional views, explaining a method of forming a fine metal pattern, which is a twenty-eighth embodiment of this invention.

First, as shown in FIG. 60A, an inorganic resist, or a silicon nitride film 612, is formed on a GaAs substrate 611. The silicon nitride film 612 will have a thickness of about 200 nm if silicon nitride is deposited on the substrate 611 for 10 minutes by a plasma-excited CVD apparatus, while maintaining the substrate 611 at 250° C., applying RF output of 200W, and maintaining the silane-ammonia-nitrogen ratio at 1:2:10.

Figure 60B:
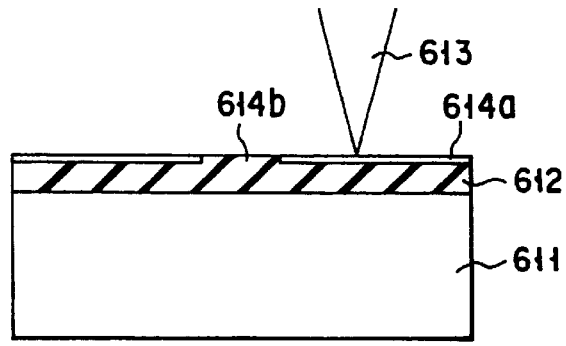

Next, as shown in FIG. 60B, a focused ion beam (FIB) 613 of gallium ions is applied onto a part 614a (exposed part) of the silicon nitride film 612, which is other than the part 614b (unexposed part) of the film 612. Selective exposure of the nitride silicon film 612 is thereby accomplished. Gallium ions will be located in the near-surface region of the silicon nitride film 612 if the FIB 613 is applied at an ion energy of 30 keV and in a dose of about $5\times10^{16}$ cm$^{-2}$. The FIB 613 can be focused to have a reduced diameter of 100 nm or less and can be applied at a target point with high precision. Therefore, the exposed part 614b of the film 612 can have a width as small as 100 nm or less.

Figure 60C:
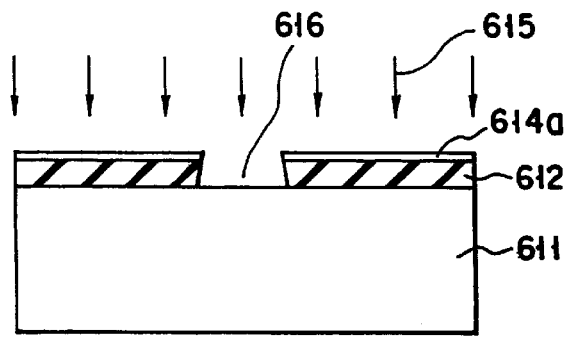

Then, as shown in FIG. 60C, the silicon nitride film 612 is developed by means of dry etching using sulfur hexafluoride as a reaction gas, thereby removing the unexposed part 614b of the film 612 and forming an opening 616 in the film 612. Only the exposed part 614a of the film 612 remains on the GaAs substrate 611. The dry etching is continued longer than a just etching time determined from the thickness of the silicon nitride film 612 and the speed of the dry etching, thereby effecting so-called "over etching." As a result, the opening 616 comes to have an invertedly tapered cross section since the lower portion of the film 612 is less affected by the FIB than the upper portion. Having a tiny opening 616, the silicon nitride film 612 makes a fine resist pattern.

To be more specific, the dry etching is performed on the silicon nitride film 612 by an ECR-RIBE (electron-cyclotron resonance, reactive ion beam etching) apparatus, in an atmosphere of 0.5 mTorr, by applying a microwave output of 200W and an ion acceleration voltage of 200V. The unexposed part 614b of the film 612 is etched at speed a of about 5 nm/min, and the exposed part 614a of the film 612 is scarcely etched to have a thickness of about 100 nm or more.

As indicated above, the exposed part 614a of the film 612 remains on the substrate 611 during and after the step of FIG. 60C. This is because the gallium ions implanted into the exposed part 614a react with the active species 615 such as ions generated from plasma and containing fluorine, forming in the exposed part 614a a reaction product which can be etched but at a very low speed. Since GaAs is dry-etched at a low etching speed, the GaAs substrate 611 is little damaged.

Figure 60D:
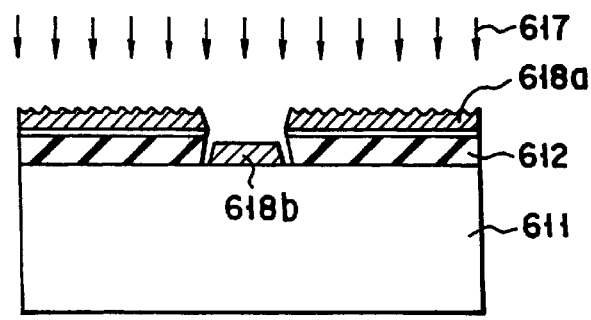

Further, as shown in FIG. 60D, gold 616 is vapor-deposited on the entire upper surface of the unfinished product, thereby forming a first gold film 618a and a second gold film 618b. More specifically, metal is deposited by a vacuum vapor deposition apparatus having an electron beam emitter, while raising the temperature of the substrate 611 from room temperature (10 to 30° C.) to a high temperature of several hundred degrees centigrade, thereby forming gold films 618a and 618b having a thickness of, for example, about 50 nm. The metal layers 618a and 618b are therefore thinner than the silicon nitride film 612. The second gold film 618b is mounted on the exposed part of the GaAs substrate 611, whereas the first gold film 618a is mounted on the silicon nitride film 612.

Figure 60E:
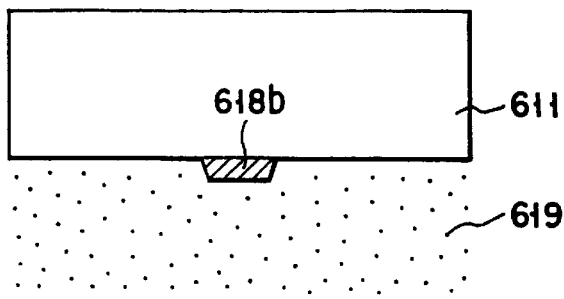

Finally, as shown in FIG. 60E, the unfinished product is turned upside down and subjected to dry etching in which etching species are radicals 619 only and a reaction gas such as sulfur hexafluoride is applied. The silicon nitride film 612 and the first gold film 618a are thereby removed. To be more precise, when the dry etching on the silicon nitride film 612 proceeds to some degree, the film 612 falls from the GaAs substrate 611 since the unfinished product has been turned upside down. The first gold film 618a also falls since it is mounted on the silicon nitride film 612. A fine metal pattern (a patterned metal layer) 618b is thereby formed.

The silicon nitride film 612 easily peels off the the GaAs substrate 611 for the following reason. Since the first gold film 618a is porous, the radicals 619 easily pass through the film gold 618a, reaching the silicon nitride film 612. Due to these radicals 619, the film 612 is etched faster than the second gold film 618b. Further, these radicals 619 perform high-speed side etching on the silicon nitride film 612. The radicals, which contain fluorine, scarcely etch the GaAs substrate 611.

As described above, the lift-off method according to the invention uses no organic resist to form a fine metal pattern 618b. The method is therefore free of any problem inherent in the conventional method in which an organic resist is applied.

Since the fine metal pattern 618b can be formed without exposing the GaAs substrate 611, the method can be performed in a vacuum in its entirety. It follows that the surface contamination and surface oxidation of the unfinished product can be suppressed throughout the process of forming the fine metal pattern 618b. The fine metal pattern 618b thus formed has excellent characteristics and can help to provide a semiconductor device which has high operating efficiency and which can be manufactured at high productivity.

The inorganic resist used in the twenty-eighth embodiment is silicon nitride. Nevertheless, any other inorganic resist, such as silicon oxide, may be used in the twenty-eighth embodiment, in order to form a fine metal pattern. The fine metal pattern formed in the twenty-eighth embodiment is made of gold. Instead, silver may be used as the material of the fine metal pattern. If silver is used, it suffices to heat the substrate to a higher temperature than in the case where gold is used.

The the thin metal pattern need not be porous if it has a small area. This is because the inorganic resist can be thoroughly removed by side etching which accompanies the dry etching. Hence, the requirements which the thin metal pattern and the inorganic resist must fulfill can be mitigated.

An inorganic resist having convexes and concaves in its surface may be used. In this case, a thin porous metal film can be formed on the inorganic resist. If silicon nitride or silicon oxide is used as the material of the inorganic resist, it is desirable that the FIB of gallium ions applied onto the exposed part of the inorganic resist be ones which have a diameter somewhat smaller than the distance between any two adjacent beam spots formed on the inorganic resist. While the silicon nitride film is dry-etched, the etching achieved by ions species may be intensified to some degree.

Twenty-ninth Embodiment

Figure 61:
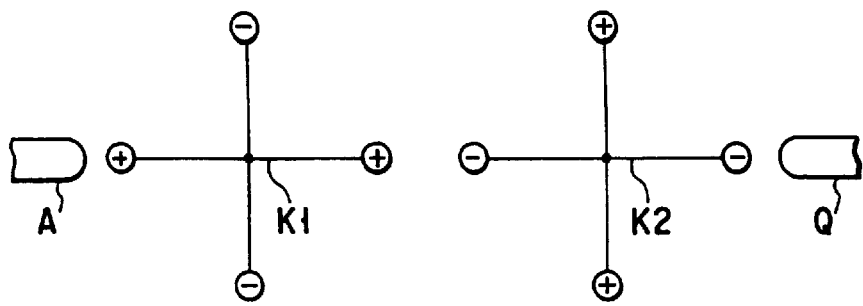
FIG. 61 is a schematic diagram of a rotary logic device (an information transfer path) which is a twenty-ninth embodiment of the invention.

FIG. 61 is a schematic diagram of a rotary logic device (an information transfer path) which is the twenty-ninth embodiment of the invention.

As FIG. 61 shows, this rotary logic device comprises two rotary units K1 and K2. The units K1 and K2 function as an input rotary unit and output rotary unit, respectively. They are of either the cross-shaped type shown in FIG. 62 or the T-shaped type shown in FIG. 63. The two types of rotary units are similar to those illustrated in FIGS. 37A and 37B.

Figure 62:
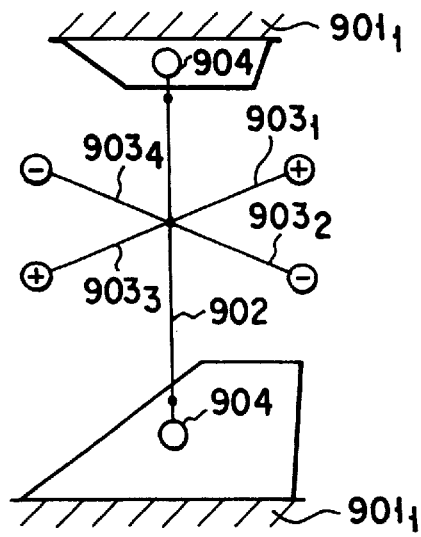
FIG. 62 is a perspective view of a cross-shaped rotary unit.
Figure 63:
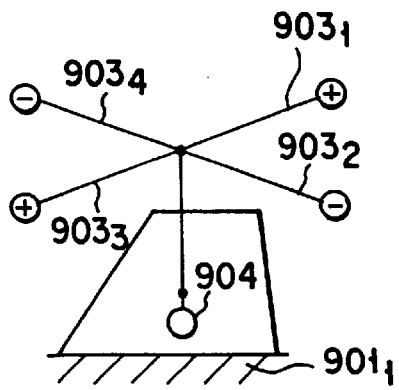
FIG. 63 is a perspective view of a T-shaped rotary unit.

As shown in FIG. 62, the cross-shaped rotary unit comprises two supports $901_1$ and $901_2$ and a vertical member 902 supported at two end by the supports $901_1$ and $901_2$. As shown in FIG. 63, the T-shaped rotary unit comprises a support $901_1$ and a vertical member 902 supported at the lower end by the support $901_1$. In both types of rotary units, a first horizontal member $903_1$ is positively charged, a second horizontal member $903_2$ is negatively charged, a third horizontal member $903_3$ is positively charged, and a fourth horizontal member $903_4$ is connected to the vertical member 902 and spaced apart by 90° C. The horizontal members $903_1$ to $903_4$ constitute a rotary member 904. The rotary member 904 can rotate in a plane to which the vertical member 902 extends at right angles.

In the rotary unit shown in FIG. 62, two metal spheres 904 are mounted on the supports $901_1$ and $901_2$. In the rotary unit shown in FIG. 63, one metal sphere 904 is mounted on the supports $901_1$. Each metal sphere 904 made of, for example, gold (Au) chemically adsorbs high-molecular clusters or atom clusters of one horizontal member, positively or negatively charging these clusters. Alternatively, either type of a rotary unit may be made by micro-machining electric or magnetic material. If magnetic material is used, the tip of each horizontal member will be either an N pole or an S pole. The supports $901_1$ and $901_2$ are made of, for example, silicon.

As shown in FIG. 61, an external charge A exist near the second rotary unit K1, and a detector Q is located near the second rotary unit K2 for detecting the polarity of the second rotary unit K2. The charge A is an input to the rotary logic device, whereas the polarity of the second rotary unit K2 is an output from the rotary logic device. The rotary units K1 and K2 are spaced apart from each other. The external charge A is greater than that of the first rotary unit K1. Therefore, the second rotary unit K2 does not undergo Coulomb interaction with the external charge A. This prevents the rotary logic device from operating unstably or making errors.

The operation of the twenty-ninth embodiment will be explained below.

If the external charge A is negative, the first rotary unit K1 keeps rotating until it assumes a stable state due to Coulomb interaction between it and the charge A. Stated another way, the first rotary unit K1 stops rotating when a positively charged member (i.e., either the first or third horizontal member) comes to oppose the external charge A.

As the first rotary unit K1 rotates, the second rotary unit K2 rotates. When the first rotary unit K1 stops rotating, so does the second rotary unit K2, with its one negatively charged horizontal member attracted to one of the positively charged members (i.e., the second and fourth horizontal members) of the first rotary unit K1. Hence, the other negatively charged horizontal member of the second rotary unit K2 is fixed at the detector Q. As a result, the polarity the detector Q detects is identical to the polarity of the input charge A. Obviously, the rotary logic device according to the twenty-ninth embodiment, which comprises two rotary units K1 and K2, functions as an information transfer path which corresponds to a conventional metal wire.

The rotary logic device transfers information by transmitting the position (i.e., polarized direction) of the first rotary unit K1 rotated by Coulomb interaction to the second rotary unit K2. Not requiring wires to transfer information, the device can have a high integration density. Not using a current as medium for transferring information, the device consumes little power and generates virtually no heat.

In the twenty-ninth embodiment, two rotary units are used. Instead, four rotary units may be assembled to constitute a rotary logic device. In brief, an even number of rotary units can be used to provide a rotary logic device of this type.

Thirtieth Embodiment

Figure 64:
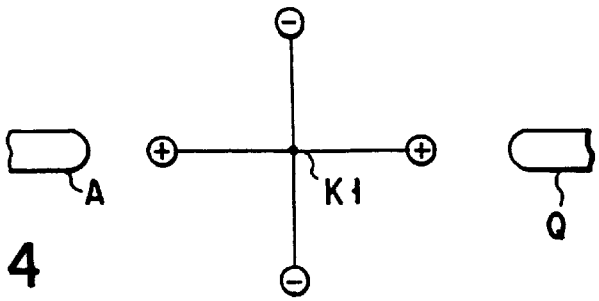
FIG. 64 is a diagrammatic representation of a rotary device (an inverter) which is a thirtieth embodiment of the present invention.

FIG. 64 is a diagrammatic representation of a rotary logic device (an inverter) which is the thirtieth embodiment of the present invention.

As seen from FIG. 64, this device comprises one rotary unit K1 having four horizontal members. The unit K1 rotates due to Coulomb interaction between it and an input charge A, in accordance with the polarity of the charge A which exists near the rotary unit K1. If the external charge A is negative, the rotary unit K1 keeps rotating until it assumes a stable state by virtue of the Coulomb interaction. To be more precise, the unit K1 continues to rotate until one of its positively charged horizontal members (i.e., the first and third members) comes to oppose the external charge A. The polarity detected by a detector Q located near the second rotary unit K2 is therefore opposite to the polarity of the input charge A. Namely, the thirtieth embodiment functions as an inverter.

Like the twenty-ninth embodiment, the thirtieth embodiment requires no wires. The rotary logic device according to the thirtieth embodiment therefore consumes little power and generates virtually no heat.

The thirtieth embodiment comprises only rotary unit K1. Instead, three rotary units may be assembled to constitute a rotary logic device. In short, an odd number of rotary units can be used to provide a rotary logic device which operates as an inverter.

Both the twenty-ninth embodiment (FIG. 61) and the thirtieth embodiment (FIG. 64) utilize the Coulomb interaction between an input charge and each rotary unit, which involves the polarity of the input charge and that of the rotary unit. Alternatively, both devices may be modified to utilize magnetic interaction between the input charge and each rotary unit. In this case, too, the same advantage can be attained.

In the twenty-ninth and thirtieth embodiments, there may be used a cross-shaped rotary unit and the T-shaped rotary unit, both described in conjunction with the ninetieth embodiment.

Various embodiments of the present invention have thus far described. Nonetheless, the invention is not limited to the embodiments. Some of the embodiments may be used in combination.

For example, in the twelfth to fifteenth embodiments, the dot cells each having circular quantum boxes can be replaced by the dot cells of the ninth embodiment which have rectangular quantum boxes each. Further, quantum artificial molecules of the type used in the ninth embodiment or the like may be utilized to provide a cell-connected inverter shown in FIG. 1, a cell-connected OR device illustrated in FIG. 3, or a cell-connected AND device shown in FIG. 4.

Still further, quantum artificial molecules of the type used in the twelfth embodiment or the like may employed to provide a cell-connected inverter shown in FIG. 1, a cell-connected OR device illustrated in FIG. 3, or a cell-connected AND device illustrated in FIG. 4.

Moreover, various changes and modifications can be made, without departing from the spirit and scope of the present invention.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A quantum effect device comprising a plurality of cells, including an input cell and an output cell, wherein each of said quantum cells takes one of at least two recognizable states in accordance with a physical interaction between the quantum cell and any adjacent quantum cell and said quantum cells are arranged in such a two-dimensional pattern that the input cell and the output cell have a predetermined relation and that the output cell and some other cells constitute a loop structure.

2. The quantum effect device according to claim 1, wherein said loop structure comprises four of said quantum cells, which are arranged in 3 o'clock direction, 6 o'clock direction, 9 o'clock direction, and 12 o'clock direction, respectively.

3. A quantum effect device comprising:

a first cell functioning as an input cell;

a second cell located at an upper-right position with respect to said first cell;

a third cell located at a lower-right position with respect to said second cell; and a fourth cell located at a lower-right position with respect to said first cell and at a lower-left position with respect to said third cell, and functioning as an output cell, wherein each of said first to fourth cells takes one of at least two recognizable states in accordance with a physical interaction between the cell and any adjacent cell, and an input to said first cell and an output from said fourth cell assume a logic NOT relationship.

4. A quantum effect device comprising:

a first cell functioning as a first input cell;

a second cell located at an upper-right position with respect to said first cell;

a third cell located at a lower-right position with respect to said second cell and functioning as a second input cell;

a fourth cell located at a upper-left position with respect to said first cell;

a fifth cell located at an upper-left position with respect to said second cell and at an upper-right position with respect to said fourth cell;

a sixth cell located at an upper-right position with respect to said fifth cell; and a seventh cell located at an upper-right position with respect to said second cell and at a lower-right position with respect to said sixth cell, and functioning as an output cell, wherein each of said first to seventh cells takes one of at least two recognizable states in accordance with a physical interaction between the cell and any adjacent cell, and an input to said first cell, an input to said third cell and an output from said seventh cell assume a logic OR relationship.

5. A quantum effect device comprising:

a first cell functioning as a first input cell;

a second cell located at a lower-right position with respect to said first cell;

a third cell located at a lower-left position with respect to said second cell and functioning as a second input cell;

a fourth cell located at a upper-right position with respect to said first cell;

a fifth cell located at an upper-right position with respect to said second cell and at a lower-right position with respect to said fourth cell;

a sixth cell located at a lower-right position with respect to said fifth cell; and a seventh cell located at a lower-right position with respect to said second cell and at a lower-left position with respect to said sixth cell, and functioning as an output cell, wherein each of said first to seventh cells takes one of at least two recognizable states in accordance with a physical interaction between the cell and any adjacent cell, and an input to said first cell, an input to said third cell and an output from said seventh cell assume a logic AND relationship.

6. A quantum effect device comprising a plurality of cells, including an input cell an output cell, wherein each of said quantum cells takes one of at least two recognizable states in accordance with a physical interaction between the quantum cell and any adjacent quantum cell, and of the quantum cells arranged between the input cell and the output cell, some constitute a first loop structure, and the others constitute a second loop structure.

7. A quantum effect device comprising a plurality of cells, including an input cell and first and second output cells for splitting a signal input to the input cell into two signals, wherein each of said quantum cells takes one of at least two recognizable states in accordance with a physical interaction between the quantum cell and any adjacent quantum cell, the quantum cells arranged between said input cell and said first output cell constitute a first loop structure, and the quantum cells arranged between said input cell and said second output cell constitute a second loop structure.

8. A quantum effect device comprising a plurality of quantum artificial molecules which are rectangular and arranged in a two-dimensional pattern, wherein each of said quantum artificial molecules is comprised of five quantum boxes each of which contain two carriers; four of said five quantum boxes of each quantum molecule are located at four corners of the quantum artificial molecule and are shaped and spaced apart so as to prevent carriers from moving among the four quantum boxes due to tunnel effect; and the remaining quantum box of each quantum artificial molecule is positioned in the quantum artificial molecule or on any side of thereof and is shaped and spaced from the four quantum boxes so as to allow carriers to move between it and any other quantum box.

9. A quantum effect device comprising:
  a first quantum artificial molecule functioning as an input molecule;
  a second quantum artificial molecule located at an upper-right position with respect to said first quantum artificial molecule;
  a third quantum artificial molecule located at a is lower-right position with respect to said second quantum artificial molecule; and
  a fourth quantum artificial molecule located at a lower-right position with respect to said first quantum artificial cell and at a lower-left position with respect to said third quantum artificial molecule and functioning as an output molecule,
  wherein each of said quantum artificial molecules is comprised of five quantum boxes each of which contains two carriers; four of said five quantum boxes of each quantum molecule are located at four corners of the quantum artificial molecule and are shaped and spaced apart so as to prevent carriers from moving among the four quantum boxes due to tunnel effect; the remaining quantum box of each quantum artificial molecule is positioned in the quantum artificial molecule or on any side of thereof and is shaped and spaced from the four quantum boxes so as to allow carriers to move between it and any other quantum box; and an input to said first quantum artificial molecule and an output from said fourth quantum artificial molecule assume a logic NOT relationship.

10. A quantum effect device comprising:
  a first quantum artificial molecule functioning as a first input molecule;
  a second quantum artificial molecule located at an upper-right position with respect to said first quantum artificial molecule;
  a third quantum artificial molecule located at a lower-right position with respect to said second quantum artificial molecule and functioning as a second input molecule;
  a fourth quantum artificial molecule located at an upper-left position with respect to said first quantum artificial molecule;
  a fifth quantum artificial molecule located at an upper-left position with respect to said second quantum artificial molecule and at an upper-right position with respect to said fourth quantum artificial molecule;
  a sixth quantum artificial molecule located at an upper-right position with respect to said fifth quantum artificial molecule; and
  a seventh quantum artificial molecule located at an upper-right position with respect to said second quantum artificial molecule and at a lower-right position with respect to said sixth quantum artificial molecule and functioning as an output molecule,
  wherein each of said quantum artificial molecules is comprised of five quantum boxes each of which contains two carriers; four of said five quantum boxes of each quantum molecule are located at four corners of the quantum artificial molecule and are shaped and spaced apart so as to prevent carriers from moving among the four quantum boxes due to tunnel effect; the remaining quantum box of each quantum artificial molecule is positioned in the quantum artificial molecule or on any side of thereof and is shaped and spaced from the four quantum boxes so as to allow carriers to move between it and any other quantum box; and an input to said first quantum artificial molecule and an input to said third quantum artificial molecule and an output from said seventh quantum artificial molecule assume a logic OR relationship.

11. A quantum effect device comprising:
  a first quantum artificial molecule functioning as a first input molecule;
  a second quantum artificial molecule located at a lower-right position with respect to said first quantum artificial molecule;
  a third quantum artificial molecule located at a lower-left position with respect to said second quantum artificial molecule and functioning as a second input molecule;
  a fourth quantum artificial molecule located at an upper-right position with respect to said first quantum artificial molecule;
  a fifth quantum artificial molecule located at an upper-right position with respect to said second quantum artificial molecule and at a lower-right position with respect to said fourth quantum artificial molecule;
  a sixth quantum artificial molecule located at a lower-right position with respect to said fifth quantum artificial molecule; and
  a seventh quantum artificial molecule located at a lower-right position with respect to said second quantum artificial molecule and at a lower-left position with respect to said sixth quantum artificial molecule and functioning as an output molecule,
  wherein each of said quantum artificial molecules is comprised of five quantum boxes each of which contains two carriers; four of said five quantum boxes of each quantum molecule are located at four corners of the quantum artificial molecule and are shaped and spaced apart so as to prevent carriers from moving among the four quantum boxes due to tunnel effect; the remaining quantum box of each quantum artificial molecule is positioned in the quantum artificial molecule or on any side of thereof and is shaped and spaced from the four quantum boxes so as to allow carriers to move between it and any other quantum box; and an input to said first quantum artificial molecule, an input to said third quantum artificial molecule and an output from said seventh quantum artificial molecule assume a logic AND relationship.

12. A quantum effect device comprising a plurality of quantum artificial molecules, wherein each of said quantum artificial molecules takes one of at least two recognizable states in accordance with a physical interaction between the quantum artificial molecule and any adjacent quantum artificial molecule; and said quantum artificial molecules are arranged in such a three-dimensional pattern that the quantum effect device has a predetermined input-output relationship.

13. A quantum effect device comprising:
a first quantum artificial molecule functioning as an input molecule;
a second quantum artificial molecule located at an upper-right position with respect to said first quantum artificial molecule;
a third quantum artificial molecule located at a lower-right position with respect to said second quantum artificial molecule; and
a fourth quantum artificial molecule located at a lower-right position with respect to said first quantum artificial molecule and at a lower-left position with respect to said third quantum artificial molecule and functioning as an output molecule,
wherein said quantum artificial molecules are arranged in a three-dimensional pattern; each of said quantum artificial molecules takes one of at least two recognizable states in accordance with a physical interaction between the quantum artificial molecule and any adjacent quantum artificial molecule; and an input to said first quantum artificial molecule and an output from said fourth quantum artificial molecule assume a logic NOT relationship.

14. A quantum effect device comprising:
a first quantum artificial molecule functioning as a first input molecule;
a second quantum artificial molecule located at an upper-right position with respect to said first quantum artificial molecule;
a third quantum artificial molecule located at a lower-right position with respect to said second quantum artificial molecule and functioning as a second input molecule;
a fourth quantum artificial molecule located at a upper-left position with respect to said first quantum artificial molecule;
a fifth quantum artificial molecule located at an upper-left position with respect to said second quantum artificial molecule and at an upper-right position with respect to said fourth artificial quantum artificial molecule;
a sixth quantum artificial molecule located at an upper-right position with respect to said fifth quantum artificial molecule; and
a seventh quantum artificial molecule located at an upper-right position with respect to said second quantum artificial molecule and at a lower-right position with respect to said sixth quantum artificial molecule and functioning as an output molecule,
wherein wherein said quantum artificial molecules are arranged in a three-dimensional pattern; each of said quantum artificial molecules takes one of at least two recognizable states in accordance with a physical interaction between the quantum artificial molecule and any adjacent quantum artificial molecule; and an input to said first quantum artificial molecule and an input to said third quantum artificial molecule and an output from said seventh quantum artificial molecule assume a logic OR relationship.

15. A quantum effect device comprising:
a first quantum artificial molecule functioning as a first input molecule;
a second quantum artificial molecule located at a lower-right position with respect to said first quantum artificial molecule;
a third quantum artificial molecule located at a lower-left position with respect to said second quantum artificial molecule and functioning as a second input molecule;
a fourth quantum artificial molecule located at an upper-right position with respect to said first quantum artificial molecule;
a fifth quantum artificial molecule located at an upper-right position with respect to said second quantum artificial molecule and at a lower-right position with respect to said fourth artificial quantum artificial molecule;
a sixth quantum artificial molecule located at a lower-right position with respect to said fifth quantum artificial molecule; and
a seventh quantum artificial molecule located at a lower-right position with respect to said second quantum artificial molecule and at a lower-left position with respect to said sixth quantum artificial molecule and functioning as an output molecule,
wherein said quantum artificial molecules are arranged in a three-dimensional pattern; each of said quantum artificial molecules takes one of at least two recognizable states in accordance with a physical interaction between the quantum artificial molecule and any adjacent quantum artificial molecule; and an input to said first quantum artificial molecule, an input to said third quantum artificial molecule and an output from said seventh quantum artificial molecule assume a logic AND relationship.

16. The quantum effect device according to any one of claims 13 to 15, wherein said quantum artificial molecules comprises a first quantum artificial molecule unit and a second quantum artificial molecule unit which are located in the same plane, and a third quantum artificial molecule unit which is insulated from said first and second quantum artificial molecule units by an insulating layer.

* * * * *